United States Patent
Lewis et al.

(10) Patent No.: US 12,464,679 B2
(45) Date of Patent: Nov. 4, 2025

(54) FOLDING THERMAL GROUND PLANE

(71) Applicant: Kelvin Thermal Technologies, Inc., Boulder, CO (US)

(72) Inventors: Ryan J. Lewis, Boulder, CO (US); Yung-Cheng Lee, Boulder, CO (US); Ali Nematollahisarvestani, Boulder, CO (US); Jason W. West, Broomfield, CO (US); Kyle Wagner, Minneapolis, MN (US)

(73) Assignee: Kelvin Thermal Technologies, Inc., Boulder, CO (US)

( * ) Notice: Subject to any disclaimer, the term of this patent is extended or adjusted under 35 U.S.C. 154(b) by 0 days.

(21) Appl. No.: 18/004,059

(22) PCT Filed: Jun. 18, 2021

(86) PCT No.: PCT/US2021/038152
§ 371 (c)(1),
(2) Date: Dec. 31, 2022

(87) PCT Pub. No.: WO2021/258028
PCT Pub. Date: Dec. 23, 2021

(65) Prior Publication Data
US 2023/0292466 A1 Sep. 14, 2023

Related U.S. Application Data

(63) Continuation of application No. 17/352,250, filed on Jun. 18, 2021, now Pat. No. 11,930,621.
(Continued)

(51) Int. Cl.
*H05K 7/20* (2006.01)
(52) U.S. Cl.
CPC ....... *H05K 7/20336* (2013.01); *H05K 7/2039* (2013.01); *H05K 7/20309* (2013.01); *H05K 7/20318* (2013.01)

(58) Field of Classification Search
CPC ............ H05K 7/20336; H05K 7/2039; H05K 7/20309; H05K 7/20318
See application file for complete search history.

(56) References Cited

U.S. PATENT DOCUMENTS

| 4,000,776 A | 1/1977 | Kroebig et al. |
| 4,196,504 A | 4/1980 | Eastman |

(Continued)

FOREIGN PATENT DOCUMENTS

| CN | 2522409 Y | 11/2002 |
| CN | 2715467 Y | 8/2005 |

(Continued)

OTHER PUBLICATIONS

Restriction Requirement dated Jul. 23, 2012 in U.S. Appl. No. 12/719,775, 9 pages.
(Continued)

*Primary Examiner* — Gordon A Jones

(57) ABSTRACT

Some embodiments include a thermal ground plane comprising a first and second casing with folding and non-folding regions. The thermal ground plane may also include a vapor structure and a mesh. The mesh may be disposed on an interior surface of the second casing and the mesh include a plurality of arteries extending substantially parallel with a length of the thermal ground plane. The folding region of the first casing may have an out-of-plane wavy structure. The valleys and peaks of the out-of-plane wavy structure, for example, may extend across a width of the first active region substantially parallel with a width of the thermal ground plane.

19 Claims, 40 Drawing Sheets

Related U.S. Application Data

(60) Provisional application No. 63/041,208, filed on Jun. 19, 2020.

(56) References Cited

U.S. PATENT DOCUMENTS

| | | |
|---|---|---|
| 4,274,479 A | 6/1981 | Eastman |
| 4,279,294 A | 7/1981 | Fitzpatrick et al. |
| 4,545,799 A | 10/1985 | Rhodes et al. |
| 4,854,379 A | 8/1989 | Shaubach et al. |
| 5,000,256 A | 3/1991 | Tousignant |
| 5,157,893 A | 10/1992 | Benson et al. |
| 5,175,975 A | 1/1993 | Benson et al. |
| 5,343,940 A | 9/1994 | Jean |
| 5,360,058 A | 11/1994 | Koeppl et al. |
| 5,560,423 A | 10/1996 | Larson et al. |
| 5,735,339 A | 4/1998 | Davenport et al. |
| 6,056,044 A | 5/2000 | Benson et al. |
| 6,082,443 A | 7/2000 | Yamamoto et al. |
| 6,139,974 A | 10/2000 | Atkinson et al. |
| 6,158,502 A | 12/2000 | Thomas |
| 6,269,866 B1 | 8/2001 | Yamamoto et al. |
| 6,446,706 B1 | 9/2002 | Rosenfeld et al. |
| 6,533,029 B1 | 3/2003 | Phillips |
| 6,561,262 B1 | 5/2003 | Osakabe et al. |
| 6,763,671 B1 | 7/2004 | Klett et al. |
| 6,896,039 B2 | 5/2005 | Dussinger et al. |
| 6,912,130 B2 | 6/2005 | Osanai et al. |
| 6,938,481 B2 | 9/2005 | Paterek et al. |
| 6,994,151 B2 | 2/2006 | Zhou et al. |
| 7,028,713 B2 | 4/2006 | Koyama |
| 7,037,400 B1 | 5/2006 | Shaw et al. |
| 7,069,978 B2 | 7/2006 | Rosenfeld et al. |
| 7,100,680 B2 | 9/2006 | Dussinger et al. |
| 7,219,713 B2 | 5/2007 | Gelorme et al. |
| 7,278,469 B2 | 10/2007 | Sasaki et al. |
| 8,018,128 B2 | 9/2011 | Egawa et al. |
| 8,069,907 B2 | 12/2011 | Bryant et al. |
| 8,560,031 B2 | 10/2013 | Barnett et al. |
| 8,579,018 B1 | 11/2013 | Roper et al. |
| 8,646,281 B2 | 2/2014 | Lim |
| 8,807,203 B2 | 8/2014 | MacDonald et al. |
| 8,921,702 B1 | 12/2014 | Carter et al. |
| 8,985,197 B2 | 3/2015 | Wang |
| 9,127,898 B2 | 9/2015 | Wong |
| 9,149,896 B1 | 10/2015 | Batty et al. |
| 9,163,883 B2 | 10/2015 | Yang et al. |
| 9,597,657 B1 | 3/2017 | Zhamu et al. |
| 9,600,041 B2 | 3/2017 | Ady et al. |
| 9,651,312 B2 | 5/2017 | Yang et al. |
| 9,700,930 B2 | 7/2017 | Yang |
| 9,835,383 B1 | 12/2017 | Roper et al. |
| 9,909,814 B2 | 3/2018 | Yang et al. |
| 9,921,004 B2 | 3/2018 | Lewis et al. |
| 10,066,876 B2 | 9/2018 | Zhou et al. |
| 10,281,220 B1 | 5/2019 | Lin et al. |
| 10,458,719 B2 | 10/2019 | Bozorgi et al. |
| 10,527,358 B2 | 1/2020 | Yang et al. |
| 10,544,994 B2 | 1/2020 | Wakaoka et al. |
| 10,571,200 B2 | 2/2020 | Yang et al. |
| 10,973,151 B2 | 4/2021 | Wakaoka et al. |
| 10,980,148 B2 | 4/2021 | Cheng |
| 11,054,189 B2 | 7/2021 | Salim Shirazy et al. |
| 11,054,190 B2 | 7/2021 | Inagaki et al. |
| 11,058,031 B2 | 7/2021 | Numoto et al. |
| 11,150,030 B2 | 10/2021 | Kishimoto et al. |
| 11,445,636 B2 | 9/2022 | Wakaoka et al. |
| 11,598,594 B2 | 3/2023 | Lewis et al. |
| 11,930,621 B2 * | 3/2024 | Lewis ................ F28D 15/0241 |
| 2001/0054495 A1 | 12/2001 | Yevin et al. |
| 2003/0042009 A1 | 3/2003 | Phillips |
| 2003/0051859 A1 | 3/2003 | Chesser et al. |
| 2003/0079863 A1 | 5/2003 | Sugito et al. |
| 2003/0102118 A1 | 6/2003 | Sagal et al. |
| 2003/0136547 A1 | 7/2003 | Gollan et al. |
| 2003/0136550 A1 | 7/2003 | Tung et al. |
| 2003/0136551 A1 | 7/2003 | Bakke |
| 2003/0159806 A1 | 8/2003 | Sehmbey et al. |
| 2004/0011509 A1 | 1/2004 | Siu |
| 2004/0050533 A1 | 3/2004 | Chesser et al. |
| 2004/0131877 A1 | 7/2004 | Hasz et al. |
| 2004/0134548 A1 | 7/2004 | Koyama |
| 2004/0211549 A1 | 10/2004 | Garner et al. |
| 2004/0244951 A1 | 12/2004 | Dussinger et al. |
| 2005/0059238 A1 | 3/2005 | Chen et al. |
| 2005/0126757 A1 | 6/2005 | Bennett et al. |
| 2005/0190810 A1 | 9/2005 | Butterworth et al. |
| 2005/0230085 A1 | 10/2005 | Valenzuela |
| 2005/0280128 A1 | 12/2005 | Mok et al. |
| 2005/0280162 A1 | 12/2005 | Mok et al. |
| 2006/0032615 A1 | 2/2006 | Dussinger et al. |
| 2006/0037737 A1 | 2/2006 | Chen et al. |
| 2006/0090882 A1 | 5/2006 | Sauciuc |
| 2006/0098411 A1 | 5/2006 | Lee et al. |
| 2006/0124280 A1 | 6/2006 | Lee et al. |
| 2006/0131002 A1 | 6/2006 | Mochizuki et al. |
| 2006/0162905 A1 | 7/2006 | Hsu |
| 2006/0196640 A1 | 9/2006 | Siu |
| 2006/0196641 A1 | 9/2006 | Hong et al. |
| 2006/0213648 A1 | 9/2006 | Chen et al. |
| 2006/0283574 A1 | 12/2006 | Huang |
| 2006/0283576 A1 | 12/2006 | Lai et al. |
| 2007/0006993 A1 | 1/2007 | Meng et al. |
| 2007/0035927 A1 | 2/2007 | Erturk et al. |
| 2007/0056714 A1 | 3/2007 | Wong |
| 2007/0068657 A1 | 3/2007 | Yamamoto et al. |
| 2007/0077165 A1 | 4/2007 | Hou et al. |
| 2007/0089864 A1 | 4/2007 | Chang et al. |
| 2007/0095507 A1 | 5/2007 | Henderson et al. |
| 2007/0107875 A1 | 5/2007 | Lee et al. |
| 2007/0107878 A1 | 5/2007 | Hou et al. |
| 2007/0158050 A1 | 7/2007 | Norley et al. |
| 2008/0017356 A1 | 1/2008 | Gruss et al. |
| 2008/0029249 A1 | 2/2008 | Hsiao |
| 2008/0067502 A1 | 3/2008 | Chakrapani et al. |
| 2008/0111151 A1 | 5/2008 | Teraki et al. |
| 2008/0128116 A1 | 6/2008 | Dangelo et al. |
| 2008/0128898 A1 | 6/2008 | Henderson et al. |
| 2008/0210407 A1 | 9/2008 | Kim et al. |
| 2008/0224303 A1 | 9/2008 | Funakoshi et al. |
| 2008/0272482 A1 | 11/2008 | Jensen et al. |
| 2008/0283222 A1 | 11/2008 | Chang et al. |
| 2009/0020269 A1 | 1/2009 | Chang et al. |
| 2009/0020272 A1 | 1/2009 | Shimizu |
| 2009/0025910 A1 | 1/2009 | Hoffman et al. |
| 2009/0056917 A1 | 3/2009 | Majumdar et al. |
| 2009/0151906 A1 | 6/2009 | Lai et al. |
| 2009/0159242 A1 | 6/2009 | Zhao et al. |
| 2009/0205812 A1 | 8/2009 | Meyer, IV et al. |
| 2009/0236080 A1 | 9/2009 | Lin et al. |
| 2009/0294104 A1 | 12/2009 | Lin et al. |
| 2009/0316335 A1 | 12/2009 | Simon et al. |
| 2010/0028604 A1 | 2/2010 | Bhushan et al. |
| 2010/0053899 A1 | 3/2010 | Hashimoto et al. |
| 2010/0071879 A1 | 3/2010 | Hou |
| 2010/0084113 A1 | 4/2010 | Lee |
| 2010/0139767 A1 | 6/2010 | Hsieh et al. |
| 2010/0157535 A1 | 6/2010 | Oniki et al. |
| 2010/0175854 A1 | 7/2010 | Gratton |
| 2010/0200199 A1 | 8/2010 | Habib et al. |
| 2010/0252237 A1 | 10/2010 | Hashimoto et al. |
| 2010/0254090 A1 | 10/2010 | Trautman |
| 2010/0290190 A1 | 11/2010 | Chester et al. |
| 2010/0294200 A1 | 11/2010 | Zhang et al. |
| 2010/0300656 A1 | 12/2010 | Lu et al. |
| 2011/0017431 A1 | 1/2011 | Yang et al. |
| 2011/0027311 A1 | 2/2011 | Deng et al. |
| 2011/0083829 A1 | 4/2011 | Hung et al. |
| 2011/0088873 A1 | 4/2011 | Yang |
| 2011/0108142 A1 | 5/2011 | Liu et al. |
| 2011/0120674 A1 | 5/2011 | MacDonald et al. |
| 2011/0174474 A1 | 7/2011 | Liu et al. |
| 2011/0198059 A1 | 8/2011 | Gavillet et al. |
| 2011/0205708 A1 | 8/2011 | Andry et al. |
| 2012/0037210 A1 | 2/2012 | Lim |

(56) References Cited

U.S. PATENT DOCUMENTS

| | | |
|---|---|---|
| 2012/0048516 A1 | 3/2012 | He et al. |
| 2012/0061127 A1 | 3/2012 | Fields et al. |
| 2012/0168435 A1 | 7/2012 | Chen et al. |
| 2012/0186784 A1 | 7/2012 | Yang et al. |
| 2012/0189839 A1 | 7/2012 | Aoki et al. |
| 2012/0241216 A1 | 9/2012 | Coppeta et al. |
| 2012/0312504 A1 | 12/2012 | Suzuki et al. |
| 2012/0325437 A1 | 12/2012 | Meyer, IV et al. |
| 2013/0014919 A1 | 1/2013 | Dai et al. |
| 2013/0043000 A1 | 2/2013 | Wang |
| 2013/0049018 A1 | 2/2013 | Ramer et al. |
| 2013/0168057 A1 | 7/2013 | Semenic et al. |
| 2013/0199770 A1 | 8/2013 | Cherian |
| 2013/0269913 A1 | 10/2013 | Ueda et al. |
| 2013/0327504 A1 | 12/2013 | Bozorgi et al. |
| 2014/0009883 A1 | 1/2014 | Fujiwara et al. |
| 2014/0017456 A1 | 1/2014 | Xiao et al. |
| 2014/0055954 A1 | 2/2014 | Wu |
| 2014/0174700 A1 | 6/2014 | Lin et al. |
| 2014/0174701 A1 | 6/2014 | Kare et al. |
| 2014/0237823 A1 | 8/2014 | Yang |
| 2014/0238645 A1 | 8/2014 | Enright |
| 2014/0238646 A1 | 8/2014 | Enright |
| 2014/0247556 A1 | 9/2014 | Eid et al. |
| 2015/0000884 A1 | 1/2015 | Jiang et al. |
| 2015/0181756 A1 | 6/2015 | Sato et al. |
| 2015/0226493 A1 | 8/2015 | Yang et al. |
| 2015/0237762 A1 | 8/2015 | Holt et al. |
| 2015/0289413 A1 | 10/2015 | Rush et al. |
| 2016/0018165 A1 | 1/2016 | Ahamed et al. |
| 2016/0076820 A1* | 3/2016 | Lewis .............. F28D 15/046 |
| | | 165/104.26 |
| 2016/0081227 A1 | 3/2016 | Lee et al. |
| 2016/0123678 A1 | 5/2016 | Hulse et al. |
| 2016/0131437 A1 | 5/2016 | Wu |
| 2016/0161193 A1 | 6/2016 | Lewis et al. |
| 2016/0216042 A1 | 7/2016 | Bozorgi et al. |
| 2016/0295980 A1 | 10/2016 | Wu |
| 2016/0343639 A1 | 11/2016 | Groothuis et al. |
| 2017/0030654 A1 | 2/2017 | Yang et al. |
| 2017/0064868 A1 | 3/2017 | Rush et al. |
| 2017/0122672 A1 | 5/2017 | Lin |
| 2017/0241717 A1 | 8/2017 | Sun et al. |
| 2017/0292793 A1 | 10/2017 | Sun et al. |
| 2017/0318702 A1 | 11/2017 | Basu et al. |
| 2017/0343293 A1 | 11/2017 | Hurbi et al. |
| 2017/0350657 A1 | 12/2017 | Yeh et al. |
| 2018/0010861 A1 | 1/2018 | Wakaoka et al. |
| 2018/0106554 A1 | 4/2018 | Lewis et al. |
| 2018/0320984 A1* | 11/2018 | Lewis .................... F28D 15/04 |
| 2018/0320985 A1 | 11/2018 | Salim Shirazy et al. |
| 2019/0271511 A1 | 9/2019 | Kishimoto et al. |
| 2019/0323780 A1 | 10/2019 | Ahamed et al. |
| 2019/0390919 A1 | 12/2019 | Lewis et al. |
| 2020/0003501 A1 | 1/2020 | Wakaoko |
| 2020/0045847 A1 | 2/2020 | Wakaoka et al. |
| 2020/0045848 A1 | 2/2020 | Wakaoko et al. |
| 2020/0049421 A1 | 2/2020 | Wakaoka et al. |
| 2020/0060044 A1 | 2/2020 | Numoto et al. |
| 2020/0124352 A1 | 4/2020 | Wakaoka et al. |
| 2020/0240718 A1 | 7/2020 | Wakaoko et al. |
| 2021/0025061 A1 | 1/2021 | Yang et al. |
| 2021/0136955 A1 | 5/2021 | Wakaoka et al. |
| 2021/0148646 A1 | 5/2021 | Sun et al. |
| 2022/0120510 A1 | 4/2022 | Wu et al. |
| 2022/0128314 A1 | 4/2022 | Inagaki et al. |
| 2022/0294485 A1 | 9/2022 | Li et al. |
| 2023/0017904 A1 | 1/2023 | Lai et al. |

FOREIGN PATENT DOCUMENTS

| | | |
|---|---|---|
| CN | 1672258 A | 9/2005 |
| CN | 1877241 A | 12/2006 |
| CN | 1957221 A | 5/2007 |
| CN | 101022718 A | 8/2007 |
| CN | 101080359 A | 11/2007 |
| CN | 101151950 A | 3/2008 |
| CN | 100480611 C | 4/2009 |
| CN | 100508708 C | 7/2009 |
| CN | 101754656 A | 6/2010 |
| CN | 102019543 A | 4/2011 |
| CN | 102066864 A | 5/2011 |
| CN | 202928418 U | 5/2013 |
| CN | 103398613 A | 11/2013 |
| CN | 103952729 A | 7/2014 |
| CN | 209930339 U | 1/2020 |
| DE | 19729922 C1 | 1/1999 |
| DE | 202009016739 U1 | 4/2010 |
| EP | 1369918 A2 | 12/2003 |
| EP | 1379825 A2 | 1/2004 |
| EP | 2713132 A1 | 4/2014 |
| GB | 2529512 A | 2/2016 |
| JP | H1197871 A | 4/1999 |
| JP | 2011080679 A | 4/2011 |
| JP | 2013148289 A | 8/2013 |
| JP | 2018204941 A | 12/2018 |
| JP | 2019016883 A | 1/2019 |
| TW | M544733 U | 7/2017 |
| WO | 03103835 A1 | 12/2003 |
| WO | 2006052763 A2 | 5/2006 |
| WO | 2006115326 A1 | 11/2006 |
| WO | 2006123049 A2 | 11/2006 |
| WO | 2007124028 A2 | 11/2007 |
| WO | 2008044823 A1 | 4/2008 |
| WO | 2008045004 A1 | 4/2008 |
| WO | 2008146129 A2 | 12/2008 |
| WO | 2009079084 A1 | 6/2009 |
| WO | 2010036442 A1 | 4/2010 |
| WO | 2013144444 A1 | 10/2013 |
| WO | 2015172136 A1 | 11/2015 |
| WO | 2015193153 A1 | 12/2015 |
| WO | 2016044180 A1 | 3/2016 |

OTHER PUBLICATIONS

Non-Final Office Action dated Nov. 9, 2012 in U.S. Appl. No. 12/719,775, 15 pages.

Final Office Action dated May 9, 2013 in U.S. Appl. No. 12/719,775, 15 pages.

Advisory Action dated Aug. 2, 2013 in U.S. Appl. No. 12/719,775, 4 pages.

Non-Final Office Action dated Oct. 2, 2013 in U.S. Appl. No. 12/719,775, 17 pages.

Final Office Action dated Mar. 26, 2014 in U.S. Appl. No. 12/719,775, 23 pages.

Advisory Action dated Jun. 20, 2014 in U.S. Appl. No. 12/719,775, 4 pages.

Non-Final Office Action dated Feb. 6, 2015 in U.S. Appl. No. 12/719,775, 24 pages.

Restriction Requirement dated Jul. 28, 2015 in U.S. Appl. No. 14/681,624, 5 pages.

Notice of Allowance in dated Aug. 4, 2015 U.S. Appl. No. 12/719,775, 9 pages.

Non-Final Office Action dated Oct. 23, 2015 in U.S. Appl. No. 14/681,624, 11 pages.

International Search Report and Written Opinion dated Dec. 18, 2015 as received in PCT Application No. PCT/US2015/050031, 13 pages.

International Search Report and Written Opinion dated Dec. 18, 2015 as received in PCT Application No. PCT/US2015/050771, 13 pages.

Final Office Action dated May 5, 2016 in U.S. Appl. No. 14/681,624, 11 pages.

International Search Report and Written Opinion mailed dated Jul. 15, 2016 as received in PCT Application No. PCT/US2015/057885, 10 pages.

Notice of Allowance dated Nov. 17, 2016 in U.S. Appl. No. 14/681,624, 7 pages.

(56) References Cited

OTHER PUBLICATIONS

International Preliminary Report on Patentability dated Mar. 21, 2017 as received in PCT Application No. PCT/US2015/050031, 8 pages.
International Preliminary Report on Patentability dated Mar. 21, 2017 as received in PCT Application No. PCT/US2015/050771, 6 pages.
International Preliminary Report on Patentability dated May 2, 2017 as received in PCT Application No. PCT/US2015/057885, 5 pages.
Preinterview First Office Action dated May 9, 2017 in U.S. Appl. No. 14/861,708, 9 pages.
Non-Final Office Action dated Aug. 9, 2017 in U.S. Appl. No. 14/925,787, 16 pages.
Restriction Requirement dated Aug. 30, 2017 in U.S. Appl. No. 14/853,833, 7 pages.
Final Office Action dated Sep. 28, 2017 in U.S. Appl. No. 14/925,787, 9 pages.
Non-Final Office Action dated Oct. 6, 2017 in U.S. Appl. No. 14/853,833, 13 pages.
Notice of Allowance dated Oct. 25, 2017 in U.S. Appl. No. 14/861,708, 9 pages.
Notice of Allowance dated Nov. 9, 2017 in U.S. Appl. No. 14/925,787, 7 pages.
Preinterview First Office Action dated Nov. 21, 2017 in U.S. Appl. No. 14/857,567, 12 pages.
International Search Report and Written Opinion mailed dated Jan. 17, 2018 as received in PCT Application No. PCT/US2017/060550, 13 pages.
Extended European search report Application mailed Feb. 22, 2018, as received in EP Application No. 15842101.6, 7 pages.
Final Office Action dated Mar. 8, 2018 in U.S. Appl. No. 14/857,567, 25 pages.
Extended European search report mailed Mar. 26, 2018, as received in EP Application No. 15841403.7, 10 pages.
Final Office Action dated Apr. 25, 2018 in U.S. Appl. No. 14/853,833, 12 pages.
First Office Action mailed May 9, 2018, as received in CN Application No. 201580049534, 13 pages.
Advisory Action dated May 30, 2018 in U.S. Appl. No. 14/857,567, 7 pages.
Non-Final Office Action dated Aug. 2, 2018 in U.S. Appl. No. 14/857,567, 30 pages.
First Office Action mailed Aug. 28, 2018, as received in CN Application No. 201580059333, 10 pages.
Restriction Requirement dated Aug. 30, 2018 in U.S. Appl. No. 15/292,932, 5 pages.
Non-Final Office Action dated Sep. 27, 2018 in U.S. Appl. No. 15/787,455, 15 pages.
Restriction Requirement dated Oct. 10, 2018 in U.S. Appl. No. 15/436,632, 5 pages.
International Search Report and Written Opinion mailed dated Oct. 15, 2018 received in PCT Application No. PCT/US2018/031632, 15 pages.
Final Office Action dated Oct. 30, 2018 in U.S. Appl. No. 14/857,567, 28 pages.
Non-Final Office Action dated Nov. 19, 2018 in U.S. Appl. No. 14/853,833, 11 pages.
Non-Final Office Action dated Dec. 11, 2018 in U.S. Appl. No. 15/292,932, 13 pages.
Second Office Action mailed Dec. 29, 2018, as received in CN Application No. 201580049534, 14 pages.
Non-Final Office Action dated Feb. 5, 2019 in U.S. Appl. No. 15/436,632, 10 pages.
Non-Final Office Action dated Mar. 21, 2019 in U.S. Appl. No. 14/857,567, 28 pages.
Final Office Action dated Mar. 29, 2019 in U.S. Appl. No. 14/853,833, 12 pages.
Final Office Action dated Mar. 29, 2019 in U.S. Appl. No. 15/292,932, 13 pages.
Final Office Action dated Apr. 1, 2019 in U.S. Appl. No. 15/787,455, 20 pages.
Non-Final Office Action dated Apr. 5, 2019 in U.S. Appl. No. 15/806,723, 12 pages.
Notice of Allowance in U.S. Appl. No. 17/666,537 dated Feb. 15, 2024, 9 pages.
Restriction Requirement in U.S. Appl. No. 17/592,490 dated Jun. 10, 2024, 8 pages.
Non-Final Office Action in U.S. Appl. No. 17/592,490 dated Nov. 19, 2024, 17 pages.
International Search Report and Written Opinion in PCT Application No. PCT/US2024/027116 mailed on Sep. 4, 2024, 12 pages.
Junjiao, H., et al., "Development of heat pipe cooling technology in high heat flux electronic components", Chemical Industry and Engineering Progress, Chemical Industry and Engineering Progress, vol. 34, Issue. 5, pp. 1220-1231 (May 5, 2015).
Restriction Requirement in U.S. Appl. No. 18/666,811 dated Dec. 5, 2024, 5 pages.
Non-Final Office Action in U.S. Appl. No. 17/951,075 mailed on Jun. 4, 2024, 21 pages.
Final Office Action in U.S. Appl. No. 17/951,075 mailed on Nov. 20, 2024, 20 pages.
Final Office Action in U.S. Appl. No. 16/864,236 mailed on Jun. 7, 2024, 11 pages.
Non-Final Office Action in U.S. Appl. No. 16/864,236 mailed on Dec. 20, 2024, 13 pages.
Non-Final Office Action in US Patent Application No. 18/180, 122 mailed on Nov. 15, 2024, 17 pages.
Non-Final Office Action dated Oct. 5, 2021 in U.S. Appl. No. 16/680,480, 12 pages.
Non-Final Office Action in U.S. Appl. No. 16/710,180 dated Dec. 13, 2021, 14 pages.
International Search Report and Written Opinion in PCT Application No. PCT/US2021/038152 mailed on Sep. 29, 2021, 14 pages.
Advisory Action dated Feb. 9, 2022 in U.S. Appl. No. 16/539,848, 4 pages.
Restriction Requirement in U.S. Appl. No. 16/864,236 dated Feb. 7, 2022, 8 pages.
Final Office Action in U.S. Appl. No. 16/539,848 dated Nov. 29, 2021, 11 pages.
Non-Final Office Action in U.S. Appl. No. 16/539,848 dated Mar. 28, 2022, 11 pages.
Final Office Action in U.S. Appl. No. 16/710,180 dated Apr. 7, 2022, 15 pages.
Notice of Allowance dated Feb. 28, 2022 in U.S. Appl. No. 16/680,480, 9 pages.
Final Office Action in U.S. Appl. No. 15/787,455 dated Feb. 24, 2022, 24 pages.
Non-Final Office Action dated Nov. 5, 2021 in U.S. Appl. No. 17/352,250, 17 pages.
Final Office Action in U.S. Appl. No. 17/352,250 dated Mar. 11, 2022, 17 pages.
Non-Final Office Action dated Nov. 8, 2021 in U.S. Appl. No. 15/787,455, 17 pages.
Non-Final Office Action in U.S. Appl. No. 16/864,236 mailed on Oct. 6, 2022, 11 pages.
China Office Action in CN Application No. 201780082663.4 dated Sep. 20, 2022, 22 pages.
Non-Final Office Action in U.S. Appl. No. 17/529,248 mailed on Dec. 22, 2022, 9 pages.
Advisory Action in U.S. Appl. No. 16/710,180 dated Sep. 23, 2022, 3 pages.
Final Office Action in U.S. Appl. No. 16/710,180 dated Nov. 14, 2022, 14 pages.
Advisory Action in U.S. Appl. No. 16/539,848 dated Nov. 28, 2022, 3 pages.
Final Office Action in U.S. Appl. No. 16/539,848 dated Sep. 13, 2022, 11 pages.
Non-Final Office Action in U.S. Appl. No. 16/539,848 dated Dec. 29, 2022, 12 pages.
Non-Final Office Action in U.S. Appl. No. 15/930,016 dated Jul. 27, 2022, 16 pages.

(56) References Cited

OTHER PUBLICATIONS

Notice of Allowance in U.S. Appl. No. 15/930,016 dated Dec. 1, 2022, 9 pages.
Final Office Action dated May 17, 2023 in U.S. Appl. No. 16/539,848, 10 pages.
Final Office Action in U.S. Appl. No. 16/710,180 dated Mar. 24, 2023, 14 pages.
Final Office Action in U.S. Appl. No. 16/864,236 mailed on Apr. 10, 2023, 11 pages.
Final Office Action in U.S. Appl. No. 17/529,248 mailed on Apr. 25, 2023, 7 pages.
Restriction Requirement dated Apr. 20, 2023 in U.S. Appl. No. 17/666,537, 6 pages.
Non-Final Office Action in U.S. Appl. No. 17/666,537 dated Aug. 1, 2023, 10 pages.
International Preliminary Report on Patentability dated May 14, 2019 as received in PCT Application No. PCT/US2017/060550, 7 pages.
Final Office Action dated May 28, 2019 in U.S. Appl. No. 15/436,632, 14 pages.
Advisory Action dated Jul. 19, 2019 in U.S. Appl. No. 15/292,932, 4 pages.
Advisory Action dated Aug. 22, 2019 in U.S. Appl. No. 15/787,455, 4 pages.
Final Office Action dated Aug. 26, 2019 in U.S. Appl. No. 14/857,567, 27 pages.
Notice of Allowance dated Sep. 12, 2019 in U.S. Appl. No. 15/292,932, 7 pages.
Non-Final Office Action dated Sep. 17, 2019 in U.S. Appl. No. 15/787,455, 20 pages.
Notice of Allowance dated Oct. 10, 2019 in U.S. Appl. No. 15/436,632, 10 pages.
Final Office Action dated Oct. 11, 2019 in U.S. Appl. No. 15/806,723, 18 pages.
Advisory Action dated Nov. 7, 2019 in U.S. Appl. No. 14/857,567, 7 pages.
International Preliminary Report on Patentability dated Nov. 12, 2019 received in PCT Application No. PCT/US2018/031632, 7 pages.
Non-Final Office Action dated Nov. 29, 2019 in U.S. Appl. No. 14/857,567, 32 pages.
Advisory Action dated Feb. 3, 2020 in U.S. Appl. No. 15/806,723, 5 pages.
Restriction Requirement dated Feb. 13, 2020 in U.S. Appl. No. 15/974,306, 5 pages.
Office Action mailed Feb. 18, 2020, as received in EP Application No. 15841403.7, 4 pages.
Final Office Action dated Feb. 18, 2020 in U.S. Appl. No. 15/787,455, 17 pages.
Non-Final Office Action dated Mar. 18, 2020 in U.S. Appl. No. 15/806,723, 6 pages.
International Search Report and Written Opinion dated Apr. 8, 2020 as received in PCT Application No. PCT/US2019/065701, 16 pages.
Office Action mailed Apr. 9, 2020, as received in EP Application No. 15842101.6, 7 pages.
Notice of Allowance dated Apr. 15, 2020 in U.S. Appl. No. 14/857,567, 13 pages.
Notice of Allowance dated Apr. 20, 2020 in U.S. Appl. No. 15/806,723, 8 pages.
Advisory Action dated May 1, 2020 in U.S. Appl. No. 15/787,455, 4 pages.
Non-Final Office Action dated May 29, 2020 in U.S. Appl. No. 15/974,306, 11 pages.
First Office Action received Jun. 1, 2020, in related CN application No. 201910233277.1, 18 Pages.
First Office Action mailed Jun. 4, 2020, as received in CN Application No. 201580050472, 15 pages.
Extended European search report Application mailed Jun. 12, 2020, as received in EP Application No. 17870153.8, 9 pages.
First Office Action mailed Jul. 24, 2020, as received in CN Application No. 201910754250, 19 pages.
International Search Report and Written Opinion Application mailed Jul. 13, 2020, as received in PCT Application No. PCT/US2020/030911, 9 pages.
First Office Action mailed Sep. 24, 2020, as received in CN Application No. 201880030856, 19 pages.
Restriction Requirement dated Oct. 14, 2020 in U.S. Appl. No. 16/539,848, 8 pages.
Non-Final Office Action dated Oct. 26, 2020 in U.S. Appl. No. 16/539,848, 13 pages.
Office Action mailed Nov. 17, 2020, as received in EP Application No. 15842101.6, 5 pages.
Office Action mailed Nov. 18, 2020, as received in EP Application No. 15841403.7, 5 pages.
Extended European search report Application mailed Dec. 16, 2020, as received in EP Application No. 18798835.7, 8 pages.
Final Office Action dated Jan. 11, 2021 in U.S. Appl. No. 15/974,306, 12 pages.
Final Office Action dated Feb. 2, 2021 in U.S. Appl. No. 16/539,848, 10 pages.
Second Office Action mailed Mar. 16, 2021, as received in CN Application No. 201910233277.1, 21 pages.
Restriction Requirement dated Apr. 9, 2021 in U.S. Appl. No. 16/710,180, 8 pages.
Advisory Action dated Apr. 9, 2021 in U.S. Appl. No. 16/539,848, 4 pages.
Advisory Action dated Apr. 16, 2021 in U.S. Appl. No. 15/974,306, 4 pages.
Third Office Action mailed Apr. 19, 2021, as received in CN Application No. 201580049534, 7 pages.
Non-Final Office Action dated May 11, 2021 in U.S. Appl. No. 16/539,848, 10 pages.
Non-Final Office Action dated May 17, 2021 in U.S. Appl. No. 15/974,306, 9 pages.
International Preliminary Report on Patentability dated Jun. 8, 2021 as received in PCT Application No. PCT/US2019/065701, 7 pages.
Restriction Requirement dated Jun. 9, 2021 in U.S. Appl. No. 16/680,480, 6 pages.
Non-Final Office Action dated Jul. 9, 2021 in U.S. Appl. No. 15/930,016, 18 pages.
Final Office Action dated Dec. 17, 2021 in U.S. Appl. No. 15/930,016, 19 pages.
Restriction Requirement dated Jul. 19, 2021 in U.S. Appl. No. 16/710,180, 7 pages.
Restriction Requirement dated Aug. 30, 2021 in U.S. Appl. No. 17/352,250, 7 pages.
Notice of Allowance dated Sep. 9, 2021 in U.S. Appl. No. 15/787,455, 8 pages.
Non-Final Office Action in U.S. Appl. No. 16/864,236 dated Nov. 29, 2023, 11 pages.

\* cited by examiner (Section A)

(Section B)

(Section A)

(Section A)

(Section B)

(Section A)

(Section B)

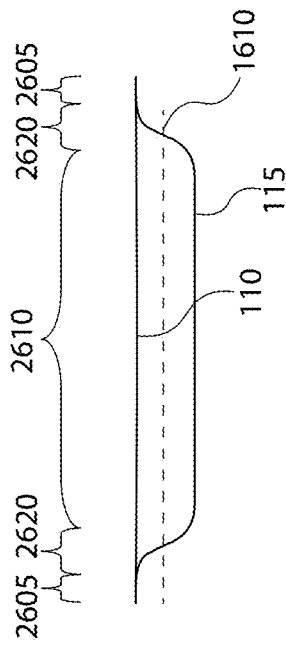

FOLDING THERMAL GROUND PLANE

BACKGROUND

Foldable smartphones, laptop computers and augmented reality (AR), virtual reality headsets are making a major commercial impact. Thermal management for such a foldable device is a major challenge. Some electronic devices bend or fold and yet still have thermal management requirements.

SUMMARY

Some embodiments may include a thermal ground plane comprising a first and second casing with folding and non-folding regions. The thermal ground plane may also include a vapor structure and a mesh. The mesh may be disposed on an interior surface of the second casing and the mesh include a plurality of arteries extending substantially parallel with a length of the thermal ground plane. The folding region of the first casing may have an out-of-plane wavy structure. The valleys and peaks of the out-of-plane wavy structure, for example, may extend across a width of the first active region substantially parallel with a width of the thermal ground plane.

Some embodiments include a thermal ground plane may include a first casing, a second casing, a vapor structure, and a mesh disposed on an interior surface of the second casing. The first casing may include: a first bonding region extending around a periphery of the first casing; a first active region may include a portion of the first casing surrounded by the first bonding region; a first folding region having a first out-of-plane wavy structure, the valleys and peaks of the out-of-plane wavy structure extend across a width of the first active region substantially parallel with a width of the thermal ground plane, the first folding region overlapping portions of the first bonding region and the first active region; and a first non-folding region overlapping portions of the first bonding region and the first active region. The second casing may include: a second bonding region extending around a periphery of the second casing; a second active region may include a portion of the second casing surrounded by the second bonding region; a second folding region overlapping portions of the second bonding region and the second active region; and a second non-folding overlapping portions of the second bonding region and the second active region. The first casing and the second casing may be sealed together at the first bonding region and the second bonding region, and the first folding region and the second folding region are substantially aligned. The mesh may be disposed on an interior surface of the second casing within the second active region and the mesh may include a plurality of arteries extending substantially parallel with a length of the thermal ground plane.

In some embodiments, the second casing may include an out-of-plane wavy structure where the valleys and peaks of the out-of-plane wavy structure of the second casing extend across a width of the second active region substantially parallel with a width of the thermal ground plane.

In some embodiments, the first bonding region may overlap with the first folding region does not include an out-of-plane wavy structure.

In some embodiments, the first bonding region overlapping with the first folding region may include an out-of-plane wavy structure.

In some embodiments, the second casing may include a wavy structure in either or both the folding region and the non-folding region. In some embodiments, either or both the second non-folding region and the first non-folding region has a substantially planar shape.

In some embodiments, the vapor structure is disposed on an interior surface of the first casing in the first non-folding region, and the vapor structure is not disposed within the first folding region.

In some embodiments, each of the plurality of arteries extends substantially perpendicular relative to a folding line within the folding region.

In some embodiments, the second non-folding region may include an out-of-plane wavy structure. In some embodiments, the out-of-plane wavy structure of the second non-folding region is substantially parallel with a length of the thermal ground plane.

In some embodiments, the mesh may include at least one of the following selected from the group consisting of woven copper, woven stainless steel, non-woven copper, non-woven stainless steel, ceramic-coated polymer, and metal-coated polymer. In some embodiments, the mesh may include a metal foam. In some embodiments, either or both the first casing and the second casing comprise a laminate of copper and polymer. In some embodiments, the mesh may include two layers of woven material sealed together. In some embodiments, the mesh may include a copper mesh or a stainless steel mesh. In some embodiments, the mesh is bonded to portions of the second casing within the second non-folding region. In some embodiments, the mesh is not bonded to other portions of the second casing within the second non-folding region. In some embodiments, the mesh is not bonded with the second casing within the second folding region. In some embodiments, the mesh may include a plurality of mesh obstructions within the plurality of arteries.

In some embodiments, each of the plurality of arteries has a length that is longer than the length of the first folding region measured parallel with the length of the thermal ground plane. In some embodiments, each of the plurality of arteries has a length that is shorter than the length of the first folding region measured parallel with the length of the thermal ground plane. In some embodiments, each of the plurality of arteries have an in-plane wavy shape.

In some embodiments, the first casing and/or the second casing comprise polyimide and copper. In some embodiments, the first casing and/or second casing comprise a laminate of copper, polyimide, and copper. The outer layer of copper, for example, may be removed within the first folding region and/or the second folding region.

In some embodiments, vapor structure may include either or both an array of pillars and a deformed mesh. In some embodiments, the vapor chamber may include a deformed mesh that is substantially similar with the mesh material. In some embodiments, the vapor structure extends partially into a portion of the folding region.

Some embodiments include a thermal ground plane may include a first casing, a second casing, a vapor structure, and a mesh that includes two mesh layers bonded together. The first casing may include: a first bonding region extending around a periphery of the first casing; a first active region may include a portion of the first casing surrounded by the first bonding region; a first folding region having a first out-of-plane wavy structure, the first folding region may include a portion of the first bonding region and a portion of the first active region; and a first non-folding region that may include a portion of the first bonding region and a portion of the first active region; The second casing may include: a second bonding region extending around a periphery of the second casing; a second active region may include a portion of the second casing surrounded by the second bonding region; a second folding region that may include a portion of the second bonding region and a portion of the second active region; and a second non-folding region that may include a portion of the second bonding region and a portion of the second active region. The first casing and the second casing are sealed together at the first bonding region and the second bonding region, and the first folding region and the second folding region are substantially aligned. The mesh may be disposed on the second casing within the second active region, the mesh may include two mesh layers bonded together, and wherein the mesh is not bonded with the second casing within the second folding region. The vapor structure may be disposed between the mesh and the first layer.

In some embodiments, the mesh is bonded to a portion of the second casing within the non-folding region. In some embodiments, the mesh may include a plurality of arteries extending substantially parallel with a length of the thermal ground plane. In some embodiments, the mesh may include a copper woven mesh or a stainless steel woven mesh.

Some embodiments include a thermal ground plane may include a first casing, a first coating disposed on an interior surface of the first casing, a second casing, a second coating disposed on an interior surface of the second casing, a vapor structure, a bonding material bonded with the first casing and the second casing. and a wick that includes two mesh layers bonded together. The first casing may include: a dielectric material; a first bonding region extending around a periphery of the first casing, the first bonding region may include a first bonding material; and a first active region may include a portion of the first casing surrounded by the first bonding region. The first coating may be disposed on an interior surface of the first casing within the first active region and a portion of the first bonding region. The second casing may include a dielectric material; a second bonding region extending around a periphery of the second casing, the second bonding region may include a second bonding material; and a second active region may include a portion of the first casing surrounded by the second bonding region. The second coating may be disposed on an interior surface of the second casing within the second active region and a portion of the second bonding region. The bond material may be bonded with the first bonding region and the second bonding region, the bond material being different than the first bonding material and the second bonding material. The plurality of support structures may be disposed on the interior surface of the first casing. The wick may be disposed on the interior surface of the second casing.

In some embodiments, the dielectric material may include ceramic, polymer, alumina, or glass. In some embodiments, the bond material may include a metal and at least one of a ceramic, polymer, alumina, or glass. In some embodiments, the dielectric material and the bond material are bonded with a thermo-compression bond. In some embodiments, the dielectric material and the bond material are bonded with a glass-frit bond.

In some embodiments, the first coating and/or the second coating may include an ALD coating. In some embodiments, the first coating and/or the second coating may include a ceramic or a glass.

In some embodiments, the wick may include a dielectric mesh.

In some embodiments, the thermal ground plane may include a dielectric coating disposed on the plurality of support structures.

In some embodiments, the plurality of support structures may include an array of pillars.

Some embodiments include a thermal ground plane may include a first casing, a second casing, a vapor structure, and a wick disposed on an interior surface of the second casing. In some embodiments, a first casing may include: a first bonding region extending around a periphery of the first casing; a first active region may include a portion of the first casing surrounded by the first bonding region; and a wavy structure. In some embodiments, the second casing may include: a second bonding region extending around a periphery of the second casing; and a second active region may include a portion of the first casing surrounded by the second bonding region. In some embodiments, the first casing and the second casing are sealed together at the first bonding region and the second bonding region. In some embodiments, the plurality of support structures disposed on the interior surface of the first casing. In some embodiments, the wick may be disposed on the interior surface of the second casing, the wick may include a first woven mesh and a second woven mesh sealed together along a top surface of the second woven mesh and a bottom surface of the first woven mesh.

In some embodiments, the second casing may include a wavy structure.

In some embodiments, the wavy structure of the first ground plane may include an out-of-plane wavy structure.

Some embodiments may include a thermal ground plane comprising: a first casing comprising with a first folding region; and a first non-folding region; and a second casing; with a second folding region; and a second non-folding region. The first casing and the second casing are hermetically sealed together about a periphery of the first casing and the second casing. In some embodiments, the thermal ground plane may include a wicking structure and a vapor transport space each having a folding region and a non-folding region.

In some embodiments, the first non-folding region comprises a non-folding wicking layer; and the first folding region comprises a folding wicking layer that includes a plurality of elongated arteries.

In some embodiments, the non-folding wicking layer comprises a plurality of pillars and a mesh bonded.

In some embodiments, the folding wicking layer and/or the non-folding wicking layer comprises a plurality pillars.

In some embodiments, the first non-folding region comprises a plurality of pillars and a mesh bonded with the first folding region; and the first folding region comprises a plurality of pillars and the mesh, the mesh having a plurality of elongated arteries in the first non-folding region.

In some embodiments, the folding wicking layer and/or the non-folding wicking layer comprises meshes.

In some embodiments, the first non-folding region comprises a plurality of pillars and a first mesh; and the first folding region comprises a plurality of pillars and a second mesh that includes a plurality of wavy arteries.

In some embodiments, the second non-folding region comprises a plurality of pillars; and the second folding region comprises a plurality of elongated ridges.

In some embodiments, the second non-folding region comprises a plurality of pillars; and the second folding region comprises a plurality of channel.

In some embodiments, the second non-folding region comprises a plurality of pillars; and the second folding region comprises a plurality of channel spacers.

In some embodiments, the first non-folding region comprises a plurality of pillars and a mesh bonded with the first folding region; and the first folding region comprises a plurality of pillars without a mesh.

In some embodiments, the first non-folding region comprises a first plurality of pillars having a first density; and the first folding region comprises a second plurality of pillars having a second density that is greater than the first density.

In some embodiments, the first non-folding region comprises a first plurality of pillars having a first density and a mesh disposed on the first plurality of pillars; and the first folding region comprises a second plurality of pillars having a second density that is greater than the first density.

In some embodiments, the first non-folding region comprises a first plurality of pillars having a first density and a mesh disposed on the first plurality of pillars; and the first folding region comprises a high density mesh.

In some embodiments, either of both a portion of the first casing and a portion of the second casing include a plurality of pillars and mesh disposed on top of the plurality of pillars with a portion of the pillars extending through pores in the mesh.

In some embodiments, the first folding region is wavy.

In some embodiments, the first folding region is shaped as an origami structure.

In some embodiments, the second folding region is wavy.

In some embodiments, the second folding region is shaped as an origami.

In some embodiments, the thermal ground plane's folding region comprises a casing comprising a polymer and/or metal composite.

In some embodiments, the thermal ground plane comprises a region without metal.

The various embodiments described in the summary and this document are provided not to limit or define the disclosure or the scope of the claims.

BRIEF DESCRIPTION OF THE FIGURES

FIGS. 28A, 28B, and 28C illustrate three different configurations of a TGP assembly according to some embodiments.

DETAILED DESCRIPTION

Some embodiments include a TGP having a first casing and a second casing that are hermetically sealed around a periphery of the first casing and the second casing. The first casing may include a first folding region and one or more first non-folding regions, which are planar. The second casing may include a second folding region and one or more second non-folding regions. In some embodiments, the first folding region and the one or more first non-folding region may include different structures. In some embodiments, the second folding region and the one or more second non-folding region may include different structures. In some embodiments, the first casing and the second casing may include different internal structures that may allow the TGP to fold without damaging the TGP. In some embodiments, the first casing may be coupled with vapor core structures. In some embodiments, the second casing may be coupled with liquid wicking structures. The first casing and the second casing may be sealed together.

Figure 1:
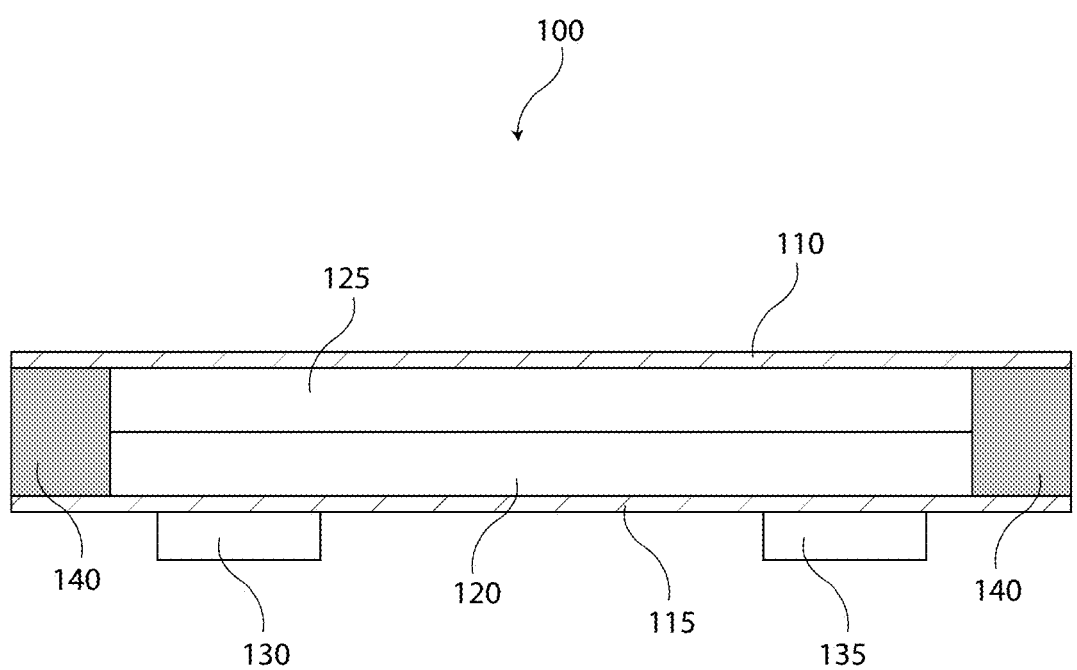
FIG. 1 is a side view illustration of an internal structure of a thermal ground plane (TGP) according to some embodiments.

FIG. 1 is a diagram of a TGP 100 according to some embodiments. In this example, the TGP 100 includes a first casing 110, a second casing 115, a liquid structure 120, and/or a vapor structure 125. The TGP 100, for example, may operate with evaporation, vapor transport, condensation, and/or liquid return of water or other cooling media for heat transfer between the evaporation region 130 and the condensation region 135. The structures and/or characteristics of the TGP 100 may be applied to any embodiment or example described within this document.

The first casing 110, for example, may include copper, polymer, atomic layer deposition (ALD) coated polymer, polymer-coated copper, copper-cladded Kapton, etc. The second casing 115, for example, may include copper, polyimide, polymer-coated copper, copper-cladded Kapton, steel, copper-clad steel, etc. The first casing 110 and/or the second casing 115, for example, may include a laminate of copper, polyimide, and copper. The first casing 110 and the second casing 115, for example, may be sealed together using solder, laser welding, ultrasonic welding, electrostatic welding, or thermocompression bonding (e.g., diffusion bonding) or a sealant 140. The first casing 110 and the second casing 115, for example, may include the same or different materials.

The first casing 110 and/or the second casing 115 may comprise at least three layers of copper, polyimide, and copper. The polyimide, for example, may be sandwiched between two copper layers. The copper layers on the first casing and/or the second casing, for example, may can be replaced with atomic layer deposition (ALD) nano-scaled layers such as, for example, $Al_2O_3$, $TiO_2$, $SiO_2$ The evaporation region 130 and the condensation region 135 may be disposed on the same layer: the first casing 110 or the second casing 115. Alternatively, the evaporation region 130 and the condensation region 135 may be disposed on different layers of the first casing 110 and the second casing 115.

In some embodiments, the vapor structure 125 and/or liquid structure 120 may be formed from an initial structure (e.g., a mesh, and/or an array of pillars, etc.) that has been deformed into various geometric shapes that may improve reliability of structure during folding and unfolding, thermal transport, the flow permeability, the capillary radius, the effective thermal conductivity, the effective heat transfer coefficient of evaporation, and/or the effective heat transfer coefficient of condensation. In some embodiments, the initial structure may include multiple layers of mesh.

In some embodiments, the outer periphery of the first casing 110 and the outer periphery of the second casing 115 may be sealed such as, for example, hermetically sealed.

Various embodiments or examples described in this disclosure include a mesh, which may include any or all of the following. A mesh, for example, may comprise copper and/or stainless steel. A mesh, for example, may include a material having pores that have a dimension of about 10 to 75 µm. For a nonporous mesh, for example, the material may have pores that a have a dimension of about 0.2 to 10 µm. A mesh, for example, may include a material that includes either or both metal and polymer. A mesh, for example, may be highly stretchable, such as, for example, stretchable without plastic deformation, which may, for example, reduce the stress when folded and/or may prevent the formation of wrinkles and blocking of vapor flow. A mesh, for example, may be electrically conductive and/or may be coated in a dielectric material such as, for example, to prevent plating of material into the pores away from the anchors. The pores in a mesh, for example, may be made from polymer, ceramic, other electrically insulating materials or electrically conductive material and/or may be covered by an electrically insulating layer. A mesh, for example, may include woven wires, non-woven wires, or porous planar media. A mesh, for example, may include an ALD-coated polymer without any metal. A mesh, for example, may include a Cu-clad-polyimide laminate material. A mesh, for example, may include woven wires, non-woven wires, and/or porous planar material. A mesh, for example, may include a copper mesh or non-copper mesh such as, for example, a polymer mesh or a stainless steel mesh. The mesh, for example, may be encapsulated by hydrophilic and anti-corrosion hermetic seal. A mesh, for example, may include any woven or nonwoven material.

A mesh, for example, may have a thickness of about 10 µm to about 200 µm. A woven mesh, for example, may have a thickness of about 125, 100, 75, or 50 µm. A porous mesh (e.g., a nanoporous mesh and/or a non-woven mesh) may have a thickness of about 5, 10, 15, 20, or 25 µm. A mesh, for example, may include a metal foam.

Various embodiments or examples described in this disclosure include an array of pillars, which may include any or all of the following. An array of pillars, for example, may include a plurality of pillars with an evenly or unevenly distributed pattern. An array of pillars, for example, may include pillars comprising polymer. An array of pillars, for example, may include pillars comprising metal such as, for example, copper. An array of pillars, for example, may include pillars coated with a coating such as, for example, a ceramic (e.g. $Al_2O_3$, $TiO_2$, $SiO_2$, etc.) or a nano-texture coating. The coating may be applied via defect-free ALD, low-defect density ALD, chemical vapor deposition (CVD), molecular layer deposition (MLD), or other nano-scaled coating processes.

An array of pillars, for example, may can be a pseudo-rectangular array, or a pseudo hexagonal array, or a random array. An array of pillars, for example, may have a center-to-center pitch that is constant across array of pillars. An array of pillars, for example, may include pillars with variable diameters and/or heights. An array of pillars, for example, may have a low density (e.g., far apart) at the condenser, have a higher density at the evaporator, and/or gradual change in density between the condenser and the evaporator.

Various embodiments or examples described in this disclosure include a micro pillar array, which may include any or all of the following. A micro pillar array may be disposed on an array of pillars and the micro pillar array, for example, may include a porous material in which the pore size of the material is substantially smaller than the gap between pillars. A micro pillar array may, for example, include nanowire bundles, sintered particles, templated grown pillars, inverse opals, etc. A micro pillar array may include solid pillars, which may promote conduction of heat along the length, and outer regions of the micropillar array may be porous to promote wicking.

Various embodiments or examples described in this disclosure may include internal TGP structures comprising polymer. These TGP structures may include the first casing, the second casing, a mesh, an array of pillars, arteries, wick, vapor structures, etc. Polymer TGP structures, for example, may be coated with defect-free ALD, low-defect density ALD, chemical vapor deposition (CVD), molecular layer deposition (MLD), or other nano-scaled coating processes.

Figure 2A:
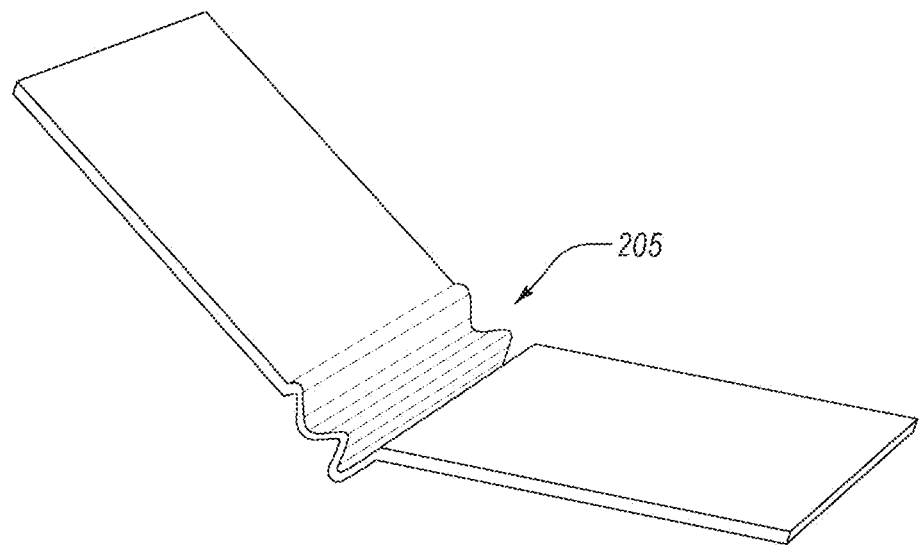
FIG. 2A is a thermal ground plane ("TGP") with a folding region that wrinkles.
Figure 2B:
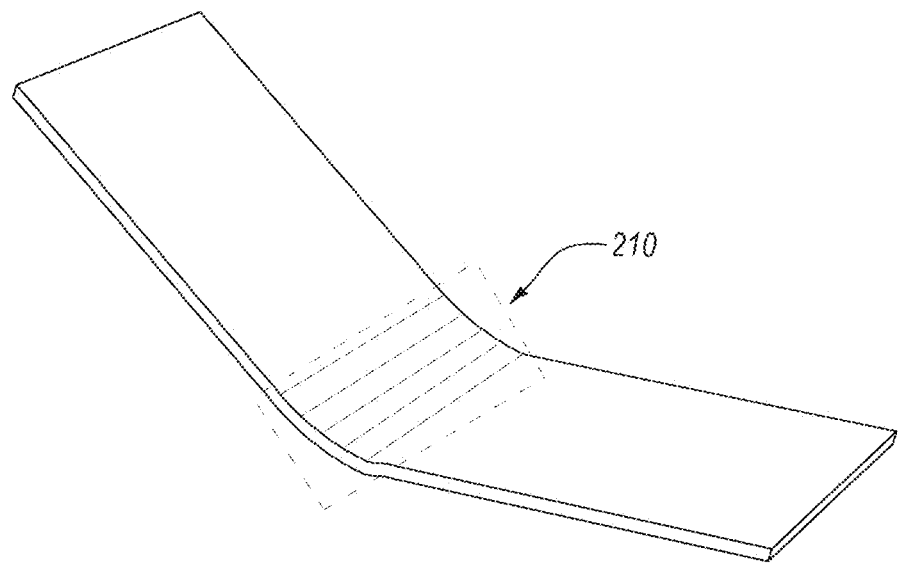
FIG. 2B is a TGP with a bridge that is a folding region that may reduce wrinkle or clogging.
Figure 3:
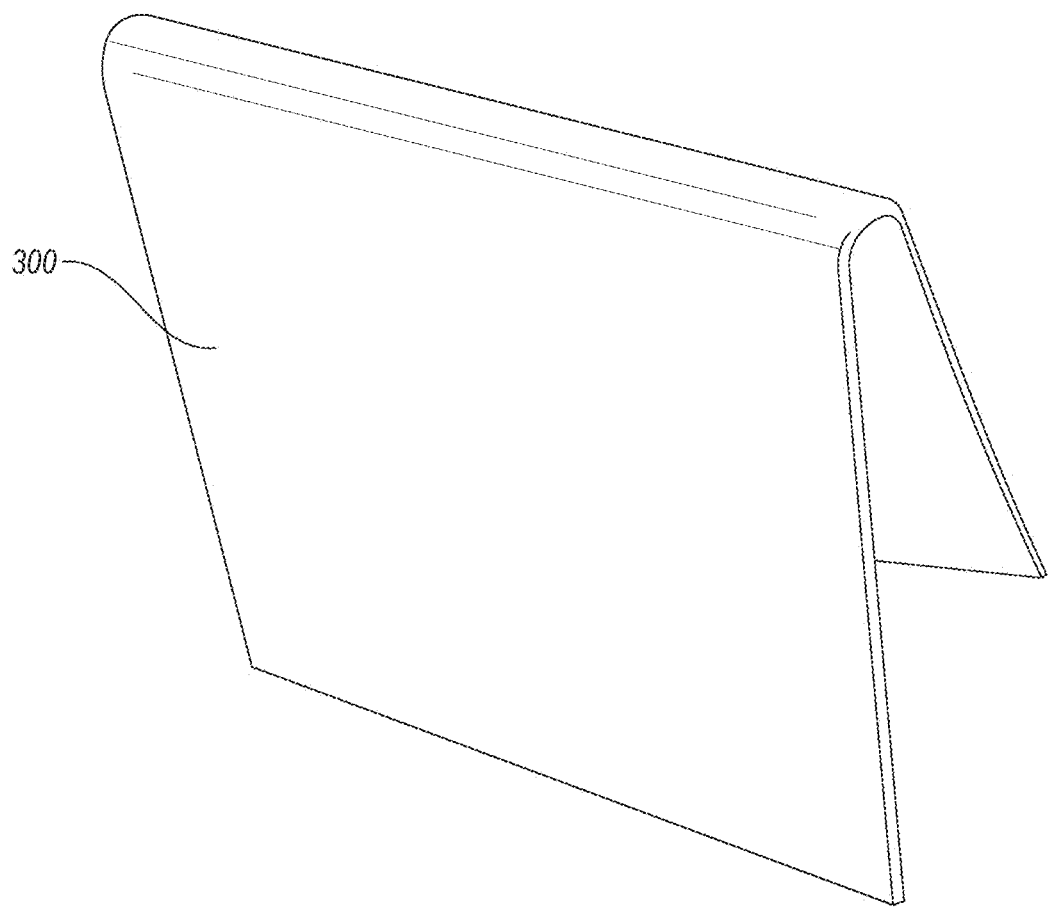
FIG. 3 is a perspective view of folding TGP according to some embodiments.

FIG. 2A is a thermal ground plane ("TGP") with a folding region that wrinkles. FIG. 2B is a TGP with a bridge that is a folding region that may reduce wrinkle or clogging.

This disclosure includes a plurality of embodiments of a folding TGP with an effective folding region. A folding TGP may include two structures: 1) a vapor structure with pillars and/or other spacing structures, and 2) a liquid structure with a wick layer comprising various combinations of pillars and mesh, pillars only, mesh only, or other structures.

Some embodiments include a TGP that includes a corrugated wavy structure. In some embodiments, the wavy structure may allow the TGP to be folded with a radius of curvature of about 2, 3, 4, or 5 mm and/or up to 180 degrees while maintain heat spreading or TGP performance.

Figure 4:
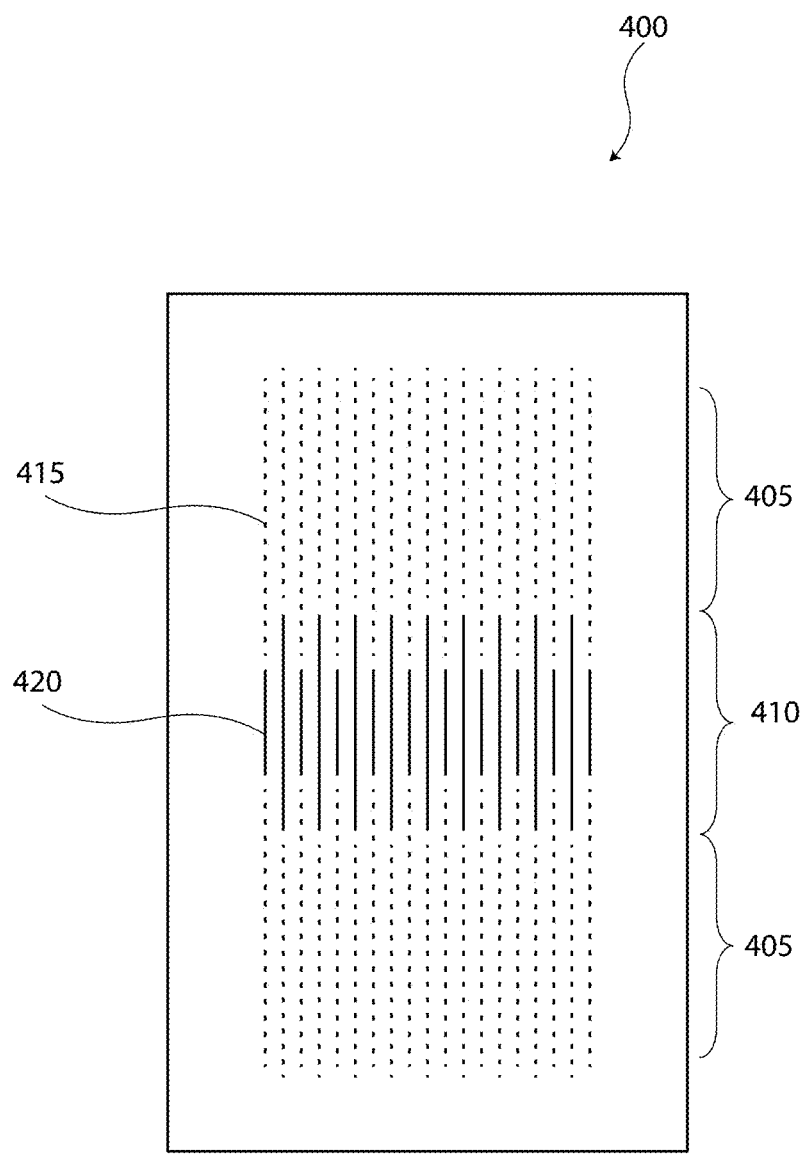
FIG. 4 is a top view illustration of an internal structure of a TGP with arteries according to some embodiments.

FIG. 4 is a top view illustration of a vapor structure 400 (e.g., vapor structure 125) of a folding TGP according to some embodiments. The vapor structure 400, for example, may include either or both the first casing 110 and the second casing 115. The vapor structure 400 may include a folding region 405 and a non-folding region(s) 410.

The thickness of the vapor structure 400, for example, may be less than about 200, 150, 100, 50, 36, 25, 10 µm.

The vapor structure 400 (and/or the first casing or second casing) may include a laminate comprising copper, polyimide, and/or Kapton such as, for example, a three layer laminate of copper, Kapton, and copper or copper, polyimide, and copper. Each layer, for example, may have a thickness of about 20, 15, 12, 10, 8, 5, etc. µm.

The vapor structure 400, for example, may include an array of pillars 415 formed, disposed, and/or bonded on one surface of the vapor structure 400 in the non-folding region(s) 410. The pillars of the array of pillars 415, for example, may be cylinders with a radius of about 0.5, 0.3, 0.2, 0.1, etc. mm. The pillars of the array of pillars 415, for example, may have a height of about 5.0, 2.5, 1.0, etc. mm.

A plurality of channels 420, for example, may be formed on the same surface of the vapor structure 400 in the folding region 405. The plurality of channels 420, for example, may comprise elongated walls that have a width that is substantially the same as the diameter of the pillars in the array of pillars 415. The plurality of channels 420, for example, may comprise elongated walls that have a width that is 5%, 10%, 15%, 20%, or more then the diameter of the pillars in the array of pillars 415. The plurality of channels 420, for example, may comprise elongated walls that have a height that is substantially the same as the height of the pillars in the array of pillars 415. The plurality of channels 420, for example, may comprise elongated walls that have a height that is 5%, 10%, 15%, 20%, or more then the height of the pillars in the array of pillars 415. The plurality of channels 420, for example, may comprise elongated walls that have a length that is 1,000%, 2,500%, 5,000%, 10,000%, or more then the diameter of the pillars in the array of pillars 415. The plurality of channels 420, for example, may comprise a material that is the same as the pillars in the array of pillars 415.

The plurality of channels 420, for example, may include regions within the vapor structure that do not have pillars.

In some embodiments, the plurality of channels 420, for example, may be disposed within the folding region of the vapor structure 400. The channels 420, for example, may comprise a region without pillars or the top surface of the vapor structure 400. The channels 420 may, for example, have an elongated shape extending perpendicular to the fold axis of the folding region. The channels 420, for example, may transition to pillars between the folding region 405 and the non-folding region(s) 410 such as, for example, by one or more of the channels 420 extending into the non-folding region(s) 410. The channels 420, for example, may reduce the chance of buckling within the folding region. The channels 420, for example, may have a thickness of about 0.5, 0.3, 0.2, 0.1, etc. mm. The channels 420, for example, may have a length of about 20, 25, 30, 35, 40, 45, 50, etc. mm. The continuous shape of the channels 420, for example, may result in the gap between the channels 420 to not collapse during folding.

Figure 25B:
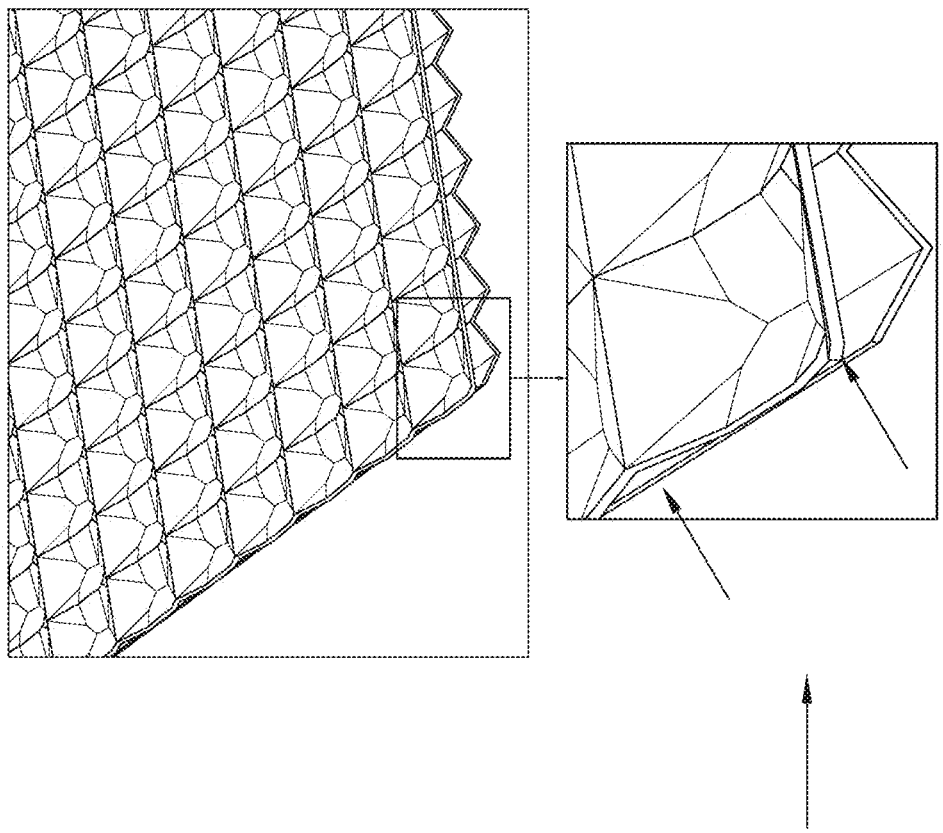
FIGS. 25A, 25B, 25C, and 25D are illustrations of TGP structures having an origami structure according to some embodiments.
Figure 25A:
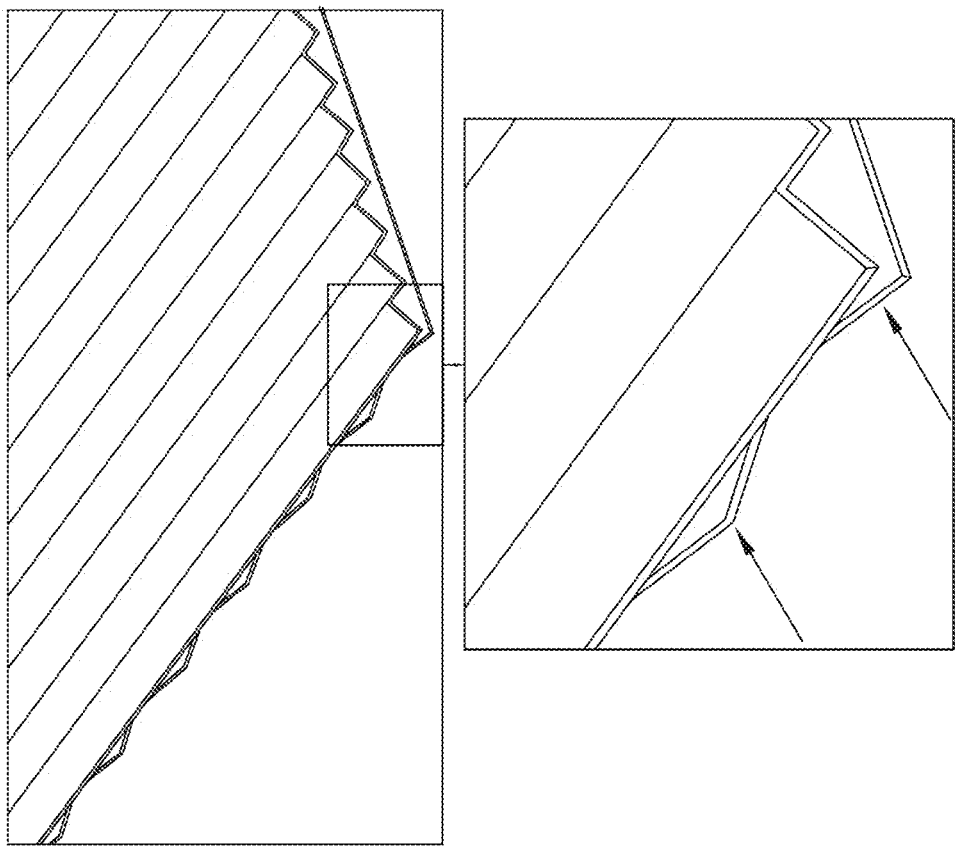
Figures 25C, 25D:
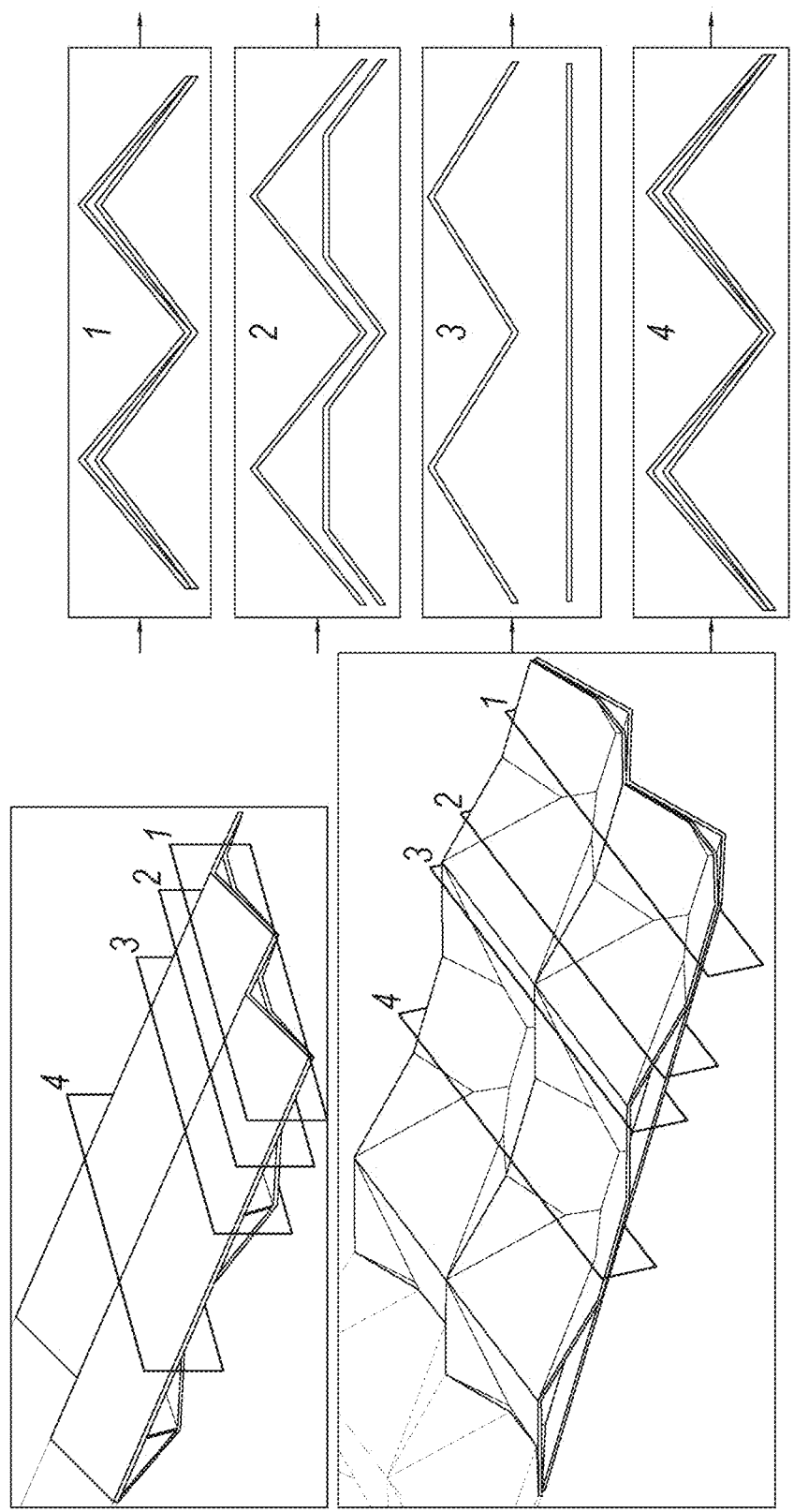

The copper layers on the first casing and/or the second casing, for example, may can be replaced with atomic layer deposition (ALD) nano-scaled layers such as, for example, $Al_2O_3$, $TiO_2$, $SiO_2$ In some embodiments, the vapor structure 400 may be manufactured with the following method: attaching a flexible mask to a substrate, pressing channels 420 in the folding region 405; and electroplating the array of pillars in the non-folding region 410 and/or in the non-folding region 410. In some embodiments, the vapor structure 400 can be replaced with an origami-shaped casing as shown in FIGS. 25A, 25B, 25C, and/or 25D, so the vapor core can be maintained without the use of pillars.

Figure 5:
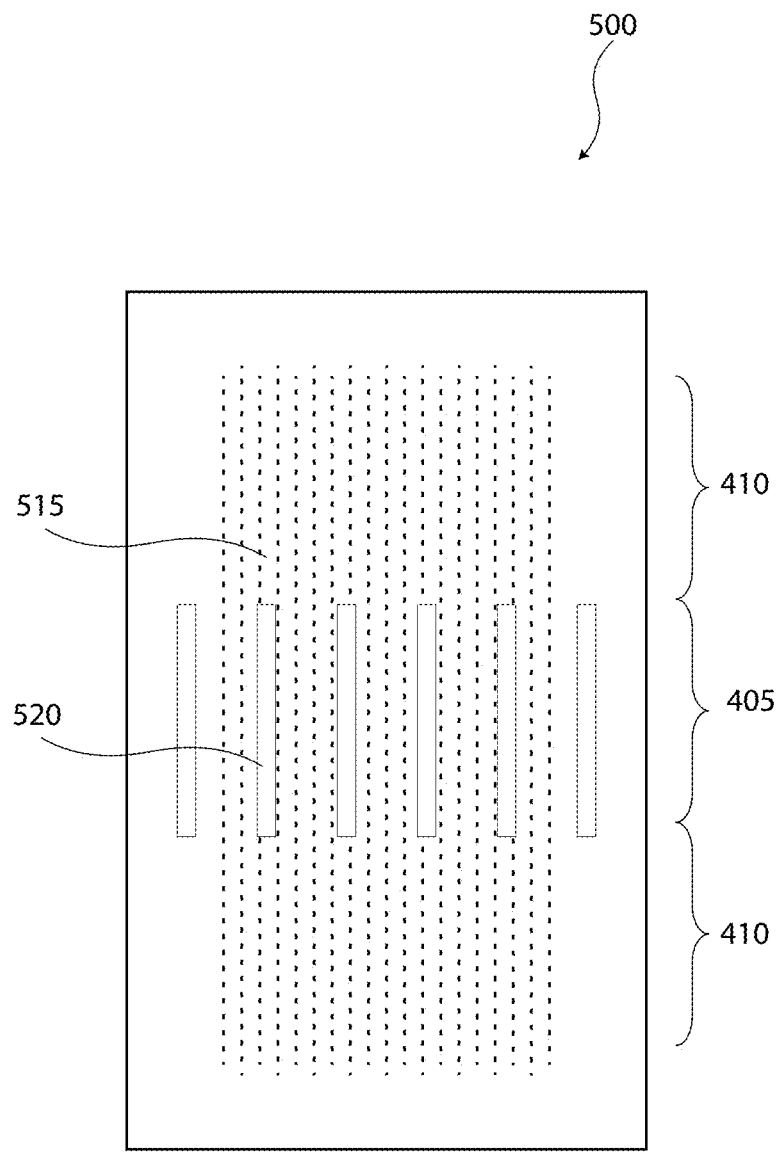
FIG. 5 is a top view illustration of an internal structure of a TGP with arteries according to some embodiments.

FIG. 5 is an illustration of a liquid structure 500 (e.g., liquid structure 120) of a folding TGP according to some embodiments. The liquid structure 500 may be coupled with or disposed on either or both the first casing 110 and the second casing 115. The liquid structure 500 may be the opposite substrate as the vapor structure 400 within an TGP. The liquid structure 500, for example, may include a mesh and/or an array of pillars (e.g., a micropillars). The array of pillars 515, for example, may be formed on one surface of the liquid structure 500 in a non-folding region(s) 410.

The liquid structure 500, for example, may include an array of pillars that have are about 5 to 100 µm in height and/or have pillar to pillar spacing of about 10 to 150 µm.

A plurality of arteries 520, for example, may be formed in the liquid structure 500 such as, for example, in the folding region 405 and/or extending partially out of the folding region and into the non-folding region 410. The arteries 520 may be formed within the plurality of pillars 515 and/or may be defined by an absence of pillars 515. The arteries 520, for example, may allow vapor to flow through the liquid structure 500.

A mesh, for example, may be disposed on and/or bonded with the tops of the pillars 515 in the non-folding region(s) 410. In the folding region 405, for example, the mesh may be bonded (e.g., floating relative to the pillars 515 without bonding) or may not be bonded with the arteries 520.

In some embodiments, the liquid structure 500 may be fabricated according to the following process: fabricating liquid pillars using photolithography and bonding the mesh to the liquid pillars in the non-folding region. The pillars 515 may have a diameter or dimension of about 20, 30, 40 50, 60 70, 80 μm. The pillars 515 may be patterned in a matrix with center to center distance of about 100, 150, 200 μm. The height of the pillars 515, for example, may be about 10, 20, 30 μm.

Figure 6:
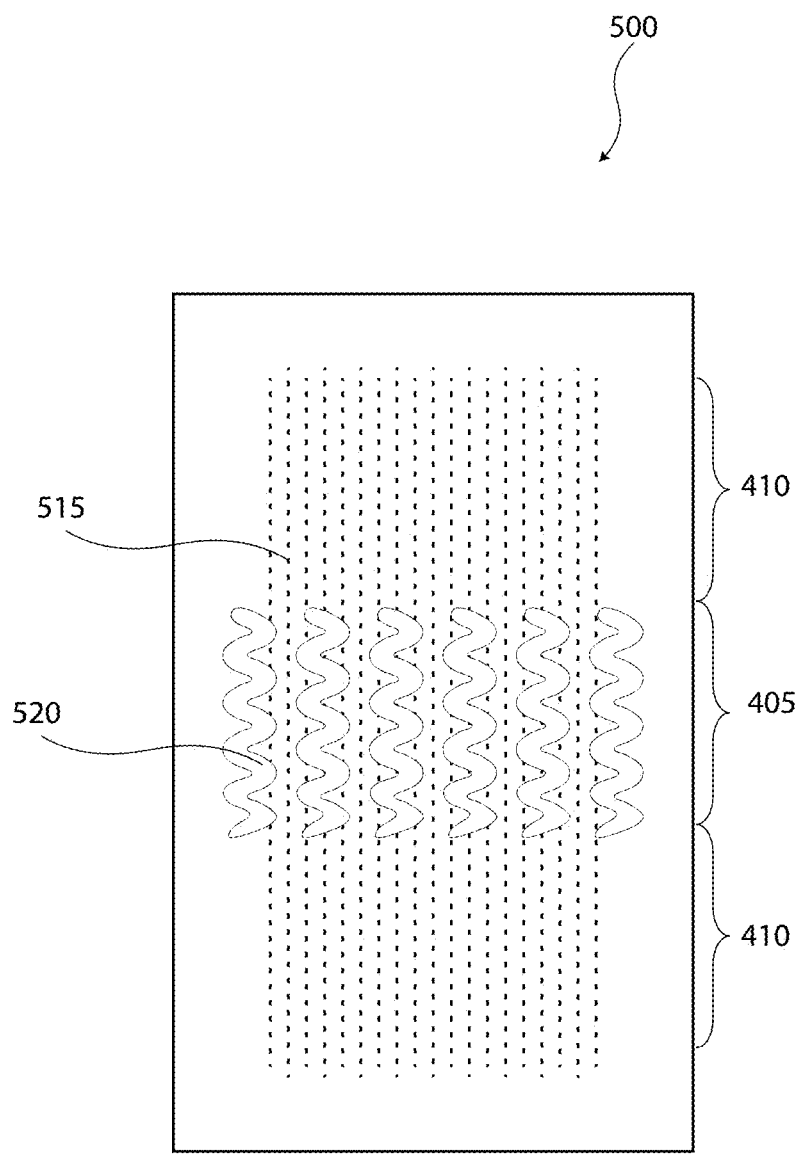
FIG. 6 is a top view illustration of an internal structure of a TGP with arteries according to some embodiments.

In some embodiments, the arteries 520 in the folding region may be wavy as shown in FIG. 6. This may, for example, improve the stretchability of the mesh. This may, for example, reduce stresses in the folding region and/or help avoid buckling.

In some embodiments, the folding region 405 of the liquid structure 500 or the folding region 405 of the vapor structure 400 may be corrugated. In some embodiments, a corrugated substrate may extend over the width the substrate or TGP but may not extend to the bonding region at the periphery of the first casing 110 and/or the periphery of the second casing 115 where the first casing 110 and/or the second casing 115 are bonded together. A corrugated structure may be fabricated using a process that includes, for example: creating waves in the folding region and creating waves in the bonded region after assembly. The waves in the folding region of both the substrate structures, for example, may be useful for liquid and/or vapor transport. The waves in the bonded region of both the liquid side substrate and/or the vapor core substrate, for example, may be hermetically sealed by using a low temperature thermo-compression bonding process.

In some embodiments, a TGP may be formed from the liquid structure 500 and the vapor structure 400. For example, in the TGP 100 shown in FIG. 1, the first casing 110 may include the liquid structure 500 and the second casing 115 may include the vapor structure 400. The folding region 405 of the liquid structure 500 and the folding region 405 of the vapor structure 400 may be aligned.

The bond, for example, between the mesh and the pillars in one of the folding region 405 or the non-folding region(s) 410 can be stronger relative to the other region. The mesh, for example, can undergo stresses and delaminate from the underlying substrate or other underlying wick structures such as pillars. Such delamination may change the effective capillary radius of the wick in those regions and/or lead to dry-out or other failures. The mesh, for example, may be anchored to the pillars by electroplating anchors to the pillars through pores in the mesh such as, for example, as shown in FIG. 7.

Figure 7:
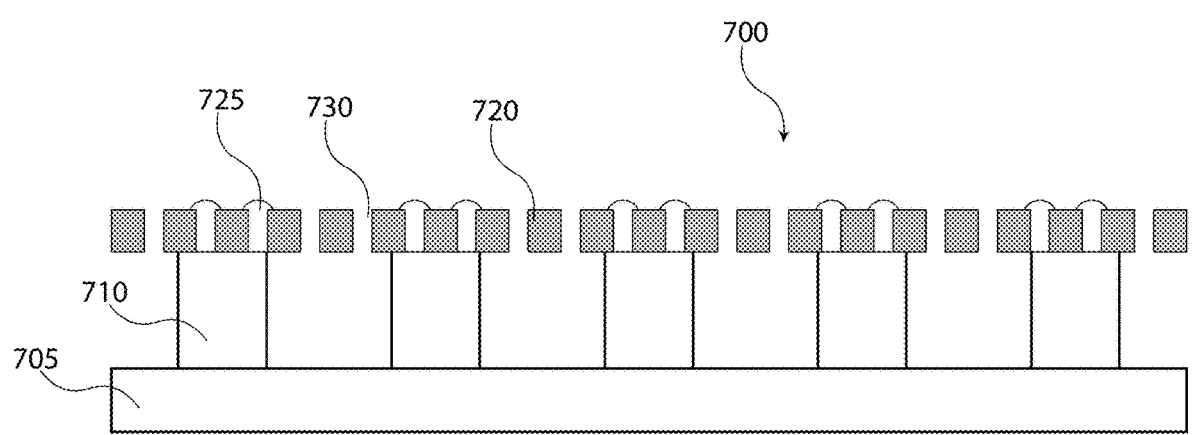
FIG. 7 is a side view illustration of an internal structure of a TGP with arteries according to some embodiments.

FIG. 7 is a side view illustration of internal structures of a TGP according to some embodiments. TGP 700 may include a mesh 720 coupled with pillars 710 (or another structure). The pillars 710 may be disposed on a casing 705. The mesh 720, for example, may be coupled with the pillars 710 via anchors 725. The anchors 725, for example, may be grown from the pillars 710 (or other structures) through pores 730 in the mesh 720. The anchors 725, for example, may not form in other portions of the mesh 720 not near the pillars (or other structures). The mesh 720, for example, may be electrically conductive and/or may be coated in a dielectric material such as, for example, to prevent plating of material into the pores away from the anchors. The pores 730 may be made from polymer, ceramic, other electrically insulating materials or electrically conductive material and/or may be covered by an electrically insulating layer.

Figure 8A:
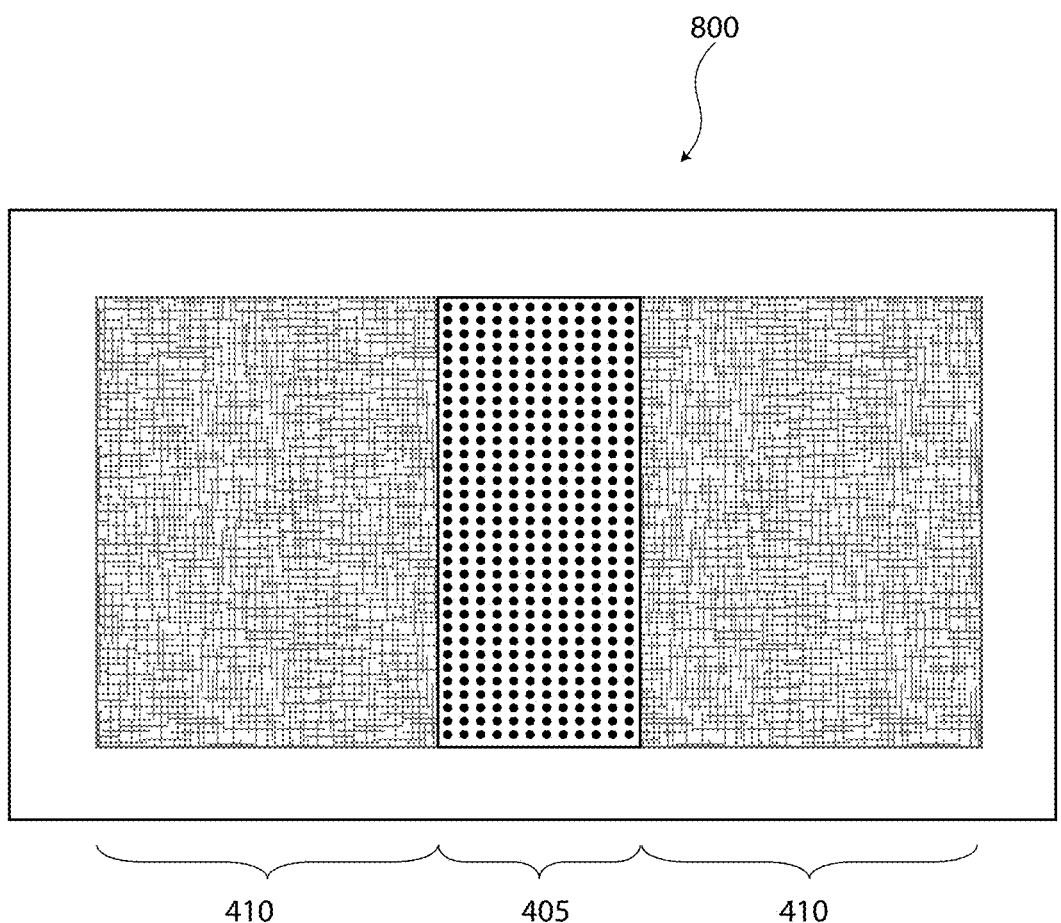
FIG. 8A is a top view illustration and FIG. 8B is a side view illustration of an internal structure of a TGP according to some embodiments.
Figure 8B:
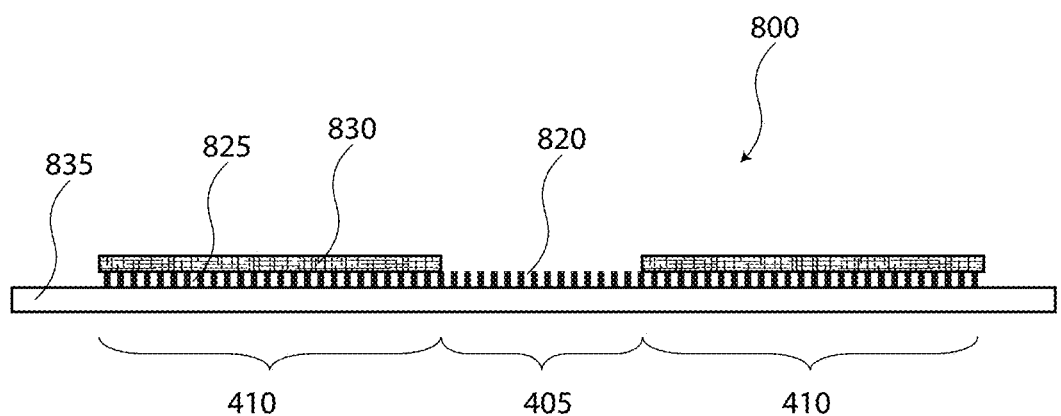

FIG. 8A is a top view illustration and FIG. 8B is a side view illustration of an internal structures of a TGP 800 having a folding region 405 and a non-folding region(s) 410. The non-folding region(s) 410, for example, may include an array of pillars 825 and/or a mesh 830. The folding region 405 includes pillars 820. The TGP 800 may, for example, allow for a thinner folding region 405.

Alternatively or additionally, the folding region 405 may comprise only pillars 820, only a mesh layer, a mesh on pillars that are shorter than the pillars 825 in the non-folding region(s) 410, or any other shortened wicking structures.

The pillars 825 and/or pillars 820 may be arranged more densely on the substrate 835 in the evaporator zone (e.g., near the heating zone) than in the non-evaporator zones. In the evaporator zone, for example, the pillars 825 and/or the pillars 820 may have a height of about 50-100 μm (e.g. about 75 μm), a diameter of about 10-30 μm (e.g. about 20 μm), and/or a pillar to pillar spacing of about 10-30 μm (e.g., about 20 μm). The pillars 825 and/or pillars 820 may extend about 100 μm to 300 μm (e.g., about 200 μm) beyond the evaporator zone. In the non-evaporator regions, the pillars may be less arranged less densely. Outside the evaporator zone, for example, the pillars 825 and/or the pillars 820 may be arranged in a less densely that the pillars within the evaporator zone. Outside the evaporator zone, for example, the pillars 825 and/or the pillars 820 may be arranged array may have a diameter that is about 3-5 times the diameter of the pillars in the evaporator zone such as, for example, a diameter of about 50-100 μm (e.g., 75 μm) and/or a pillar to pillar spacing that is 10-20 times the pillar to pillar spacing in the evaporator zone such as, for example, a pillar to pillar spacing of about 150-300 μm (e.g., about 200 μm) spacing. Outside the evaporator zone, the pillars may have a mesh disposed on the top of the pillars or a mesh coupled with the top of the pillars.

The pillars in the folding region 405 and/or the non-folding region 415, for example, may enhance reliability. The heat flux in a TGP can be high enough to cause nucleate boiling which may trap nucleate bubbles within the pillars. And a wick, for example, may improve this boiling effect.

The mesh 830, for example, may have a pore size similar to or about the same size as the spacing between the pillars. The mesh 830, for example, may be bonded to the pillar array in the region where it extends beyond the evaporator region.

Figure 9:
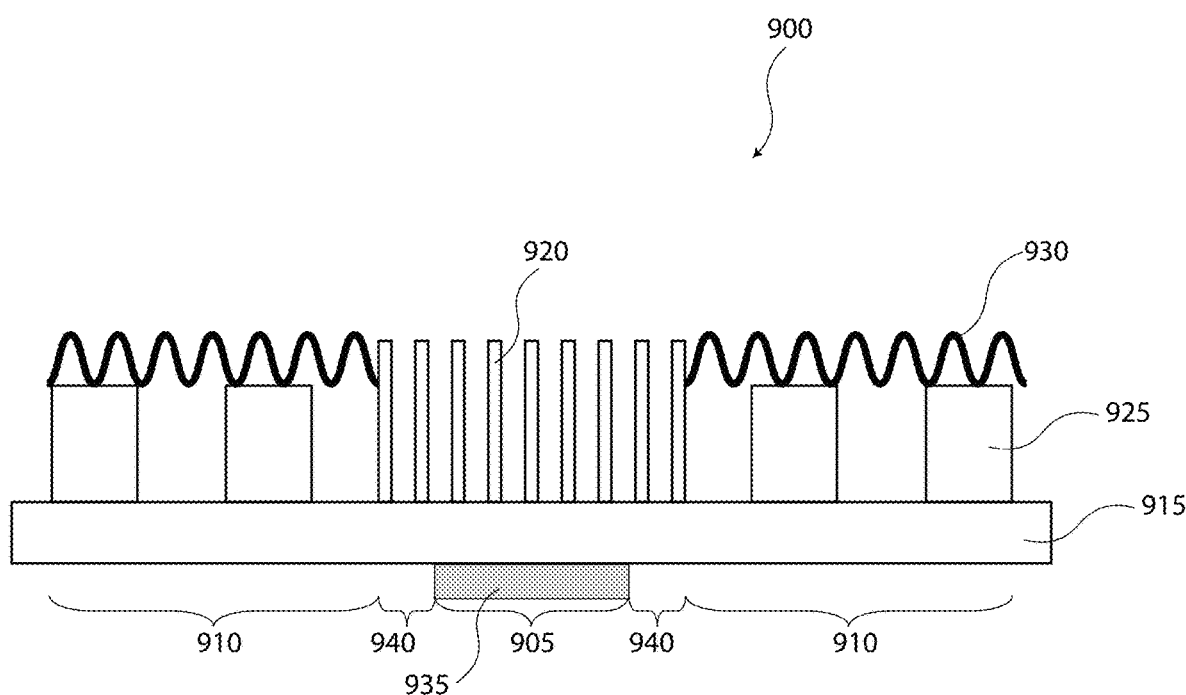
FIG. 9 is a side view illustration of an internal TGP structure with high density pillars that extend beyond heating zone according to some embodiments.

FIG. 9 is a side view illustration of an internal structure of a TGP 900 according to some embodiments. In this example, the TGP 900 includes an evaporator region(s) 905 and a condenser region(s) 910. The evaporator region(s) 905 may be disposed near heat source 935. The evaporator region(s) 905 may include an array of pillars 920 disposed on the substrate 915. Each of the pillars in the array of pillars 920 in the evaporator region 905 may be taller than the height of the pillars 925 and/or the height of the pillars 925 and the mesh 930 in the condenser region(s) 910.

The array of pillars 920, for example, may extend beyond the area near the heat source 940. For example, the if the heat source has a given dimension, then the array of pillars may extend 2%, 5%, or 10% beyond the heat source's given dimension.

The condenser region(s) 910, for example, may include an array of pillars 925 disposed on the substrate 915. A mesh 930 may be disposed on the top of the array of pillars 925. The mesh 930, for example, may include multiple layers of mesh material, which may, for example, increase the liquid flow area.

In some embodiments, a wick layer may include a single wick layer. In some embodiments, a wick layer may include micro pillars having a diameter of about 30 μm, a pillar to pillar spacing of about 30 μm, and/or a height of about 45 μm. In some embodiments, the pillars can be disposed to the casing in such a way to create a wick with a specific shape that creates flowing arteries in the flexible region as in FIG. 10. In some embodiments, the pillars are not connected with the mesh; these pillars may be referred to as pins. In such embodiments, the pillars can form liquid flow channels while the regions between the arteries are open for vapor flow.

Having a pillar array placed in the folding region 405, for example, may allow the wick to maintain a high capillary pressure associated with the small pore size of the mesh 405 while simultaneously having a high permeability associated with the large pillars. If a nucleate bubble were to boil in the evaporator zone, for example, then the high density of the micro pillars in that region could prevent the bubble from expanding into the condenser zone.

Figure 10A:
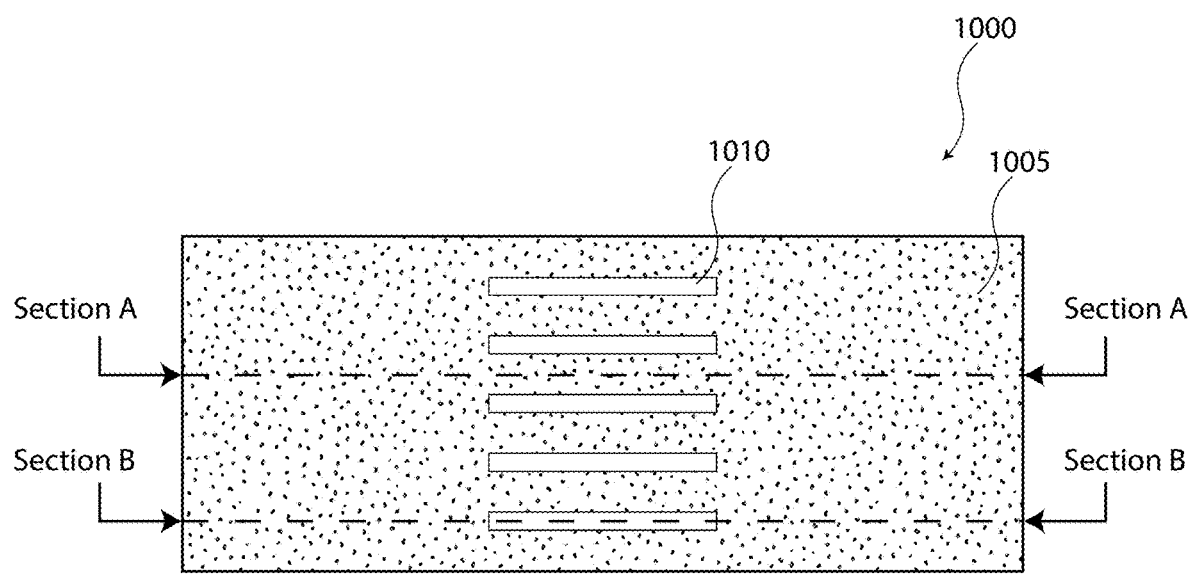
FIG. 10A is a top view illustration and FIGS. 10B and 10C are side view illustrations of a TGP substrate with pillars (or pins) and vapor flow gaps according to some embodiments.

FIG. 10A is a top view of a TGP substrate 1000 with an array of pillars 1005 disposed on a casing 1015 and one or more vapor flow gaps 1010 within an array of pillars 1020 according to some embodiments.

Figure 10B:
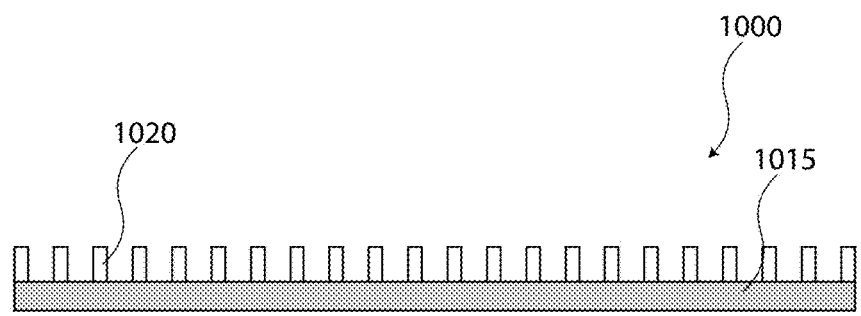
Figure 10C:
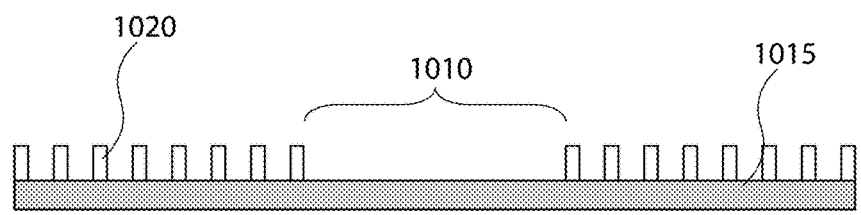

FIG. 10B is a side view of TGP substrate 1000 cut along Section A. FIG. 10C is a side view of TGP substrate 1000 cut along Section B. As shown in the figures, the vapor flow gaps 1010, for example, are areas within the array of pillars 1005 where the pillars have been removed. The vapor flow gaps 1010, for example, may be elongated and substantially rectangular and/or have a wavy shape.

Figure 11:
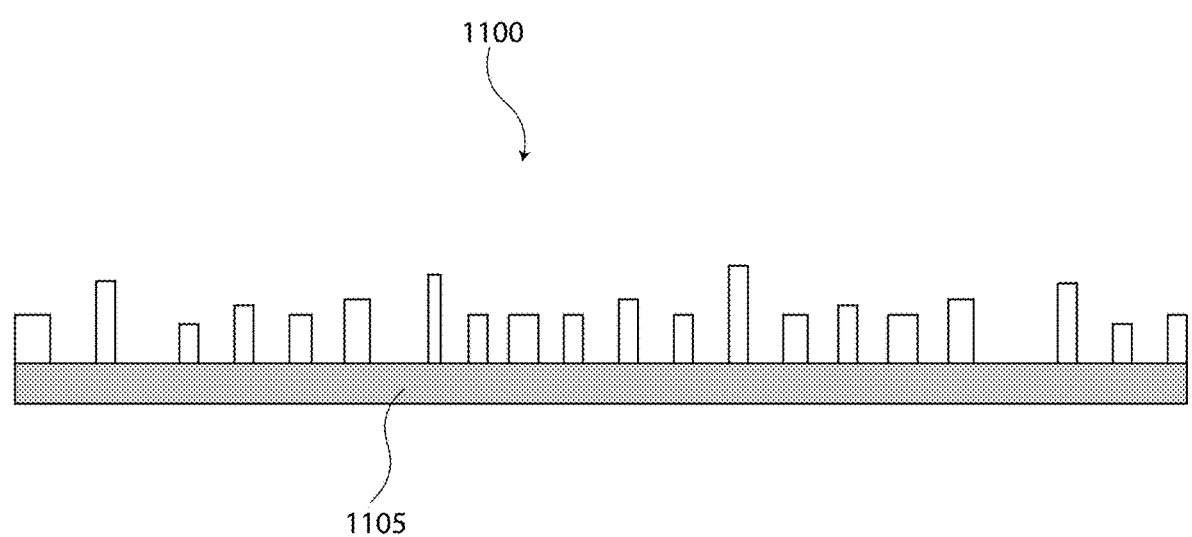
FIG. 11 is a side view illustration of an internal structure of a TGP with pillars with varying density, diameter, and/or spacing according to some embodiments.

FIG. 11 is a side view illustration of internal structures of a TGP 1100 with pillars with varying density, diameter, and/or spacing according to some embodiments. A plurality of pillars is shown on substrate 1105. The pillars, for example, may have different diameters, pillar to pillar spacing, pillar density, and/or pillar heights. Any of the pillars or arrays of pillars described in this document may have different diameters, pillar to pillar spacing, pillar density, and/or pillar heights.

Figure 12A:
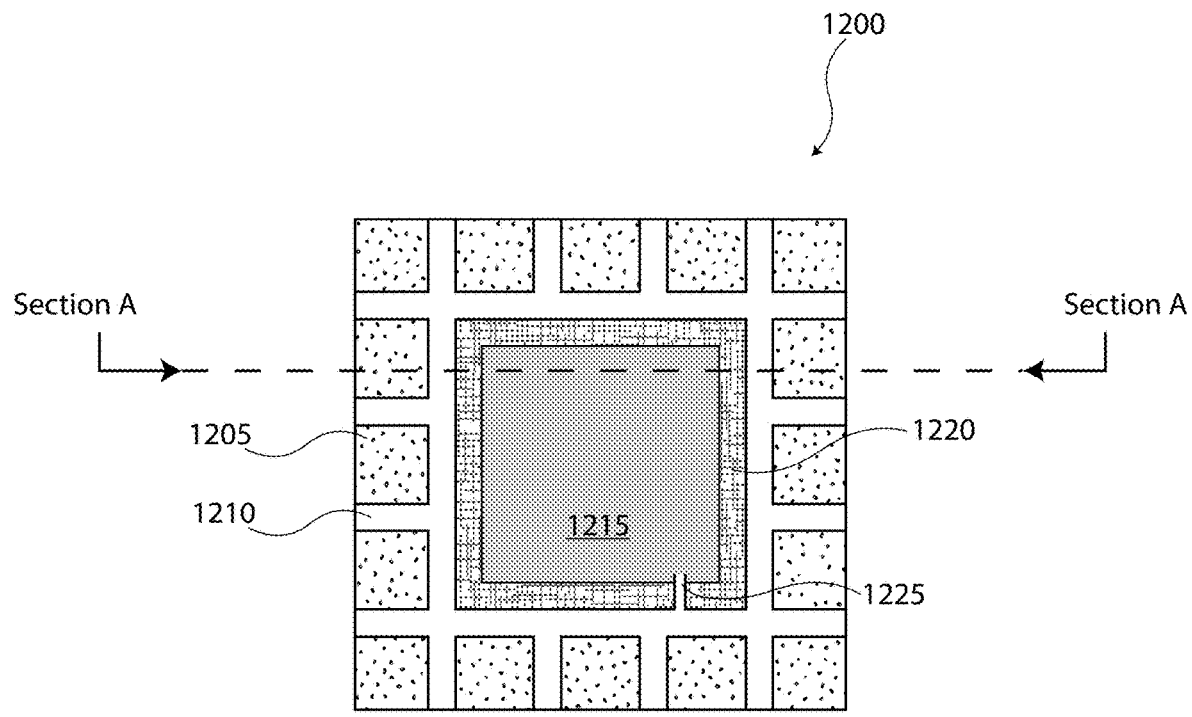
FIG. 12A is a top view illustration and FIG. 12B is a side view illustration of a designated boiling zone within an internal structure of a TGP according to some embodiments.
Figure 12B:
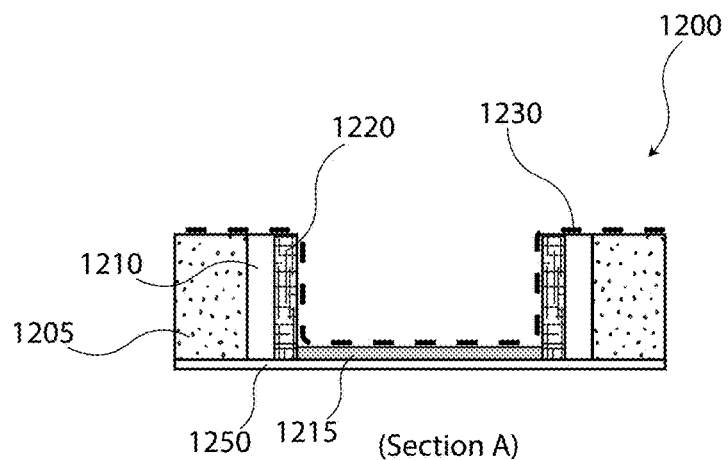

FIG. 12A is top view illustration and FIG. 12B is a side view illustration of a portion of TGP 1200 with a designated boiling zone 1215 according to some embodiments. A plurality of pillars 1205 may be disposed on a substrate 1250. The pillars 1205, for example, may include a texture on the surface of the pillars 1205 having a scale in micrometers or nanometers. The pillars 1205, for example, may be porous. The TGP 1200 may include a plurality of liquid flow paths 1210 that are defined by the pillars 1205.

The designated boiling zone 1215, for example, may be defined by a wall 1220. The wall 1220, for example, may comprise a porous material. The wall 1220, for example, may or may not include the same material as the pillars 1205. The wall 1220, for example, may have one or more gaps 1225 that allow for liquid or vapor flow between the designated boiling zone 1215 and at least one of the liquid flow paths 1210. The one or more gaps 1225, for example, may have a width that is about half the width of a liquid flow paths 1210. The designated boiling zone 1215, for example, may include a texture on the surface of the pillars 1205 having a scale in micrometers or nanometers. A mesh 1230, for example, may rest on the top of the pillars 1205 and/or the top of the wall 1220. The mesh 1230, for example, may also rest on the surface of the designated boiling zone 1215. The designated boiling zone 1215 may allow for nucleate bubbles to form and grow during boiling.

Figure 13:
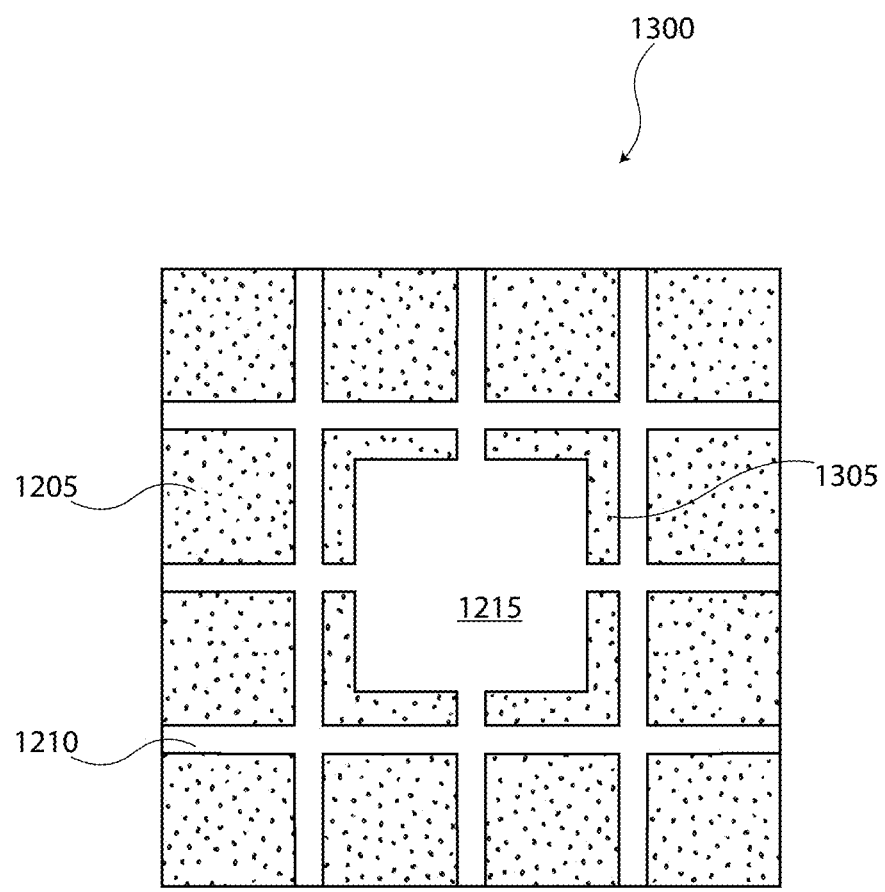
FIG. 13 is a top view illustration of a designated boiling zone with an L-shaped pillar within an internal structure of a TGP according to some embodiments.

FIG. 13 is a top view illustration of an internal structure of a TGP 1300 with one or more L-shaped pillars 1305 according to some embodiments. L-shaped pillars 1305 may be located around the designated boiling zone 1215 and/or replace the wall 1220 shown in FIG. 12.

The texture within the designated boiling zone 1215, on portions of the wall 1220, and/or on portions of the one or more L-shaped pillars 1305, for example, may be the same texture as the pillars 1205 or may have a texture with features having a smaller scale than the features of the texture on the pillars 1205. The texture within the designated boiling zone 1215, on portions of the wall 1220, and/or on portions of the one or more L-shaped pillars 1305, for example, may include of short features (e.g. 2 μm). The texture within the designated boiling zone 1215, on portions of the wall 1220, and/or on portions of the one or more L-shaped pillars 1305, for example, may be grown by a chemical process.

Figure 14A:
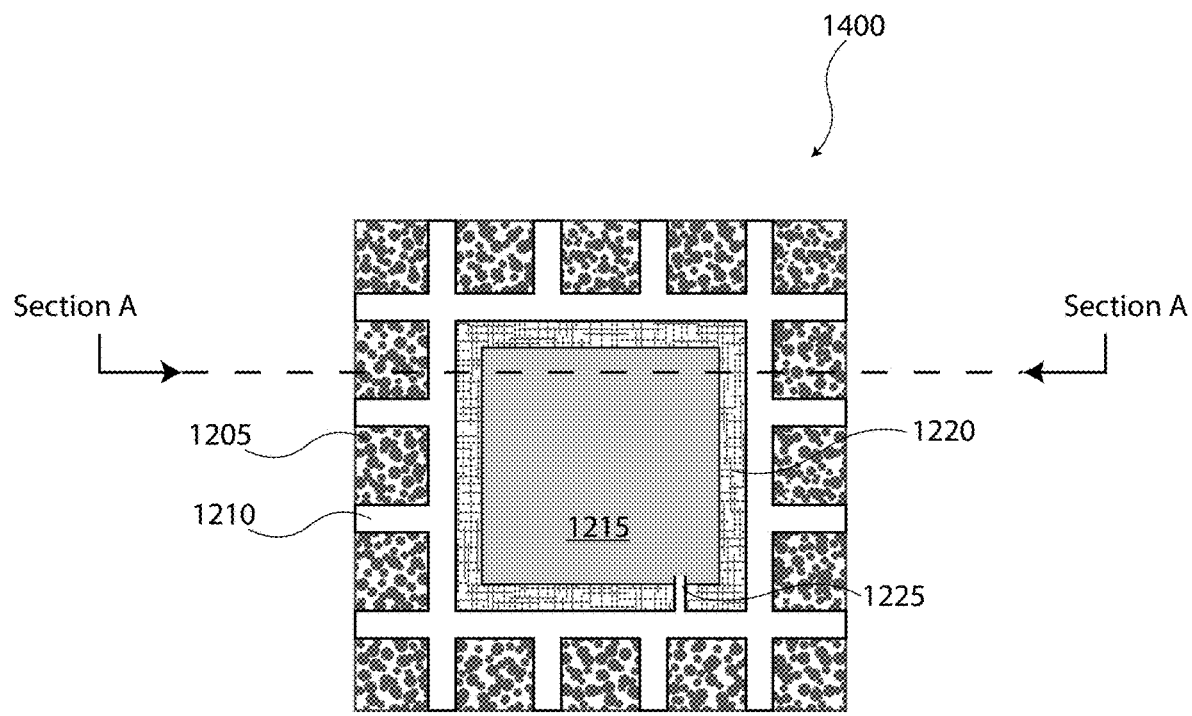
FIG. 14A is top view illustration and FIG. 14B is side view illustration of an internal structure of a TGP with a mesh aligned with a designated boiling zone according to some embodiments.
Figure 14B:
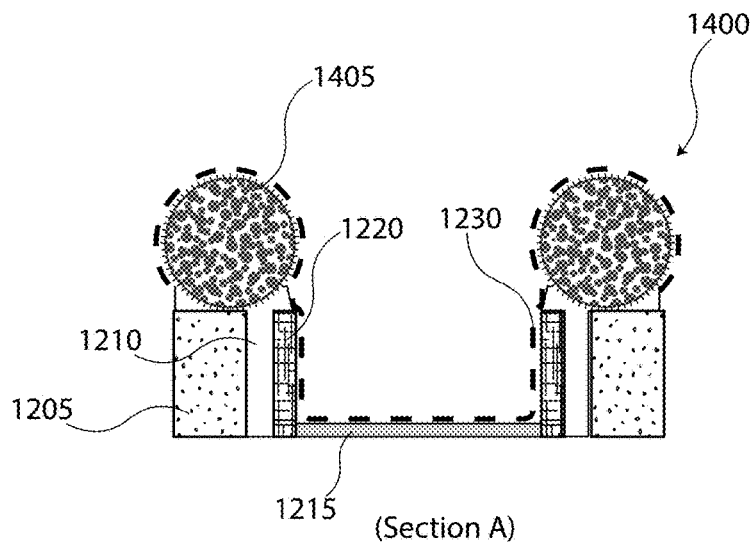

FIG. 14A is a top view illustration and FIG. 14B is a side view illustration of internal structures of a TGP 1400 having a mesh 1405 aligned with a designated boiling zone 1215 according to some embodiments. A TGP, for example, may comprise a plurality of boiling zones formed within the TGP. One or more boiling zones, for example, may be disposed at or near the evaporator region. A boiling zone 1215, for example, may comprise a square having sides of 50, 100, 200, 350, or 500 μm.

The boiling zone 1215, for example, may include a mesh 1405 with a large pore aligned with the designated boiling zone 1215. The mesh 1405, for example, may cover at least a portion or all of the evaporator region. This may, for example, prevent boiling vapor from forming beneath the solid portions of the mesh. In some embodiments, the mesh may be coated in a micro/nano-textured surface, which may wick water up the lengths of the wires and increase the area associated with vapor/liquid phase change. This may, for example, reduce the temperature for a given input heat. In some embodiments, the mesh may include woven wires, non-woven wires, or porous planar media.

In some embodiments, the liquid structure may include a layer of mesh bonded (e.g., continuously bonded) onto the casing. The bonding between the mesh and the substrate can form a strong, elastic composite. The layer mesh may include two, three, four or more layers of mesh. The mesh may include a copper mesh or non-copper mesh such as, for example, polymer or stainless steel, encapsulated by hydrophilic and anti-corrosion hermetic seal.

In a folding TGP, one layer may be more sensitive to wrinkling than other layers. Using a thick elastic film with strong bonding to the TGP, the stress-free neutral axis could be shifted towards a wrinkle sensitive layer. The wrinkle sensitive layer is usually the layer with larger out-of-plane features such as pillars. The location of centroid which is equal to the location of the stress-free neutral axis for a multilayer solid is calculated as:

$$\bar{z} = \frac{\sum E_i A_i \bar{z}_i}{\sum E_i A_i}$$

where $\bar{z}$ is the location of the stress-free neutral axis; $E_i$ is the elastic modulus of each layer; $A_i$ is the cross-sectional area of each layer and $\bar{z}_i$ is the location of the centroid of each layer. For a two-layer solid, this equation could be written as:

$$\bar{z} = \frac{E_1 A_1 \bar{z}_1 + E_2 A_2 \bar{z}_2}{E_1 A_1 + E_2 A_2} = \frac{\bar{z}_1 + \frac{E_2 A_2}{E_1 A_1} \bar{z}_2}{1 + \frac{E_2 A_2}{E_1 A_1}}$$

Therefore, with increasing the elastic modulus and thickness for the film ($E_2$ and $\bar{z}_2$), the stress-free neutral axis of the multilayer system shifts more effectively. By shifting the stress-free neutral axis towards wrinkle sensitive layer, the stress generated in this layer is reduced therefore the device could be folded without generation of wrinkles.

The major cause for wrinkling is compressive stress which causes instabilities and buckling. If the stress-free neutral axis is located outside the wrinkle sensitive layer or near the edge of this layer, the stress applied to it when folded is reduced which leads to improving its flexibility. The reason for using a thick film is that the TGP is usually made of copper which has very high elastic modulus compared to adhesive films.

Figure 15A:
FIG. 15A and FIG. 15B illustrate the difference between two cases with and without a thick film.
Figure 15B:
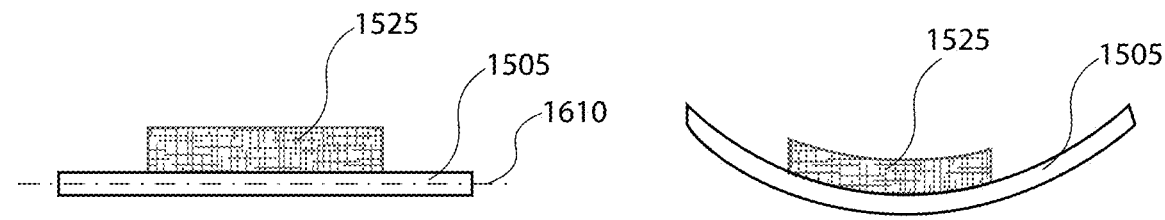

FIG. 15A and FIG. 15B show the difference between two casings 1505 with and without a thick film 1525 on a casing 1505. As shown in FIG. 15A, the casing 1505 without the thick film may not fold well. In some embodiments, the thick film 1525 can be a viscoelastic layer. Alternatively or additionally, it may be possible to etch cavities in TGP substrates used and fill those cavities with soft material such as PDMS. Instead of cavities, TGP can be encapsulated by soft materials.

In some embodiments, a folding TGP may be encapsulated with a high elastic module coating. For a plate under compression the critical stress for buckling may be given as:

$$\sigma_{cr} = \frac{k_c \pi^2 t^2 E}{12(1-v^2)w^2}$$

where, $k_c$ is a coefficient depending on side wall boundary conditions, t, is the thickness, E, is the elastic modulus, $\upsilon$, is the Poisson's ratio, and w is the width. Based on this equation, increasing elastic modulus, and thickness reduces the chance of buckling. With a high elastic modulus coating, both the thickness and elastic modulus of substrate are increased leading to reduced chance of buckling. Overall, smaller TGP thickness with larger coating thickness are desirable for reduction of wrinkling, warping, buckling or crease.

Figure 16A:
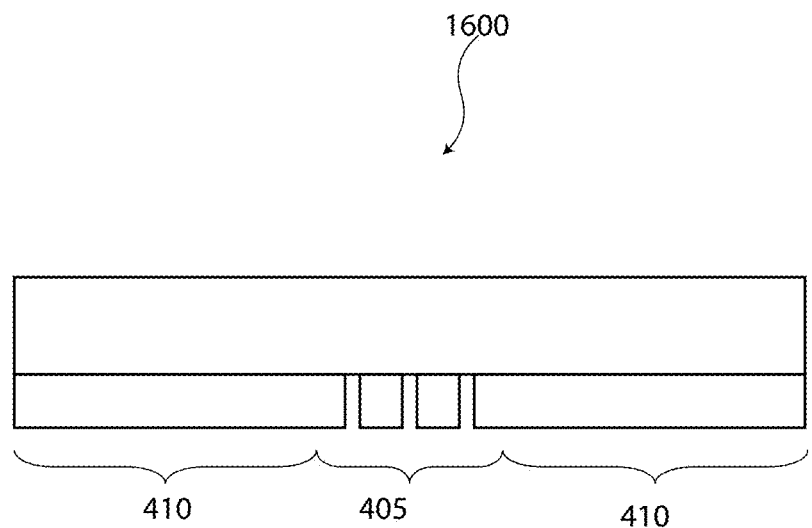
FIG. 16A is a side view of a support layer with removed areas in the folding region is laminated on the bottom of the TGP according to some embodiments.
Figure 16B:
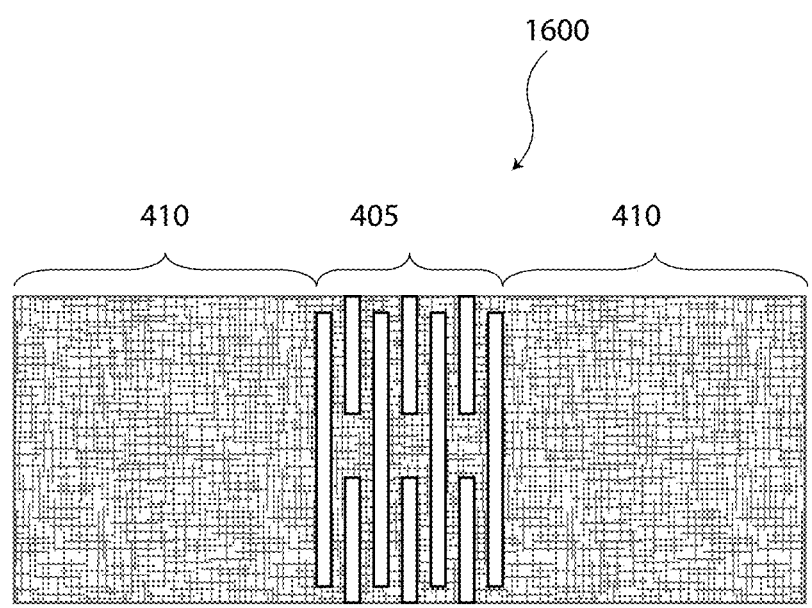
FIG. 16B is a top view of a support layer with removed areas in the folding region is laminated on the bottom of the TGP according to some embodiments.
Figure 17A:
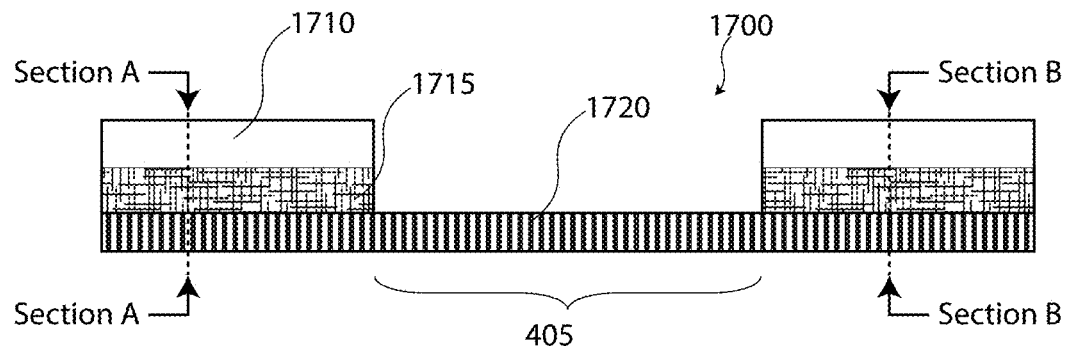
FIGS. 17A, 17B, and 17C are side views illustrations of an internal structure of a TGP with a thin folding section with an artery in the folding region according to some embodiments.
Figure 17B:
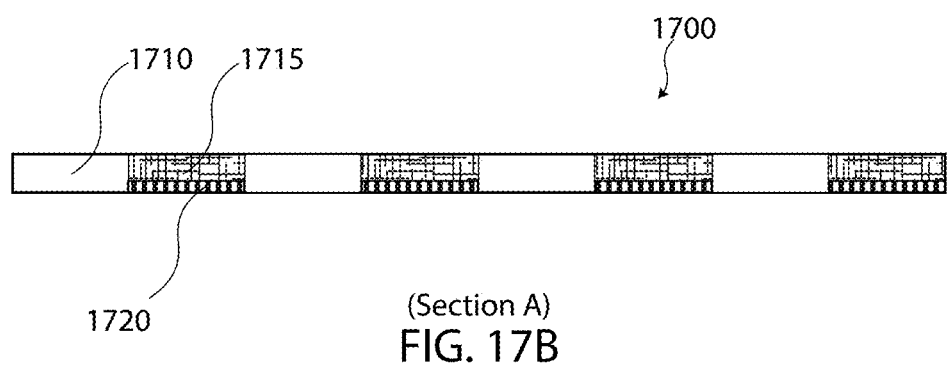
Figure 17C:
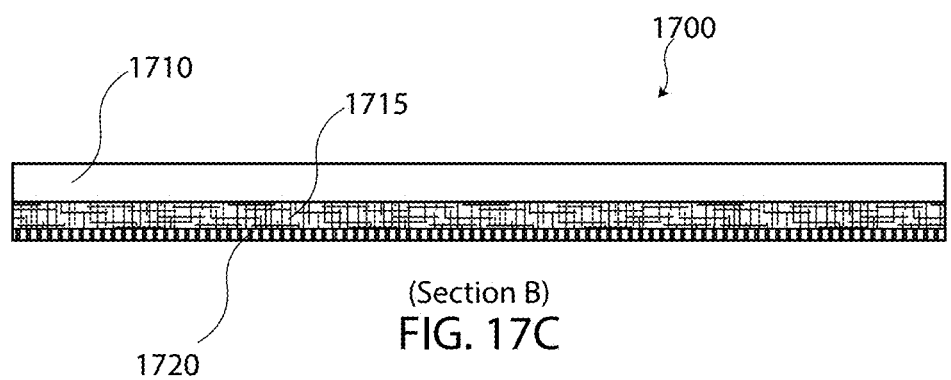
Figure 18:
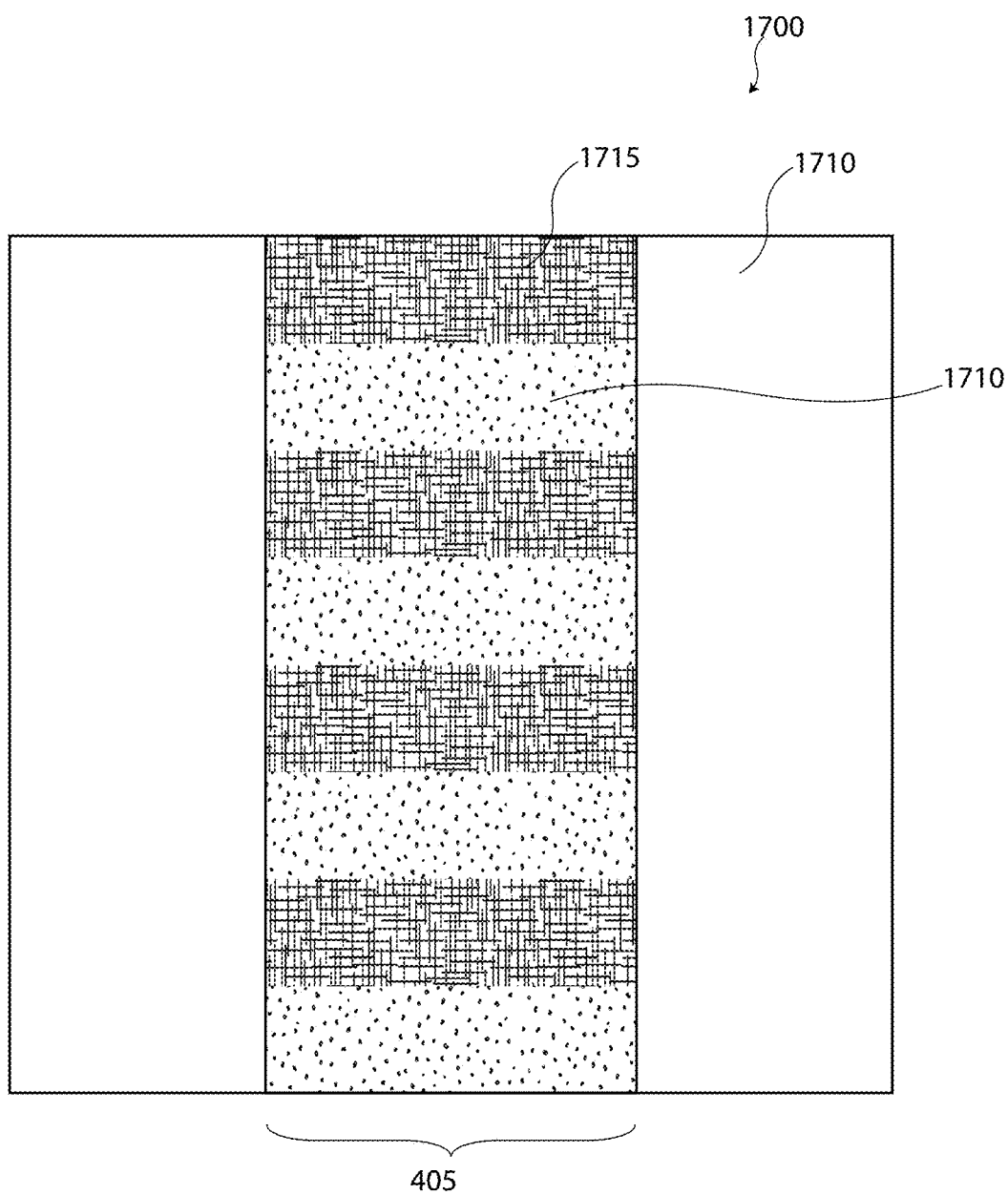
FIG. 18 is a top view illustrations an internal structure of a TGP with a thin folding section according to some embodiments.

For a thick support, it is possible to laminate it on top of a flexible support layer with patterned structure. With modifying the pattern, it is possible to modify the mechanical properties of the assembly locally. For example, it is possible to reduce the elastic modulus E in the folding region or reduce shear modulus G in the non-folding regions. FIG. 16 illustrates an example of this concept. A support layer with removed areas in the folding region 405 and no areas removed in the non-folding region 410. The support layer, for example, may be laminated on the bottom of the TGP 1600.

In some embodiments, when a TGP is bent to the radius of curvature p, the maximum stress generated in it ($\sigma_{max}$) could be written as:

$$\sigma_{max} = \frac{Mc}{I}; \frac{1}{\rho} = \frac{M}{EI} \rightarrow \frac{1}{\rho} = \frac{\sigma_{max}}{Ec}$$

where M, is the external moment, c is equal to half the thickness, E, is the young's modulus, and I, is the cross-sectional moment of inertia. According to this equation, with reducing the thickness of the structure, the amount of maximum applied stress is reduced leading to reduction in the chance of wrinkling and other types of plastic deformation.

Some TGPs may include a liquid structure or a vapor structure having the thickness of each layer reduced proportionally. Some TGPs may reduce the cross-section in the folding region by using different wicking configuration.

FIGS. 17A, 17B, 17C, and 18 illustrates an internal structure of a TGP 1700 with a folding region 405 with a thin thickness and/or having an artery configuration in the folding region 405 according to some embodiments. The TGP 1700, for example, may include a plurality of vapor channels 1710, an array of pillars 1720, and/or mesh 1715. In some examples, the array of pillars 1720 may be optional and the mesh 1715 may extend the entire height. The vapor channels 1710 and/or the mesh 1715 may, for example, be separated horizontally rather than vertically, in the folding region shown in FIG. 17B. The same structures may be stacked vertically in the non-folding region 410.

Figure 19:
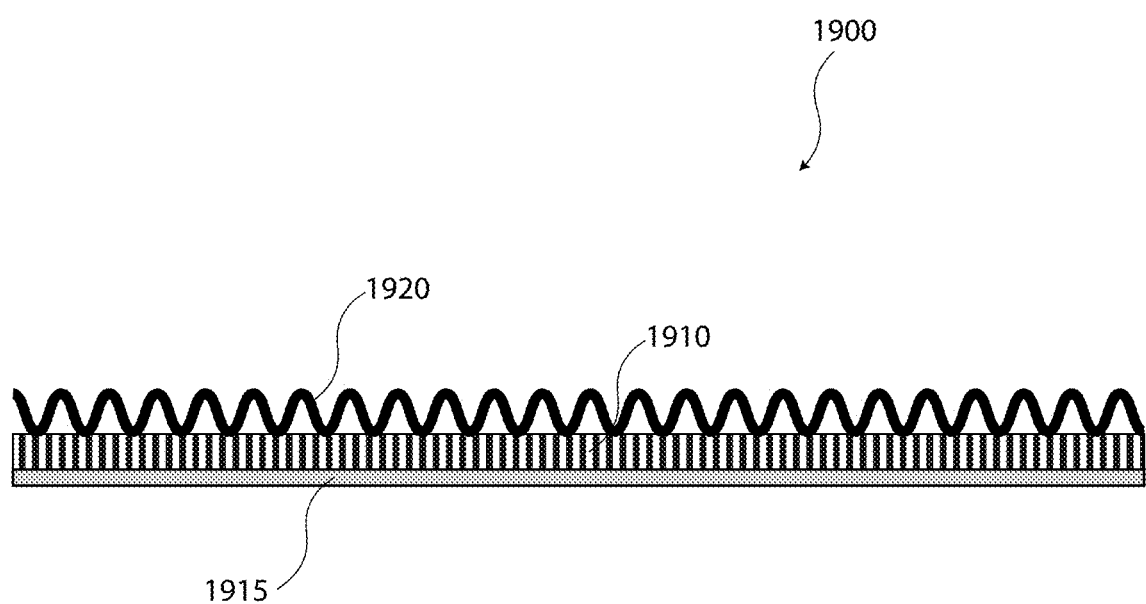
FIG. 19 is a side view illustration of an internal structure of a TGP according to some embodiments.

FIG. 19 is a side view illustration of an internal structure of a folding region of a TGP 1900 having a wavy portion 1920 of the first casing where the wavy portion has an out-of-plane shape such that the peaks and valleys of the wavy structure extend across a width of the TGP 1900. The TGP 1900, for example, may include a mesh and/or wick structure 1910 according to some embodiments. The second casing 1915 may or may not have an out-of-plane wavy structure. Any of the TGPs described in this document may include a first casing and/or a second casing with an out-of-plane shape. An out-of-plane shape may have one or more features that extend out of the plane such as, for example, having a wavy structure. An out-of-plane structure, for example, may include peaks and valleys that extend across a width of the TGP.

The repeated stress and strain associated with the folding region may cause the material to harden and/or tear after a large number of folding cycles. Any tears in a TGP casing material may represent a leak path for contaminate gasses and may render the TGP a failure. Furthermore, many consumer electronic applications of folding electronics or folding electronic accessories may require as many as 100,000 folding cycles. For a reliable operation over such a large number of cycles, the cracking strain may need to be reduced for casing materials such as copper. In order to reduce the strain experienced by the casing material when the laminate is bent, an out-of-plane shape can be used. When an out-of-plane shape is applied to one layer of casing material, the effective modulus of that casing material may be reduced, and the stress-free neutral axis may shift. Further shifts in stress-free neutral axis can be accomplished using stiffer material in a casing, such as Cu-clad steel.

Figure 20:
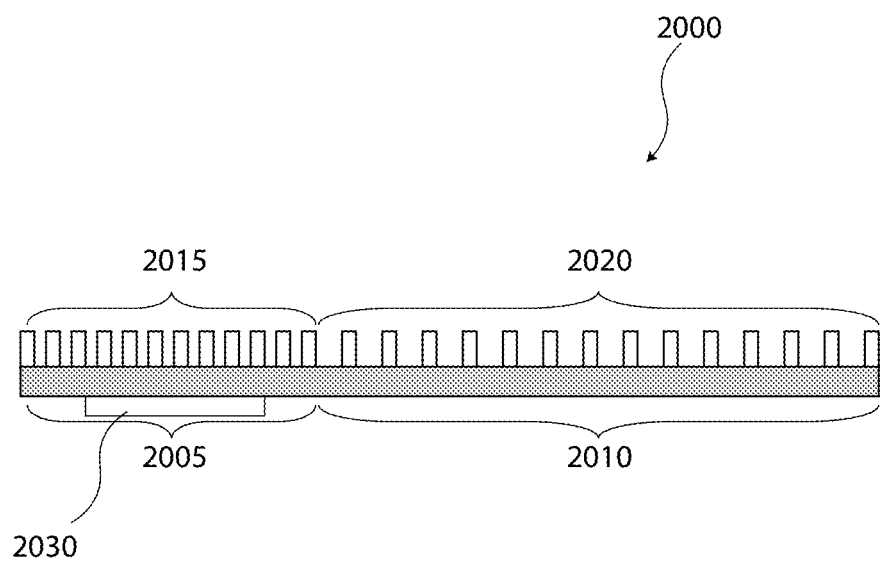
FIG. 20 is a side view illustration of an internal structure of a TGP with an evaporator region having a denser pillar array than the pillar array in the condenser region according to some embodiments.

FIG. 20 is a side view illustration of an internal structure of a TGP 2000 with an evaporator region 2005 having a denser pillar array 2015 than the pillar array 2020 in the condenser region 2010. The evaporator region 2005 may be positioned relative to a heat source 2030 such as, for example, a processor, chip, battery, etc.

Figure 21A:
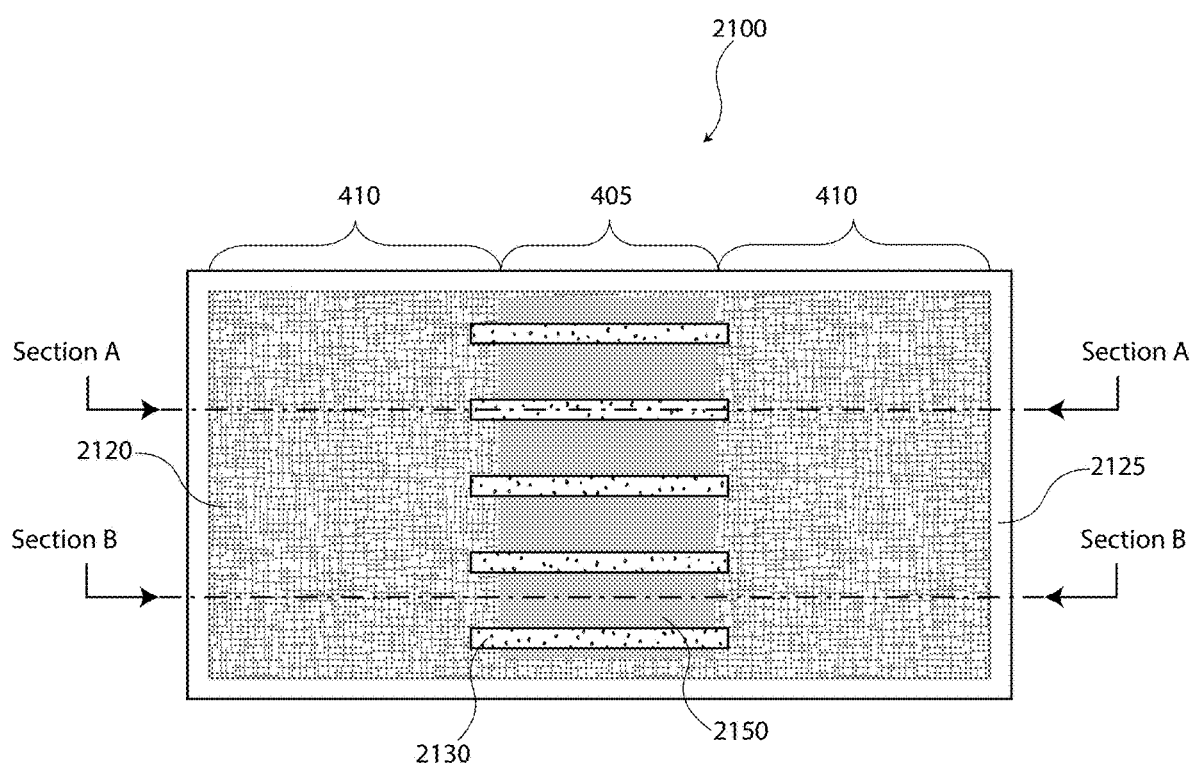
FIG. 21A is a top view illustration and FIGS. 21B and 21C are side view illustrations of an internal structure of an artery type TGP according to some embodiments.
Figure 21B:
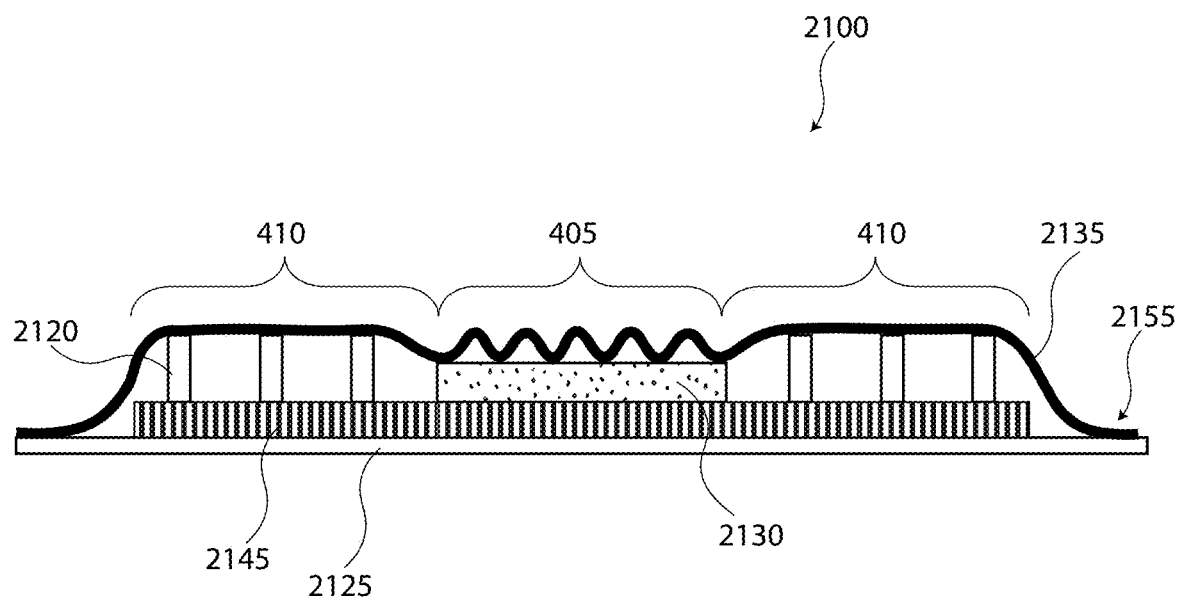
Figure 21C:
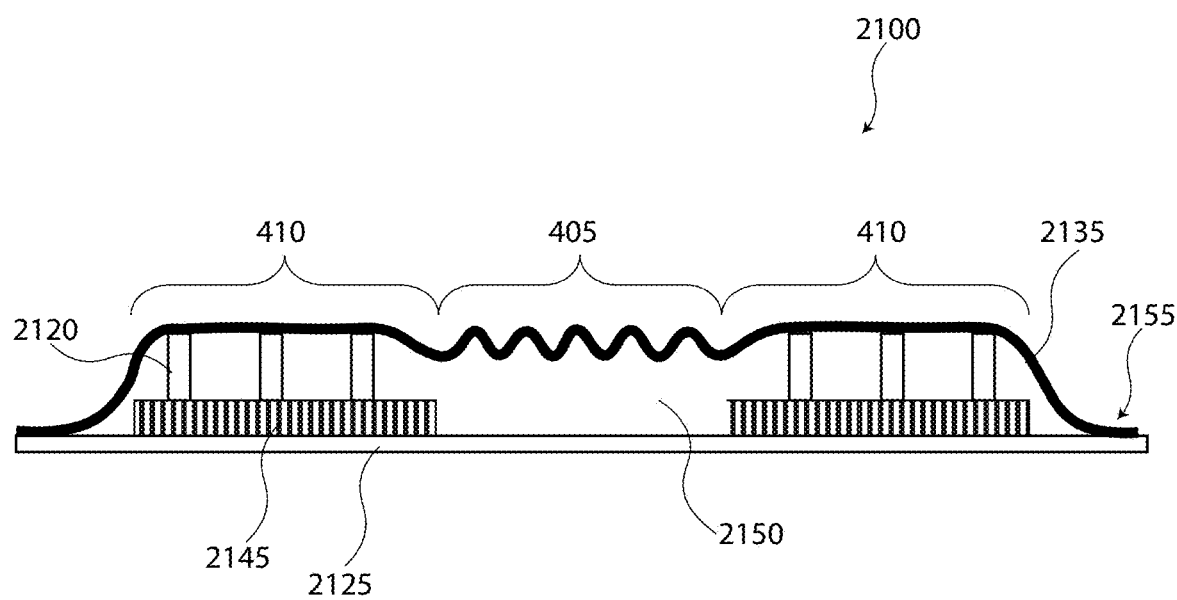

FIG. 21A is a top view illustration and FIGS. 21B and 21C are side view illustrations of an internal structure of an artery type TGP 2100 with a folding region 405 and a non-folding region 410 according to some embodiments. FIG. 21B is cutaway side view through section A and FIG. 21C is a cutaway sideview through section B.

The non-folding region 410, for example, may be substantially planar. The non-folding region 410, for example, may include a wick 2145 disposed on the second casing 2125. The wick 2145, for example, may include an array of pillars. An array pillars 2120, for example, may be disposed on the wick 2145, which may support the first casing 2135 and/or may define a vapor region. The first casing 2135 and the second casing 2125 may be bonded on the edges 2155.

The folding region 405, for example, may include a one or more arteries 2150 disposed or cut within the wick 2145, which may be used, for example, for vapor support. As shown in FIG. 21C, a portion of the folding region 405 may not include mesh channels 2130 or wick 2145.

The mesh channel 2130, for example, may comprise a mesh (e.g., a woven wire mesh), which may or may not be bonded to the wick 2145. The height of the mesh channel 2130 and/or the height of the wick 2145, for example, may support the casing 2135. The arteries 2150, for example, may or may not be bonded to the casing 2135. The wires within the mesh channels may extend across the wick 2145 or the first casing 2135 during folding. The arteries 2150 may define arteries that do not include the wick and/or the arteries 2150.

A portion of either or both the first casing 2135 and the second casing 2125 may include one or more out-of-plane wavy sections (e.g., folding region 405) and/or planar sections (e.g., 410). The folding region 405, for example, may include one or more arteries of dense pillars, and mesh disposed on top of the pillars, with a Cu-steel substrate on the liquid side and an out-of-plane deformed Cu-clad-polyimide laminate as the vapor-side casing. In some embodiments, a copper/polymer composite layer or a single copper layer may be used for the out-of-plane structure. A polymer layer is much more elastic, so the composite's strains can be designed to be within the elastic limits of the copper and the polymer layers. The mesh disposed on the pillars may support the vapor cavity, which may run parallel to the mesh arteries. The deformed regions of the casing may allow vapor to flow between adjacent arteries. The stiffness associated with the out-of-plane waves may allow the vapor support mesh structures to be far separated without the casing material deforming into the vapor cavity. The mesh structure has a degree of flexibility, and it can slip across the pillars or across the vapor casing material. In some embodiments, the use of ALD-coated polymer without any metal material can be more reliable than Cu-clad-polyimide laminate.

In some embodiments, the non-folding regions include a mesh bonded to a wall that encircles the non-bending region. In this way, any vapor-liquid meniscus that forms will be determined by the pore size of the mesh rather than the gap height of the pillars; and in such a case, the capillary pressure will be determined by the pore size of the meniscus, while the flow resistance will be determined by the height of the pillars. In some embodiments, the height of the pillars can be 20, 30, 40 us, etc., while the pore size of the mesh can be smaller such as 5, 10, 15, 20 us, etc. In some embodiments, the mesh can be bonded to the dense array pillars, to ensure there is no gap region between the mesh-clad wick and the pillars, as in FIG. 22. In some embodiments, the dense folding region can be any other wick beside pillars, including a dense mesh. In some embodiments, the wall can be a permeable material with a pore substantially similar to or smaller than the pore size of the mesh; in some embodiments the wall can be a layer of dense woven or non-woven mesh with pore size substantially similar to or smaller than the pore size of the mesh, and in such embodiments the dense mesh can also provide the wicking through the flexible region.

Figure 22A:
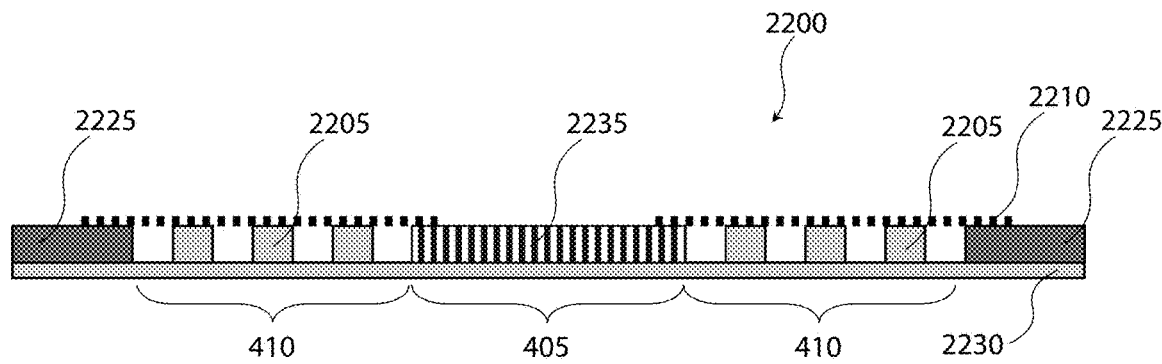
FIGS. 22A, 22B, and 22C are side view illustrations of an internal structure of a TGP with different mesh-to-pillar configurations according to some embodiments.

FIG. 22A is a side view illustration of an internal structure of a TGP 2200 according to some embodiments. The TGP 2200 includes a folding region 405 and a non-folding region 410. A first array of pillars 2235 may be disposed on the substrate 2230 in the non-folding region 410. A second array of pillars 2205 may be disposed on the substrate 2230 in the non-folding region 410. The density of the pillars in the first array of pillars 2235, for example, may be greater than the density of the pillars in the second array of pillars 2205. The diameter of the pillars in the first array of pillars 2235, for example, may be smaller than the diameter of the pillars in the second array of pillars 2205. The pillar to pillar distance in the first array of pillars 2235, for example, may be smaller than the pillar to pillar distance in the second array of pillars 2205.

The first array of pillars 2235 and/or the second array of pillars 2205 may have a heigh of about 20, 30, 40 µm, etc.

A wall 2225 (or a plurality of walls) may surround the second array of pillars 2205. The wall 2225, for example, may surround only the second array of pillars 2205. The wall 2225, for example, may surround both the first array of pillars 2235 and the second array of pillars 2205. The wall 2225, for example, may comprise a permeable material with a pore size substantially similar to or smaller than the pore size of the mesh 2210.

A mesh 2210 may be disposed over the second array of pillars 2205, the wall 2225, and/or a portion of the first array of pillars 2235 such as, for example, an edge portion of the first array of pillars 2235. The mesh 2210, for example, may have a pore size less than about 5, 10, 15, 20 µm. The mesh 2210, for example, may be bounded to the wall 2225, the second array of pillars 2205, and/or a portion of the first array of pillars 2235.

Figure 22B:
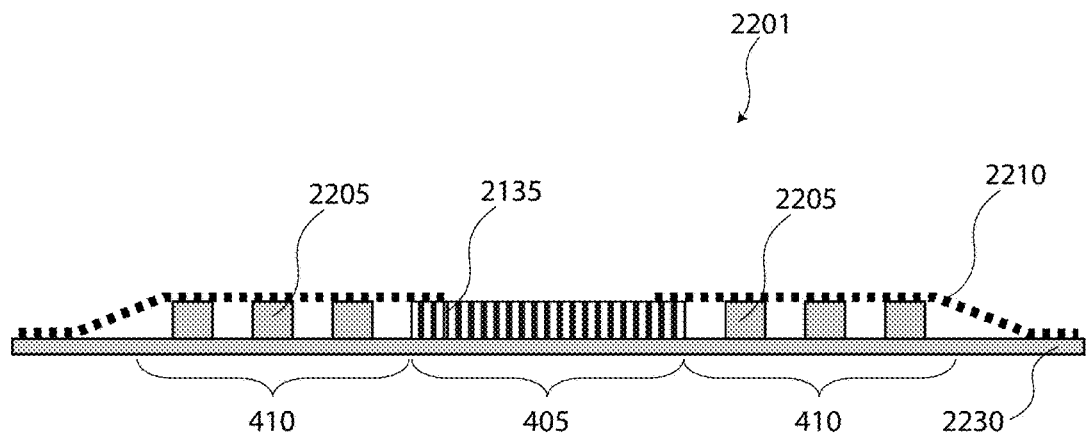

FIG. 22B is a side view illustration of an internal structure of a TGP 2201 according to some embodiments. TGP 2201 is similar to TGP 2200. In this example, the wall 2225 has been removed and the mesh 2210 may be bonded with the substrate 2230.

Figure 22C:
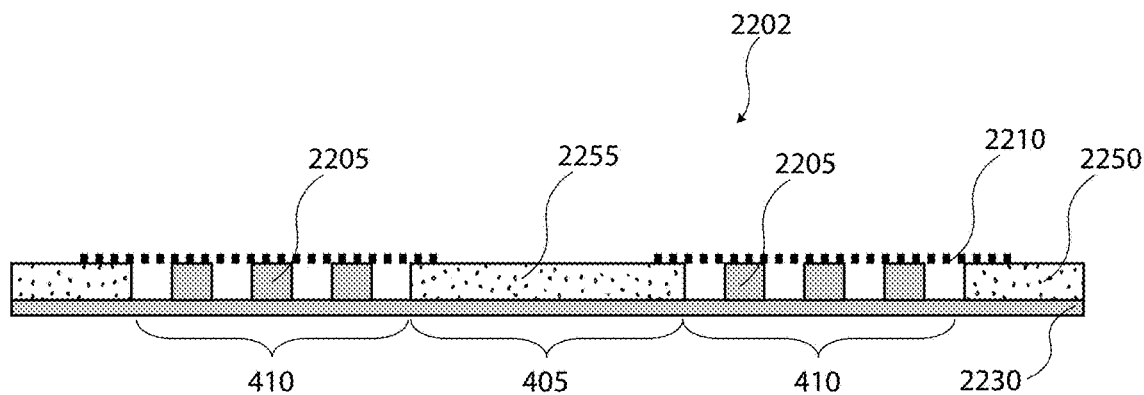

FIG. 22C is a side view illustration of an internal structure of a TGP 2202 according to some embodiments. TGP 2202 is similar to TGP 2200. In this example, the first array of pillars 2235 in the folding region 405 may be replaced with a dense mesh 2255 and/or the wall 2225 may be replaced with a dense mesh 2250. The dense mesh 2255 and/or the dense mesh 2250, for example, may comprise a woven or non-woven mesh with a pore size smaller than the pore size of the mesh 2210.

Figure 23A:
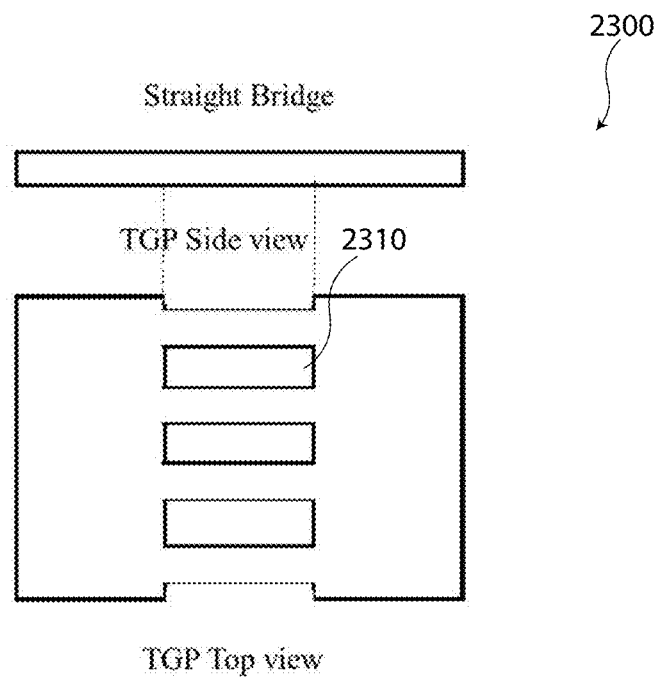
FIGS. 23A and 23B illustrates a TGP structure with a straight or wavy folding region according to some embodiments.
Figure 23B:
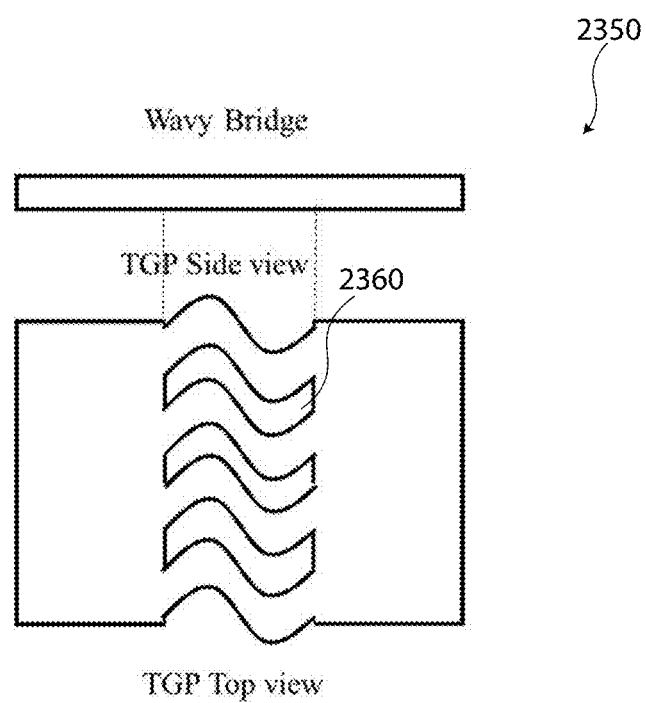

FIG. 23A illustrates a TGP structure 2300 with multiple mesh channels 2310 in the folding region and FIG. 23B illustrates a TGP structure 2350 with in-plane wavy arteries 2360 within the folding region. These structures, for example, include an increased length-to-width ratio of vapor transport channels. In some embodiments, it may be possible to reduce wrinkling in a TGP by decreasing the width in the middle folding region. These structures show folding regions composed of multiple mesh channels 2310 or multiple wavy channels 2360 which resist the initiation and propagation of wrinkles due to an increased aspect ratio, which is between the length and the width of a channel. The buckling load Aer for a rectangular plate with simply supported edges and compressed in x direction could be written as:

$$\lambda_{cr} = (\phi^2 + \phi^{-2} + 2)\left\{\frac{12\pi^2(1-\nu^2)}{Eb^2h^4}\right\}$$

where ϕ=a/b is the aspect ratio; v is the Poisons ratio; E is the Young's modulus; b is the length measured through the direction the load is applied (x direction); a is the width and h is the thickness. Based on this equation, the minimum buckling load corresponds to square (aspect ratio of equal to 1) and with decreasing or increasing the aspect ratio, the buckling load increases. The aspect ratio in a folding region without channels in typical TGP is equal to about 2 or ½ (e.g., about 20 mm long and about 10 mm wide) while the aspect ratio of multichip channels in the folding region is equal to about 4 or about ¼ for a folding region with length of about 20 mm and channel width of about 5 mm.

Figure 24A:
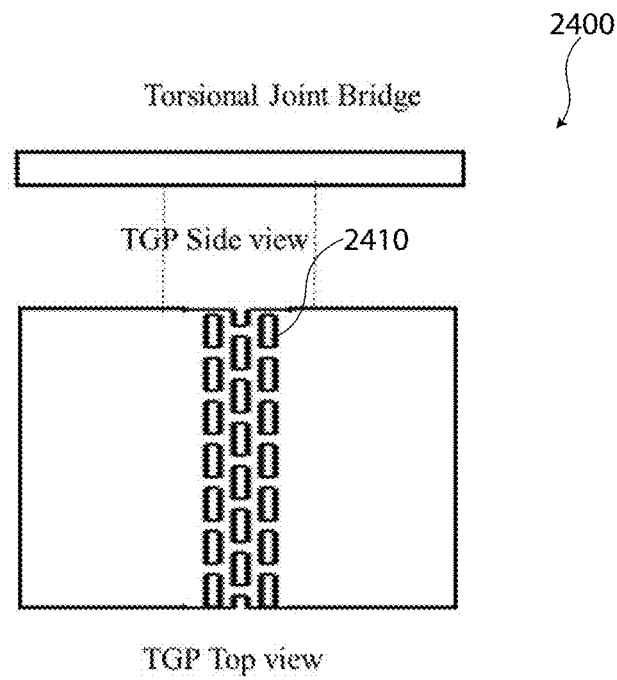
FIGS. 24A and 24B illustrates a TGP structure with a straight or wavy folding region according to some embodiments.
Figure 24B:
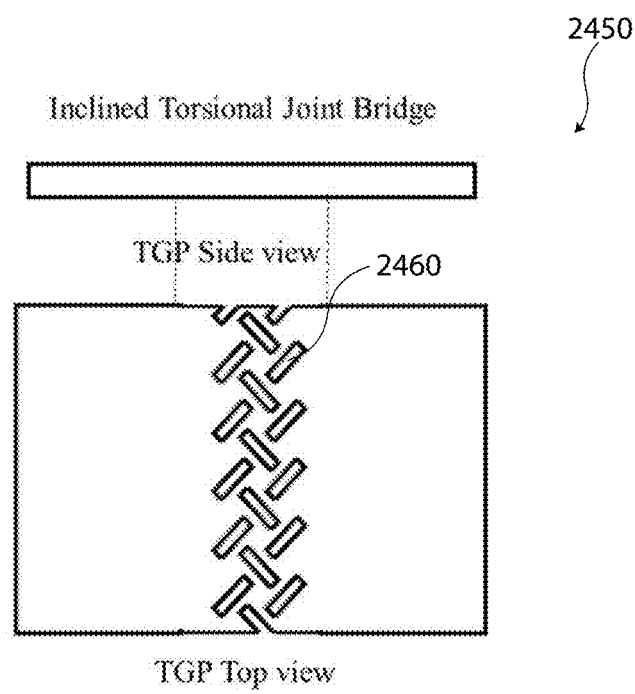

FIG. 24A illustrates internal TGP structure 2400 with a torsional folding region 2410 and FIG. 24B illustrates internal TGP structure 2450 with a torsional folding region 2460 according to some embodiments. These designs may be more resistant to wrinkles than straight structures (2310) or in-plane wavy structures (2360).

FIG. 25A is an illustration of a top portion an origami TGP structure and FIG. 25B is an illustration of a bottom portion of the origami TGP structure according to some embodiments. In some embodiments, an origami TGP may include a top wavy structure (see FIG. 25A) and a bottom origami structure (see FIG. 25B). The arrows shown in FIG. 25A and FIG. 25B show examples of vapor flow paths.

FIG. 25C is perspective view illustration of an origami TGP structure according to some embodiments. FIG. 25D is side view illustration of four cuts throughs of the origami TGP structure shown in FIG. 25C.

An origami structure, for example, may include a top portion and a bottom portion of a casing (either first casing or second casing) bent into waves along the folding direction. A wick may be bonded to the casing. The wick may include one or more mesh, an array of pillars, and/or a combination of mesh and an array of pillars. These waves, for example, may allow the casing to stretch. The bottom portion may not include wick or may include a thin wick. The bottom portion, for example, may be bent into peaks and valleys in both directions (perpendicular and parallel to the folding direction).

FIG. 25D shows sections, where the vapor flow path/direction is shown by arrows. In sections 1 and 4 of FIG. 25D there is no flow path. In section 2 there is a minor vapor flow direction/path. In section 4 there is a major flow path.

An origami structure, for example, a vapor flow path may not be supported by pillars or spaces or the like. Rather, the vapor flow path may be defined by shapes in the casing.

In some embodiments, the folding region 405 of the second casing 115 may include an origami structure, which may, for example, provide gaps for vapor transport without the use of pillars or other spacers. The liquid substrate can be a wavy structure since it is relatively thinner than the vapor substrate. The vapor can be transported along the gaps created by the origami structure. The space for the vapor transport may be defined by the origami structure, and the space varies in different cross-sections as shown in section 1, 2, 3 and 4. Such a variation may not be desirable for ideal vapor transport; however, a foldable TGP may be able to undergo elastic deformation while being folded with an origami structure.

Origami, which means paper folding, is a method for transforming the distribution of stress over the surface of an object upon undergoing large deformation. With a flat sheet being folded, usually, stress can be concentrated at a specific location leading to buckling or plastic deformation at that point. On the other hand, it is possible to use a wavy structure to facilitate folding. The wavy structure uses pillars or other spacers to maintain the gaps for vapor transport. The pillars and spacers may create stress concentrations during folding. Such a wavy structure can be replaced with an origami structure without pillars or spacers required. In an origami structure, stress may be distributed evenly over the surface of the structure and therefore, plastic deformation and buckling will not happen. The two layers of the origami TGP may be designed in a way that when they are bonded to each other some space is provided for vapor flow. For a copper structure, the strain may be limited to be less than 0.2%. The bending radius is determined by the pitch of the periodic pattern of the origami and wavy structures. A smaller pitch results in a smaller bending radius without plastic deformations.

An origami TGP structure may be fabricated by applying a 3D-printed fixtures to deform two copper sheets into the structures with the origami structure for vapor transport and the wavy structure for liquid transport. The periodic patterns of the origami structure and the wavy structure may be matched. In some embodiments, both vapor structure and liquid structure can be origami structures. An TGP with a herringbone tessellation or other origami pattern may have an out-of-plane pattern pressed into flat substrate, using a pressing template. In some embodiments, the peaks and troughs of the out-of-plane pattern may be rounded rather than folded, in order to avoid stress concentrations.

In some embodiments, the origami structure may follow a pattern of herringbone tessellation, in which a repeating array of parallelograms can reduce stress concentrations associated with right angles. Furthermore, when a TGP is bent, the sheet on the inner bending radius experience contraction along the axial direction, which is translated into expansion along the in-plane direction perpendicular due to Poisson ratio effects of the material. In some embodiments, an origami structure can create a meta-material effect which reduces the in-plane Passion ratio to a zero- or negative-valued number (i.e. contraction in the x-direction leads to no motion or contraction in the y-direction), and expansion is forced into the out-of-plane direction. In some embodiments, similar meta-material effects can be formed on the upper and/or lower casing by a bellows stack of 3-layers, in which the inner and outer layer in the stack have torsional joint cut into them, similar to FIG. 24A or FIG. 24B. The cuts to allow torsional joints, for example, may be offset from each other, and the middle layer forms a hermetic seal between the other two layers around the cuts. In such an embodiment, compression in the in-plane direction is transferred to expansion in the out-of-plane direction, without deformed structures or stress concentrations.

The hermetic seal to bond a top casing with a bottom casing may also affect the folding region's resistance to wrinkling when folded. Hermetic sealing in the folding region may lead to a reduction in thickness in the folding region because the two casings are bonded together without the space required for vapor and liquid transport. The top casing and the bottom casing may be diffusion bonded.

The bending stiffness may be defined as the elastic modulus times the cross sectional moment of inertia. The bending stiffness at the bonding region may be different than the bending stiffness at the non-bonding region.

Figure 26:
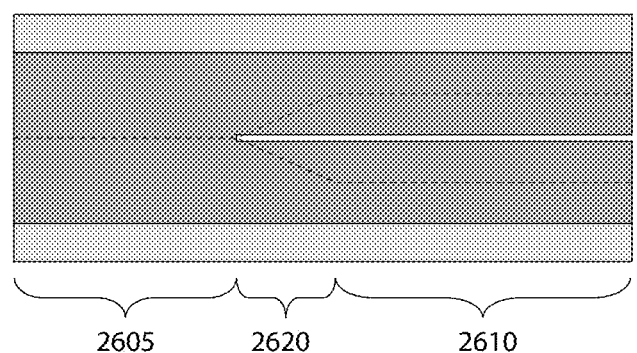
FIG. 26 is a top view of a TGP structure according to some embodiments.
Figure 27C:
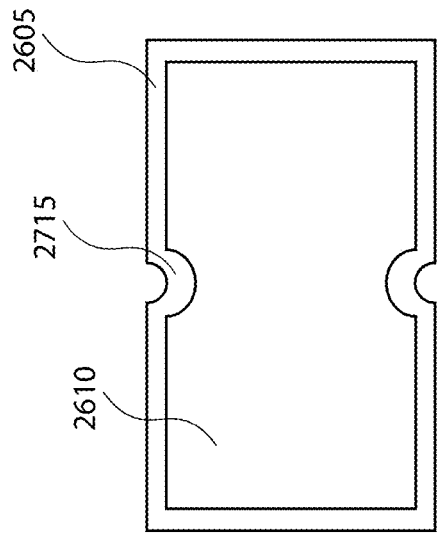
FIGS. 27A, 27B, and 27C illustrate a small semi-circular seal in the folding region of a portion of a TGP y according to some embodiments.
Figure 27B:
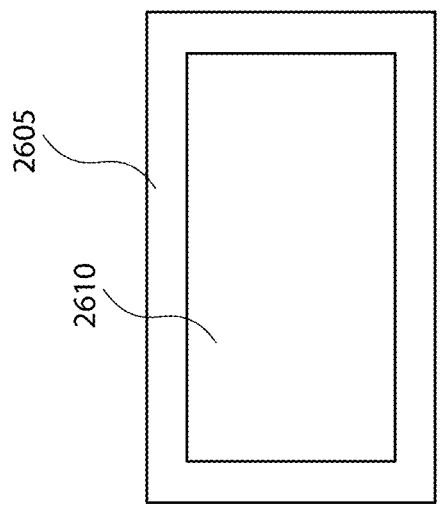
Figure 27A:
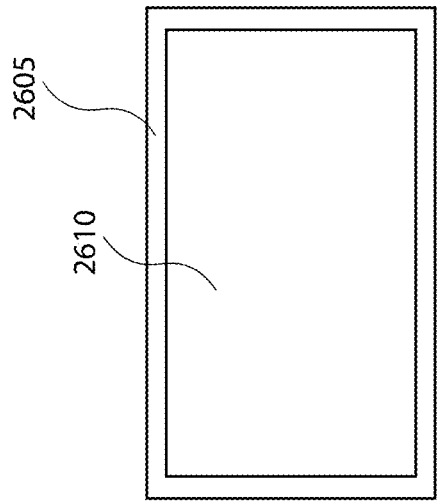

In some embodiments, the width and/or shape of the bonding region 2605 may be changed to adjust the bending stiffness difference between the bonding region 2605 and the active region 2610 as shown in FIGS. 27A and 27B. For example, as shown in FIG. 27C, a small semi-circular seal 2715 in the folding region of the casing can be used to enhance its foldability. In some embodiments, waves in the bond line or the edges of the folding region may be included. In some embodiments, a sharp transition of bending stiffness could be prevented with out-of-plane waves in the casing optimized for the mismatch in the stiffness. In some embodiments, the wave number (or frequency) used for the hermetic seal can be smaller than that of the waves in the casing adjacent to the active regions/layers (e.g., mesh, pillar, vapor layers, etc.). In another embodiment, the seal's wave number can be larger. In some embodiments, a gap region may be included between the sealed and the active regions/layers or change the direction of the waves in the transition region as shown in FIG. 26.

FIG. 26 shows the transition between a bonding region 2605 and the active region 2610.

FIG. 28 illustrates three different configurations of a TGP according to some embodiments. Also, the bond line 1610 of the bonding region between the first casing 110 and the second casing 115 may be selected carefully. A TGP can be assembled in such a way as to control the distance between the stress-free neutral axis of the TGP and the bond line of the TGP. Controlling this distance in conjunction with the bend direction of the TGP can lead to reduced wrinkling in the bending region. FIG. 28 illustrates how the bond line location can be changed by assembly methods. In each case, the dashed line represents the stress-free neutral axis of bending. FIG. 28A: bond line is on the stress-free neutral axis plane and bending will be the same regardless of bending direction. FIG. 28B: bond line is biased towards the top side of the TGP and TGP will have different bending characteristics based on the bending direction. Case C: bond line is biased towards the bottom of the TGP and the TGP will have different bending characteristics based on bending direction. This bias can either make the channel or vapor core more likely to collapse due to wrinkles. Depending on how the TGP will be bent, a different configuration can be selected.

In addition to foldable smartphones, the foldable TGP can be used for enhanced cooling for regular, non-foldable smartphones. The cooling capability of a smartphone is limited by its total surface area exposed for natural air convection and radiation. With a novel casing using a foldable TGP, the total surface area can be enhanced substantially.

Figure 29:
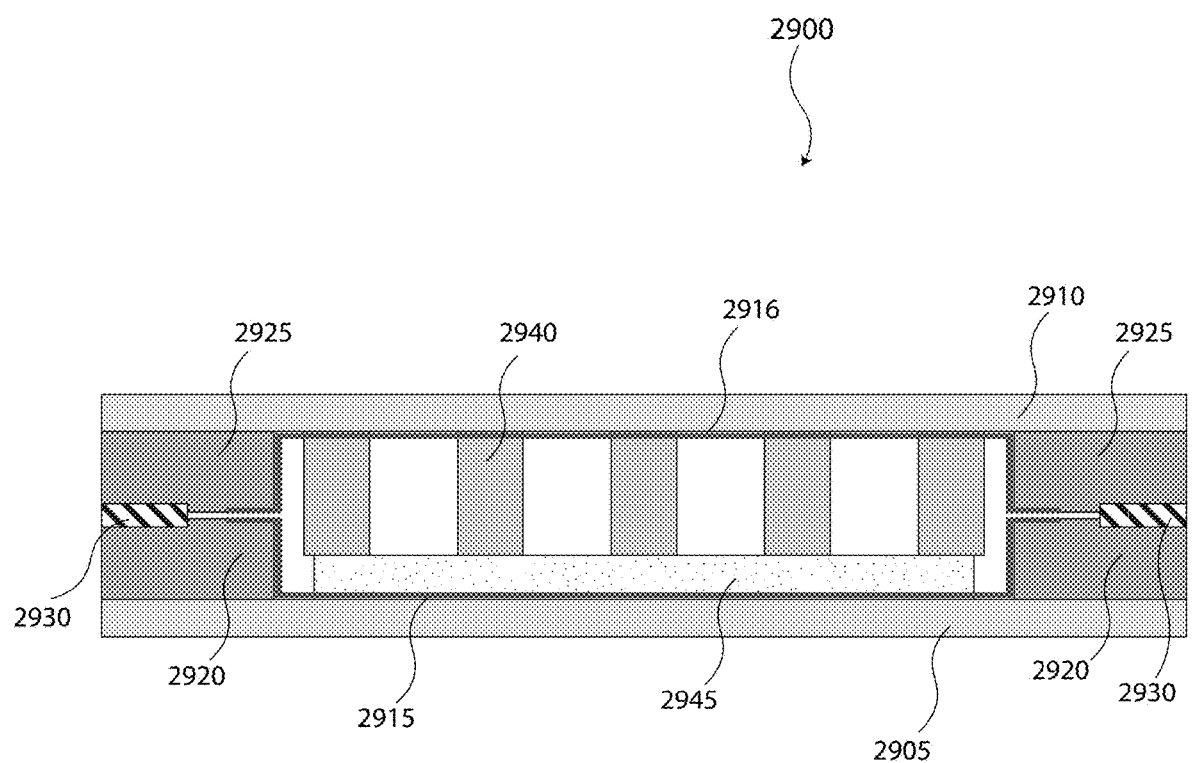
FIG. 29 is a side view illustration of a TGP structure with an ALD coating and a polymer base according to some embodiments.

FIG. 29 is a side view illustration of a TGP 2900 with metal on the outside according to some embodiments. The TGP 2900 includes a first casing 2910 and a second casing 2905. An internal layer of the first casing 2910, for example, may be coated with a ceramic film such as, for example, using atomic vapor deposition techniques. An internal layer of the second casing 2905, for example, may be coated with a ceramic film such as, for example, using atomic vapor deposition techniques. The first casing 2910 and/or the second casing 2905, for example, may comprise a polymer. The first casing 2910, for example, may be bonded with a top seam 2925 (e.g., a metal) that extends around the periphery of the first casing 2910.

The second casing 2905, for example, may be bonded with a bottom seam 2920, which may, for example, be metal, that extends around the periphery of the second casing 2905. The first casing 2910 may be bonded with a top seam 2925, which may, for example, be metal, and extends around the periphery of the first casing 2910. The top seam 2925 and the bottom seam 2920 may be bonded together using bond 2930.

The TGP 2900 may include a wick 2945 disposed on the second casing 2905. The TGP 2900 may also include an array of pillars 2940 disposed on the first casing 2910. The wick 2945, for example, may include a dielectric polymer. The array of pillars 2940, for example, may include a dielectric polymer. The wick 2945 and/or the array of pillars 2940 may be coated with a ceramic film such as, for example, using atomic vapor deposition techniques.

The coating 2915 or the ceramic film may include one or more of comprise aluminum oxide, silicon oxide, titanium oxide, etc. The coating 2915, for example, may coat all or portions of the interior structure of the TGP 2900 such as, for example, the metallic portions. The coating 2915, for example, may not coat the bottom seam 2920 or the top seam 2925 at the bond 2930. The first casing 2910 and/or the second casing 2905 may have a thickness measuring about 10, 25, 50, 75, 125 µs, etc. The coating 2915, for example, may have a thickness of about 10, 25, 50, 100 nm, etc.

the metallic peripheral regions, and/or may be selectively disposed such that it does not coat the metal in the bonding region, In some embodiments, the wick 2945 and/or the pillars 2940 can comprise a dielectric polymer, or dielectric ceramic.

Figure 30:
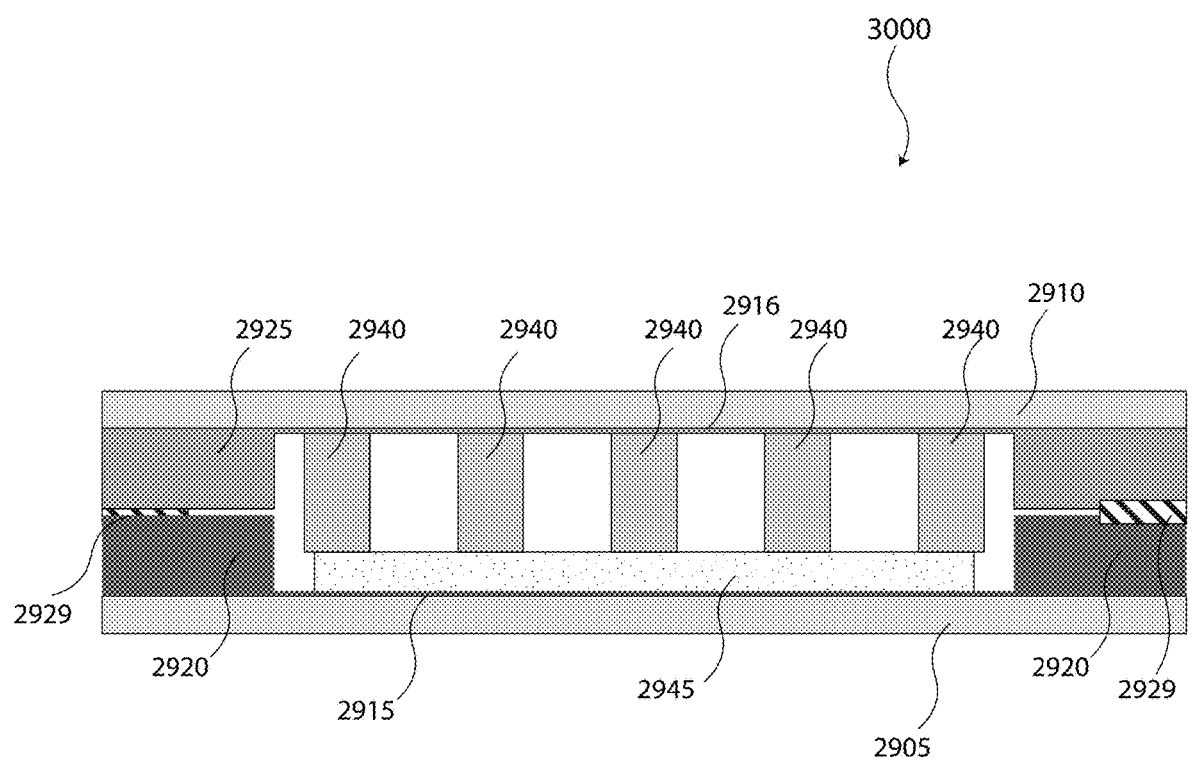
FIG. 30 is a side view illustration of a TGP structure made with ceramic such as glass on the outside.

In some embodiments, an ALD film may coat the metallic peripheral regions, and/or may be selectively disposed such that it does not coat the metal in the bonding region, and therefore allows intermetallic bonding, as shown in FIG. 30. In some embodiments, the ALD film can be deposited on the polymer substrate first, followed by metal deposition for the metallic peripheral. For a comprehensive hermetic seal without any gap, the hermetic ALD film and the hermetic metallic layer must have an overlapped region.

In some embodiments, the vapor pillars and/or liquid wick may be formed by hot-embossing or cold-rolling a layer of polymer which is separate from the casing. In some embodiments, internal structures including vapor pillars and/or wicking structures may be formed by photo definable polymer, and/or patterned by lithography. In some embodiments, the structures may be formed by screen-printing a liquid or softened prepolymer through a template, followed by curing. In some embodiments, the wick may include woven or non-woven polymer mesh. In some embodiments, the material for the liquid wick, vapor support structures, or casing may be a polymer such as, for example, PEN, PET, Nylon polyester, FEP, PTFE, PEEK, PSU, PPSU, SU-8 epoxy, thermoplastic polyimide, PBO, or polyimide.

FIG. 30 is a sideview illustration of a TGP 3000 made with inorganic materials such as ceramics or glass on the outside. An internal surface of the first casing 2910 and/or the second casing 2905, for example, may include a coating 2915 and coating 2916 respectively such as, for example, ALD, MLD, or CVD coatings. The coating 2915 and/or the coating 2916, for example, may include a ceramic or a glass. The first casing 2910 and/or the second casing 2905, for example, may comprise a polymer. Metal 2929 may be bonded to the glass along the perimeter and can be used for metallic bonding to seal the layers of TGP together. A low temperature metallic bonding may allow for the glass to remain flexible. The wick 2945 and/or the pillars 2940, for example, may be formed by ceramic, or polymer coated by ceramic through ALD, CVD, sol-gel, etc. A flexible ceramic or flexible glass, for example, may not include metal along the perimeter, but rather the perimeter may be bonded through the ceramics or glass, such as through direct oxide bonding, glass frit bonding, nanoparticle fusing, or welding which only applies heat locally along the bonding region and allows the remainder of the TGP to maintain low temperature or combinations of multiple bonding steps. Such welding method may include laser welding, seam welding, etc.

Figure 31A:
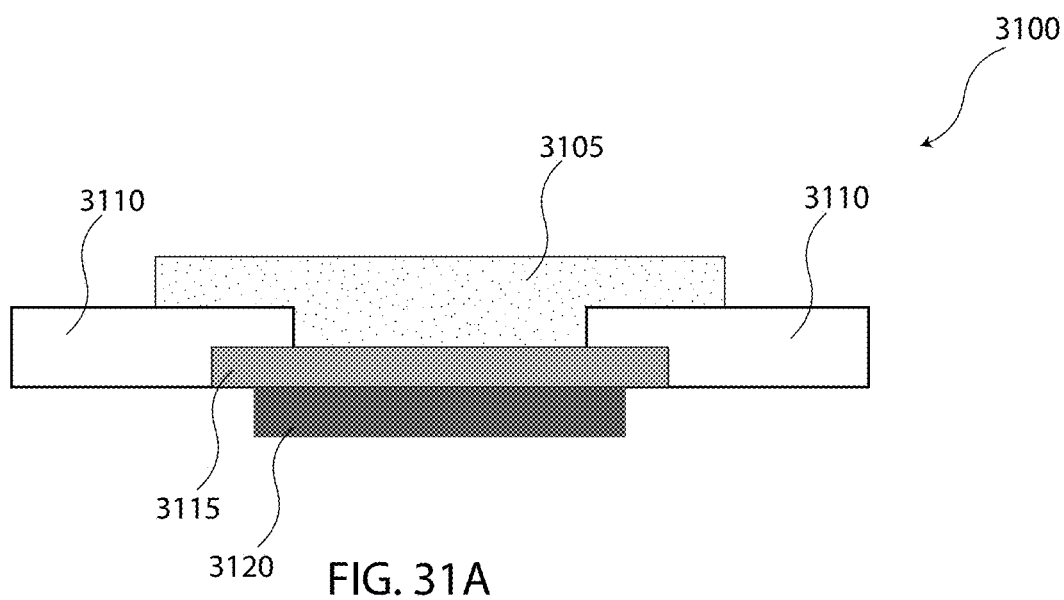
FIGS. 31A, 31B, 31C, and 31D are side view illustrations

FIG. 31A is a side view illustration of internal structures of a TGP 3100 according to some embodiments. TGP 3100, for example, may include a casing having a high heat conduction section 3115 and a low heat conduction section 3110, and a wick 3105. The high heat conduction section 3115 may be located near a heat source 3120. The high heat conduction section 3115, for example, may comprise a ceramic such as, for example, an alumina ($Al_2O$) ceramic. The high heat conduction section 3115, for example, may have a higher thermal conductivity (or substantially higher thermal conductivity) than the low heat conduction section 3110. The high heat conduction section 3115, for example, may be coated in polymer. The high heat conduction section 3115, for example, may comprise a ceramic with a planar polymer mesh with the ceramic protruding through the pores of the planar polymer mesh through thermal vias. The high heat conduction section 3115, for example, may be embedded with particles of diamond.

Figure 31B:
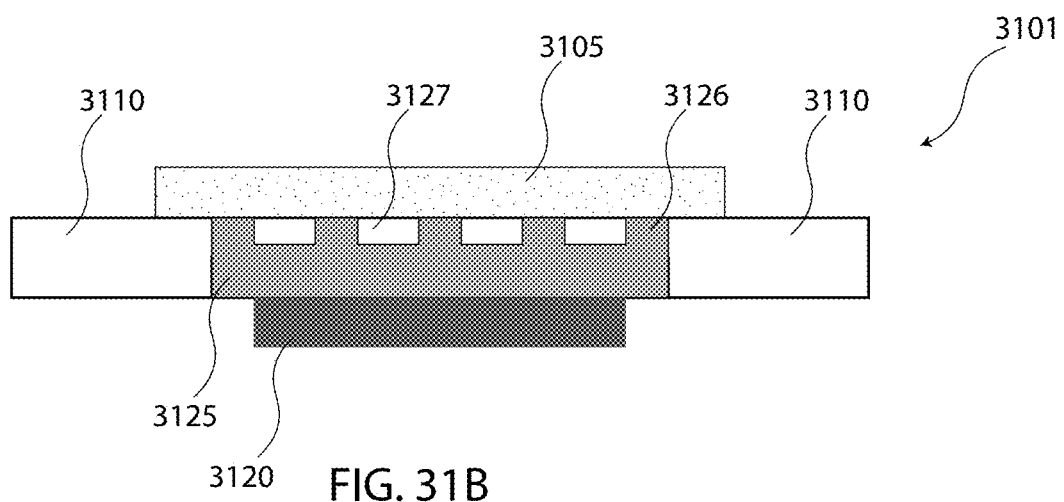

The low heat conduction section 3110, for example, may comprise a liquid crystal polymer, an MT+ series polyimide, and/or a diamond powder-embedded resin FIG. 31B is a side view illustration of internal structures of a TGP 3101 with a high heat conduction section 3125 according to some embodiments. The TGP 3101, for example, may include a casing having a high heat conduction section 3125 and a low heat conduction section 3110. The high heat conduction section 3125, for example, may comprise a ceramic such as, for example, an alumina ($Al_2O$) ceramic. The high heat conduction section 3125, for example, may include internal support structures 3126, for example, that may or may not extend through portions of low heat conduction section 3110. The internal support structures 3126, for example, may include the same material as the 3125. The internal support structures 3126, for example, may include a polymer layer on the internal side of the internal support structures 3126. The internal support structures 3126 may extend upward through the low heat conduction section 3110.

The TGP 3101, for example, may have a casing that includes a polymer and/or have metallic thermal vias. The size and spacing of the thermal vias, for example, may be selected to allow RF or microwave signals through the TGP casing, as shown in FIG. 32B. In some embodiments, the alumina structure can be replaced with other ceramic or glass structures, such as AlN, SiC, etc.

Figure 31C:
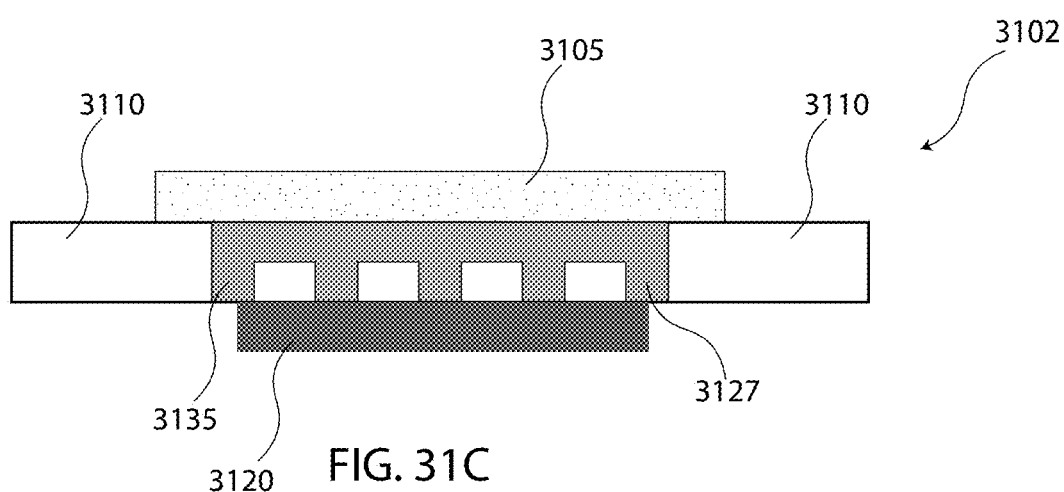

FIG. 31C is a side view illustration of internal structures of a TGP 3102 according to some embodiments. The TGP 3102, for example, may include a casing having a high heat conduction section 3135 and a low heat conduction section 3110. The TGP 3102, for example, may include an internal support structures 3127. The high heat conduction section 3135 may be similar to high heat conduction section 3125 but flipped so the internal support structures 3127 extend downward through the low heat conduction section 3110.

Figure 31D:
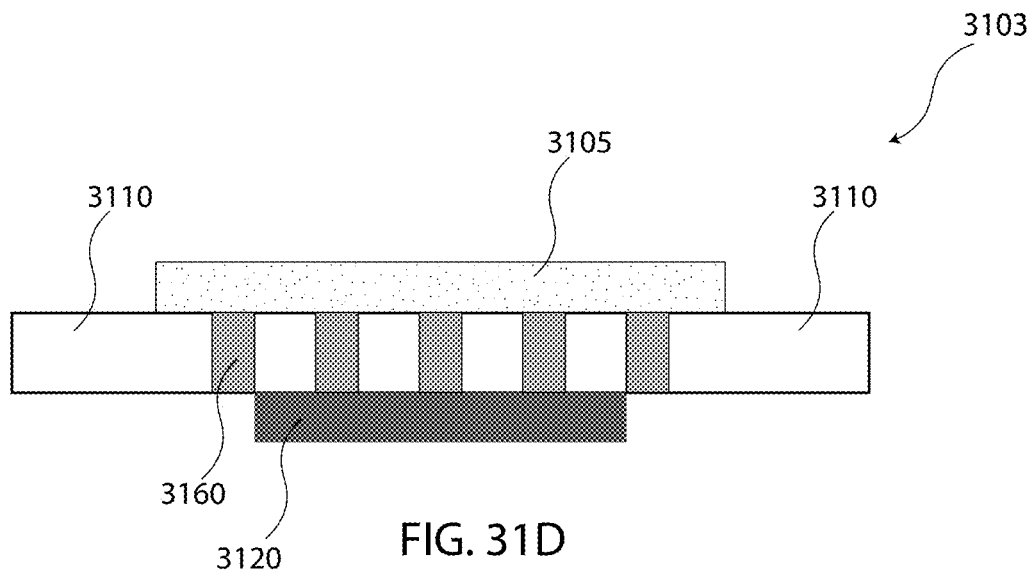

FIG. 31D is a side view illustration of internal structures of a TGP 3103 according to some embodiments. The TGP 3104, for example, may include a casing having a high heat conduction vias 3160 (or thermal vias) and a low heat conduction section 3110. The TGP 3103, for example, may include a wick 3105 disposed on a portion of the low heat conduction section 3110 and/or a majority or all of the high heat conduction vias 3160.

Figure 31E:
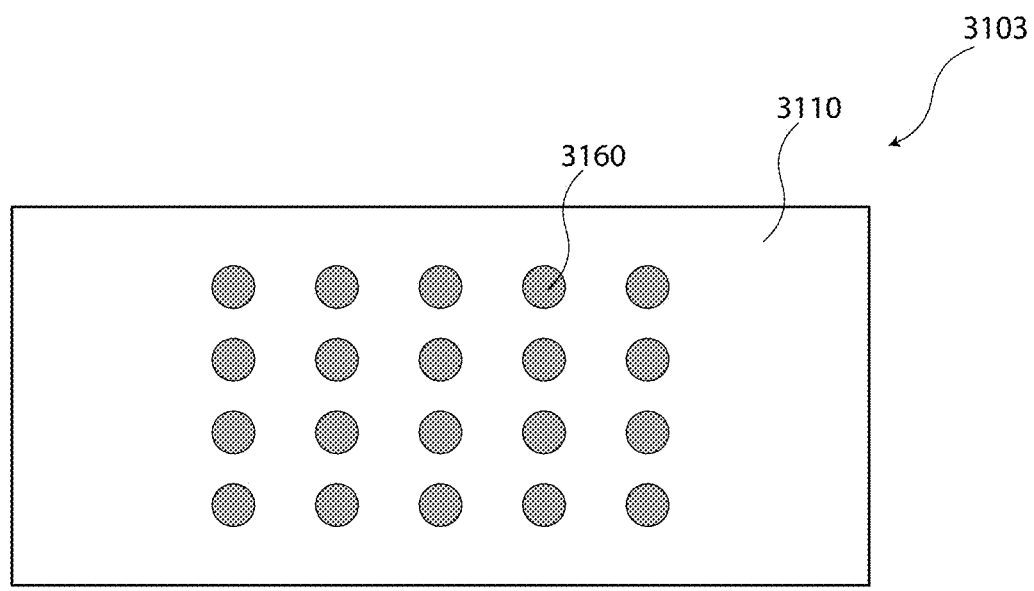
FIG. 31E is a top view illustration of an internal structure of a TGP according to some embodiments.

The high heat conduction vias 3160, for example, may be located in the region of the substrate near the heat source 3120. The high heat conduction vias 3160, for example, may include feedthroughs or vias that extend from the heat source 3120 to the wick through the low heat conduction section 3110. The high heat conduction vias 3160, for example, may include copper or any other metallic vias. The high heat conduction vias 3160, for example, may include alumina. FIG. 31E is a top view of the TGP 3103.

In some embodiments, the vapor and liquid transport structures shown in FIGS. 30 and 31 may include a ceramic, glass or other hermetic but RF transparent materials.

Figure 32A:
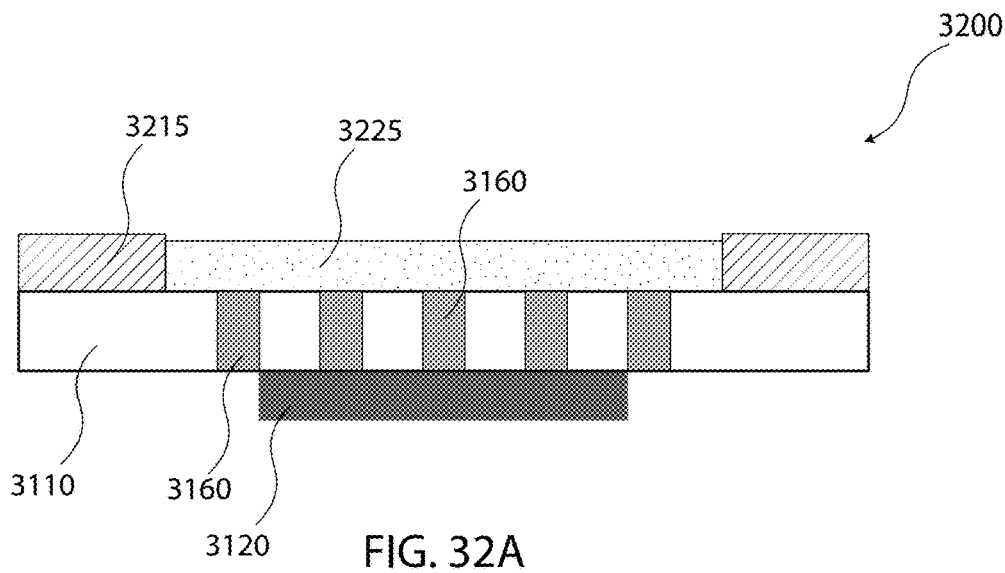
FIGS. 32A, 32B, and 32C are side view illustrations of an internal structure of a TGP according to some embodiments.
Figure 32B:
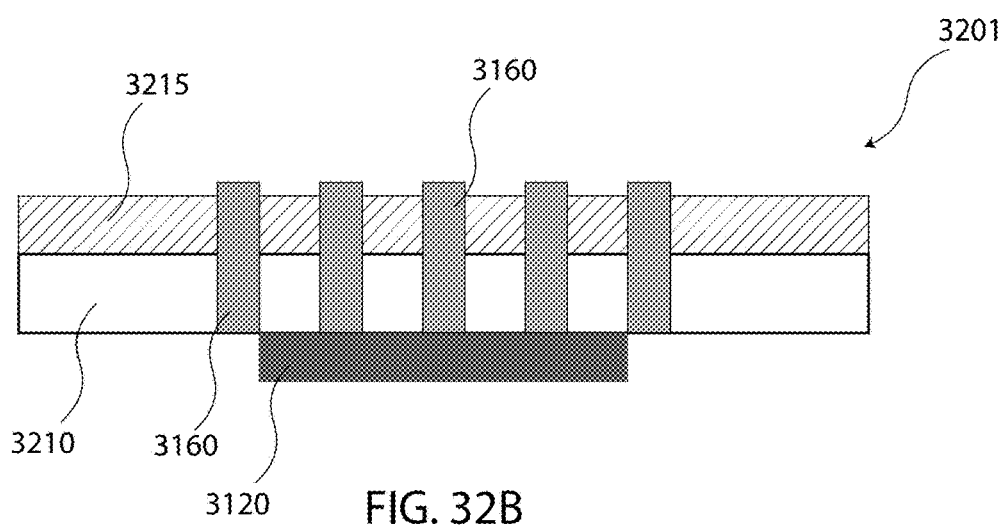

FIG. 32A is a side view illustration of internal structures of a TGP 3200 according to some embodiments. The TGP 3200, for example, may include a substrate having a high heat conduction section 3115 and a low heat conduction section 3110. The TGP 3200, for example, may include a wick with a portion of the polymer wick 3215 and a ceramic particle wick portion 3225. The ceramic particle wick portion 3225, for example, may be disposed on or near the plurality of thermal feedback vias. The ceramic particle wick portion 3225, for example, may be disposed at the evaporator. The ceramic particle wick portion 3225, for example, may be disposed near the heat source 3120. The ceramic particle wick portion 3225, for example, may comprise a polymer with a plurality of ceramic particles embedded within the polymer.

FIG. 32B is a side view illustration of internal structures of a TGP 3201 according to some embodiments. The TGP 3201, for example, may include a substrate 3210. The TGP 3201, for example, may include a polymer wick 3215 disposed on the substrate 3210. The plurality of high heat conduction vias 3160, for example, may extend through the substrate 3210 and/or the polymer wick 3215.

Figure 32C:
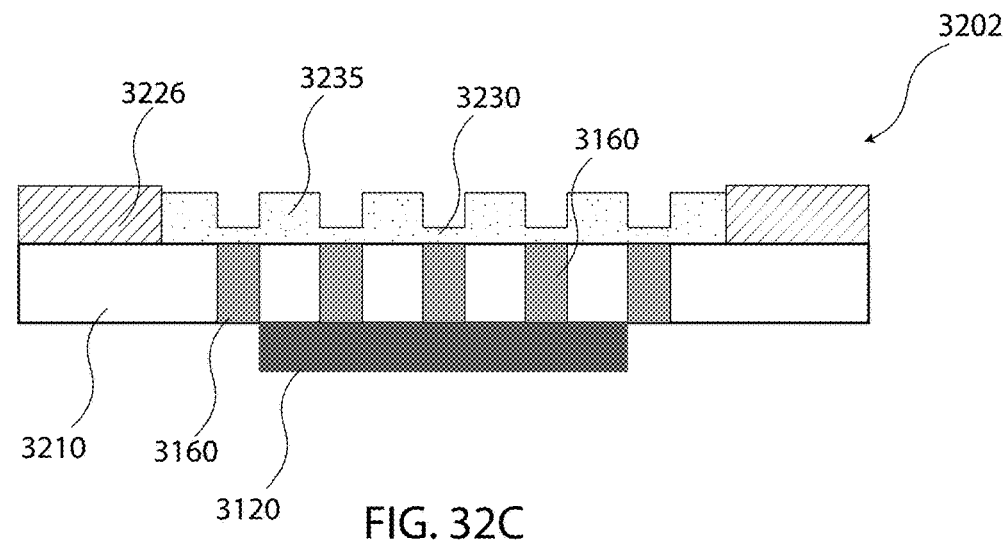

FIG. 32C is a side view illustration of internal structures of a TGP 3202 according to some embodiments. The TGP 3202, for example, may include a substrate 3210. The TGP 3202, for example, may include a polymer wick 3226 disposed on the substrate 3210 in areas other than at or near the heat source 3120. The TGP 3202, for example, may include thin wick regions 3230 and thick wick regions 3235. The thin wick regions 3230, for example, may be located at or near the high heat conduction vias 3160. The thickness of the wick in the thin wick regions 3230 may be about 25%, 20%, 15%, 10%, 5% the thickness of the wick in the thick wick regions 3235. The thin wick regions 3230, for example, may include sintered particles of glass, ceramic, or polymer.

Figure 33A:
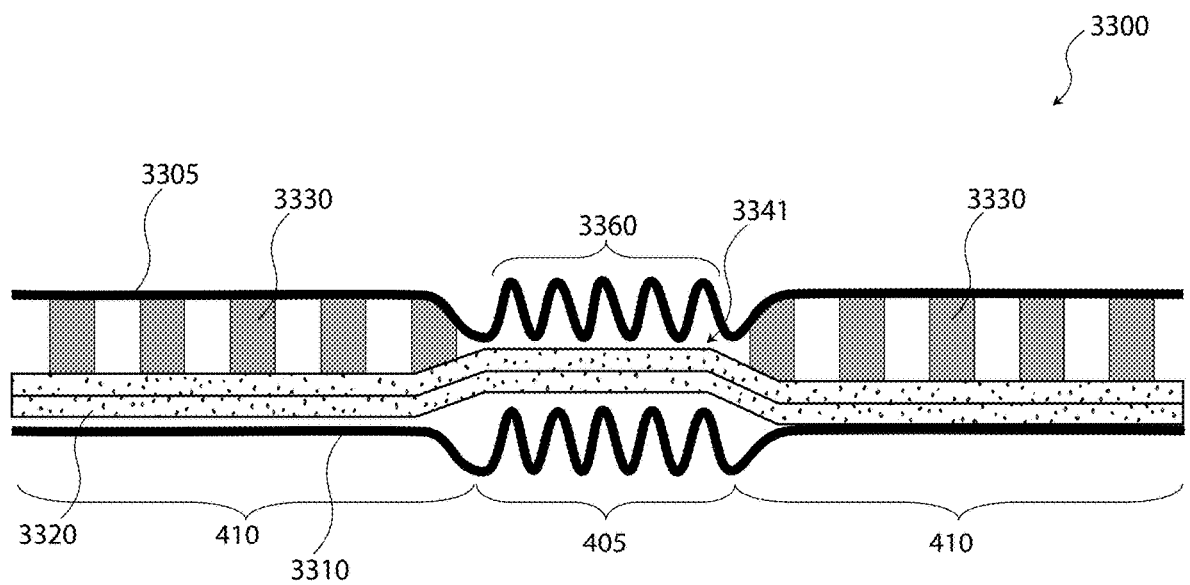
FIGS. 33A, 33B, 33C, 33D, 33E, and 33F are various illustrations of an internal structure of a TGP according to some embodiments.
Figure 33B:
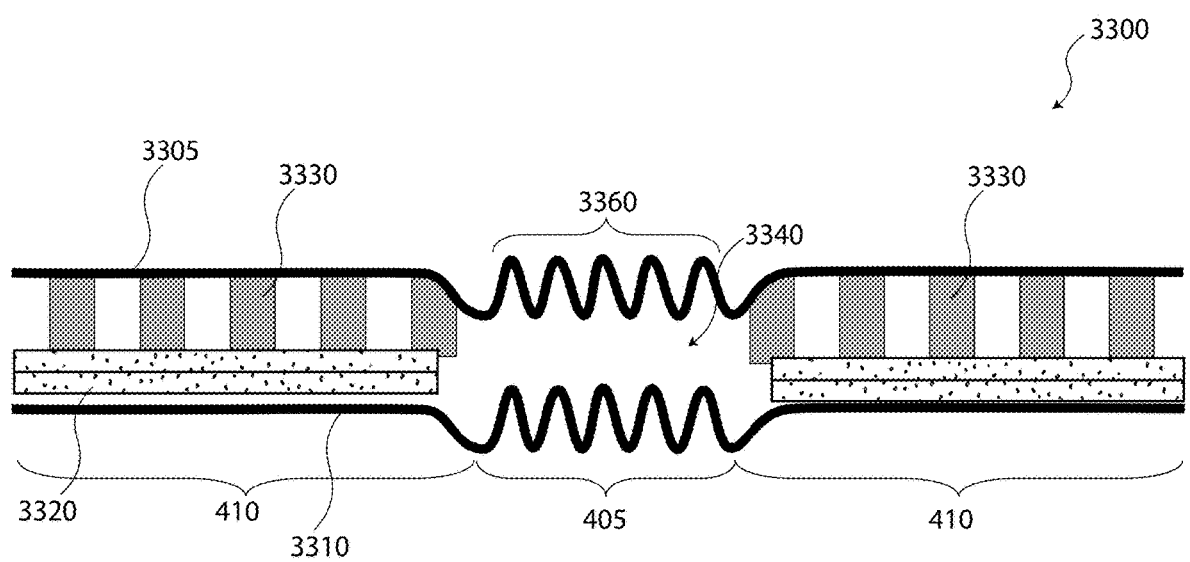
Figure 33C:
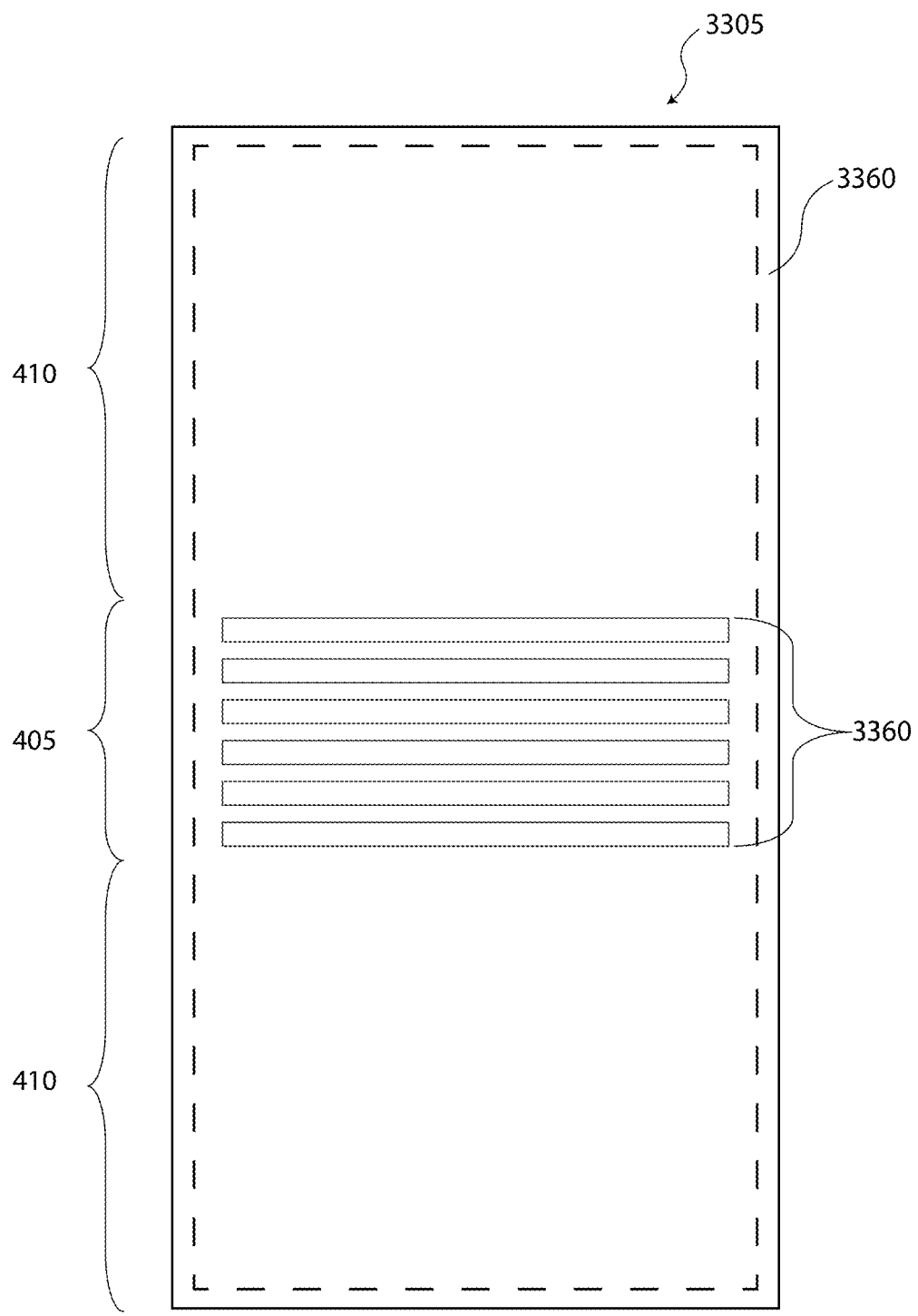
Figure 33D:
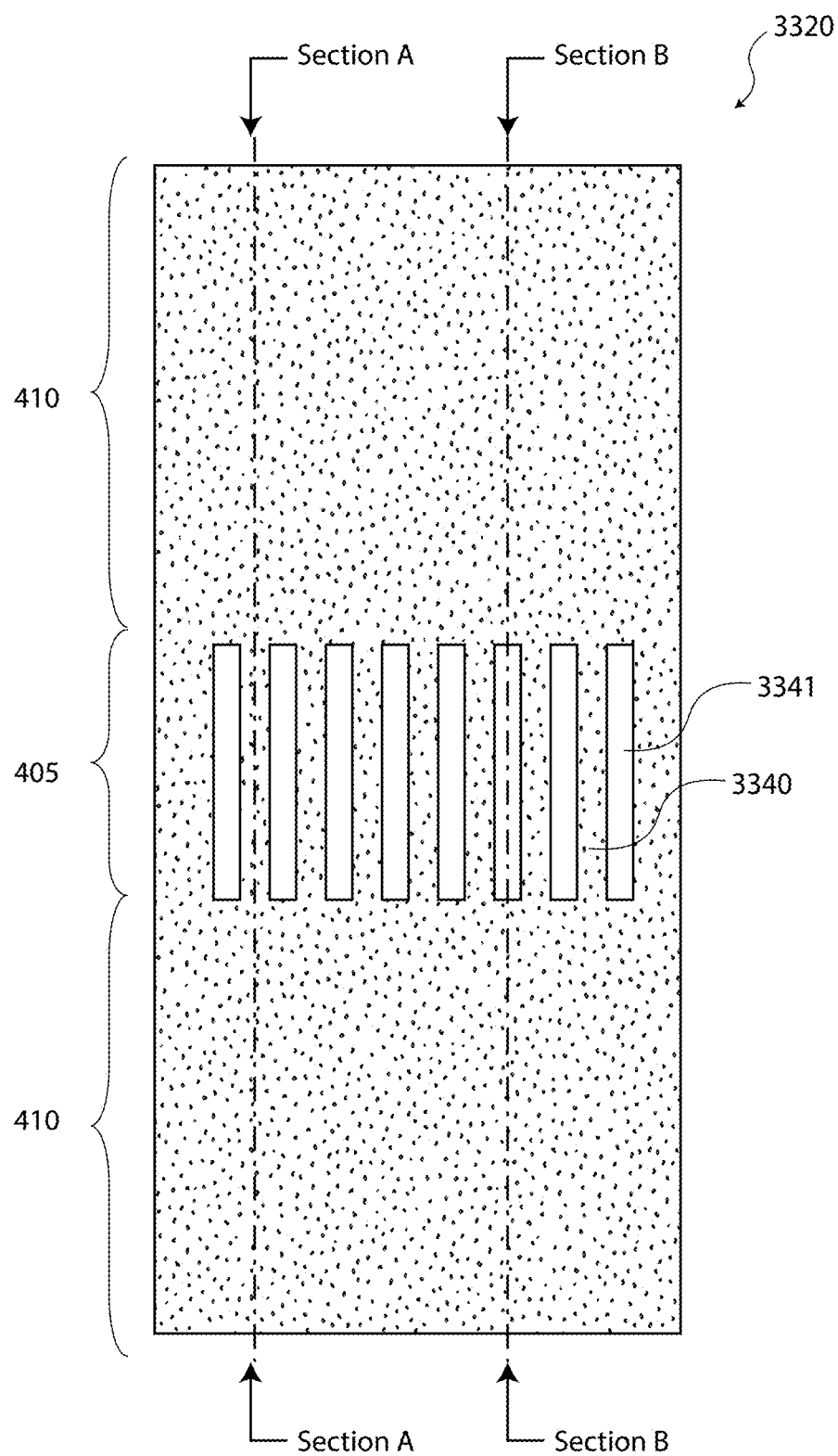
Figure 33E:
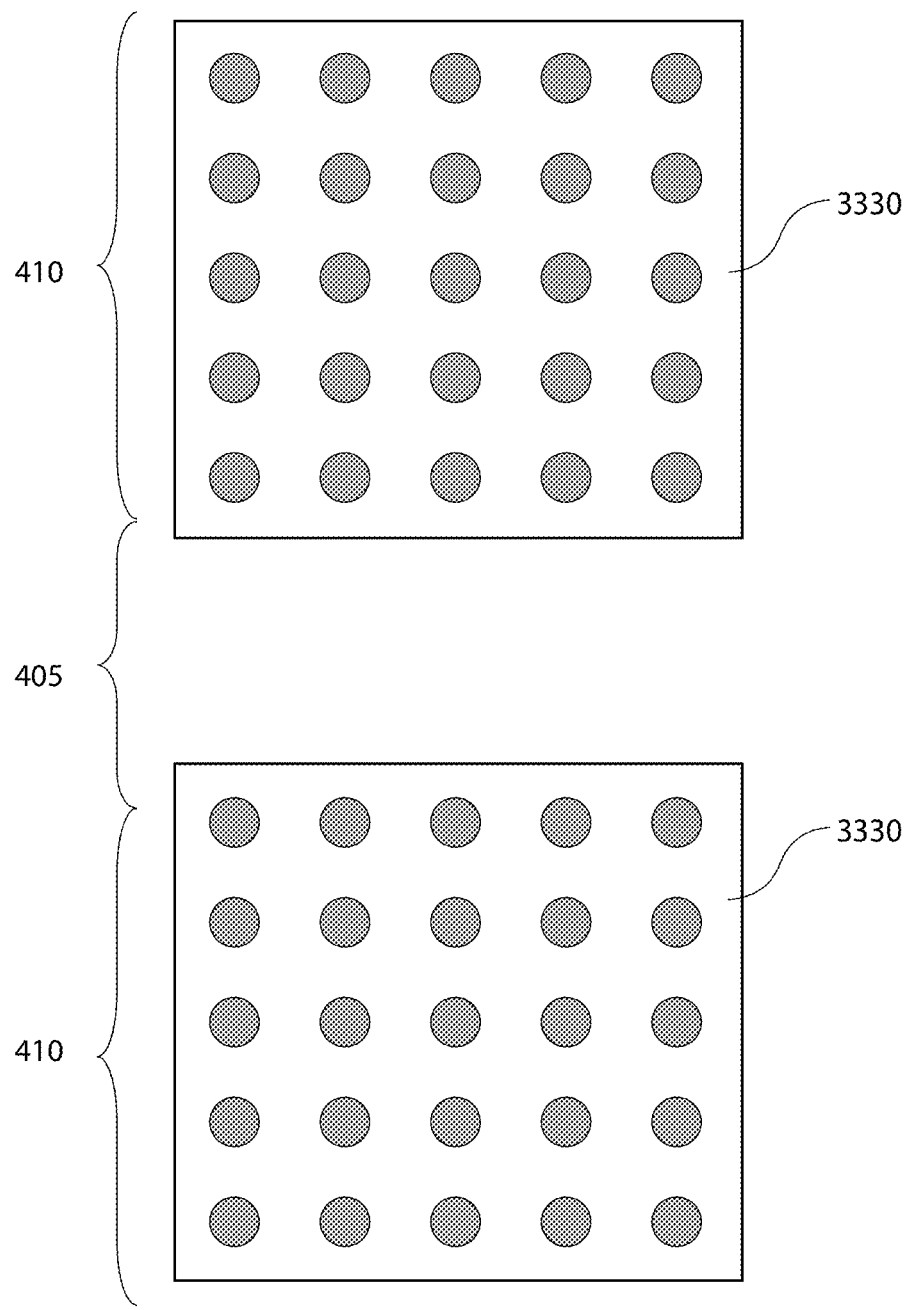

FIG. 33A and FIG. 33B are side view illustrations of internal structures of a TGP 3300 according to some embodiments. TGP 3300 includes a first casing 3305, a second casing 3310, a mesh 3320, and a vapor structure 3330. FIG. 33C is a top view of first casing 3305. The second casing 3310 may be similar to first casing 3305. FIG. 33D is a top view of mesh 3320. And FIG. 33E is a top view of the vapor structure 3330. The sideview of TGP 3300 shown in FIG. 33A shows Section A of FIG. 33D and the sideview of TGP 3300 shown in FIG. 33B shows Section B of FIG. 33D The TGP 3300 includes a folding region 405 and one or more non-folding region(s) 410. The first casing 3305 and/or the second casing 3310, for example, may include an out-of-plane wavy structure in the folding region 3360 within the folding region 405 such that the peaks and valleys of the wavy structure extend across a width of the TGP 3300. The vapor structures 3330, for example, may be disposed in the non-folding region 410 and/or not disposed in the folding region 405. FIG. 33A and FIG. 33B show the absence of vapor structures within the folding region 405.

The vapor structures 3330, for example, may comprise an array of pillars, spacers, mesh structures, or other structures that allow for vapor to flow between the mesh 3320 and the first casing 3305. The vapor structures 3330, for example, may comprise deformed mesh. The vapor structures 3330, for example, may include an array of pillars. The vapor structures 3330, for example, may include one vapor support structure that extends into the folding region 405 and/or over one or more arteries 3341 as shown in FIG. 33B.

Alternatively or additionally, the vapor structures 3330, for example, may extend into the folding region 3360. The vapor structures 3330, for example, may be disposed on a substrate may or may not be the same as first casing 3305. The vapor structures 3330, for example, may be disposed on a substrate that has a wavy structure such as, for example, out-of-plane wavy structure or an in-plane wavy structure. The mesh 3320 may include a plurality of arteries 3341 cut from the mesh 3320 within at least the folding region 405 and/or extending partially within the non-folding region 410. The plurality of arteries 3341, for example, may be defined at least by non-removed portions 3340 of the mesh 3320. Each of the plurality of arteries 3341, for example, may be about 0.5-3.0 mm wide (e.g., 1 mm wide) and/or about 10-50 mm long. The plurality of arteries 3341 may be arranged in a parallel array across the mesh 3320. The mesh 3320, for example, may comprise two or more layers of mesh sealed together such as, for example, with diffusion bonding.

Figure 33F:
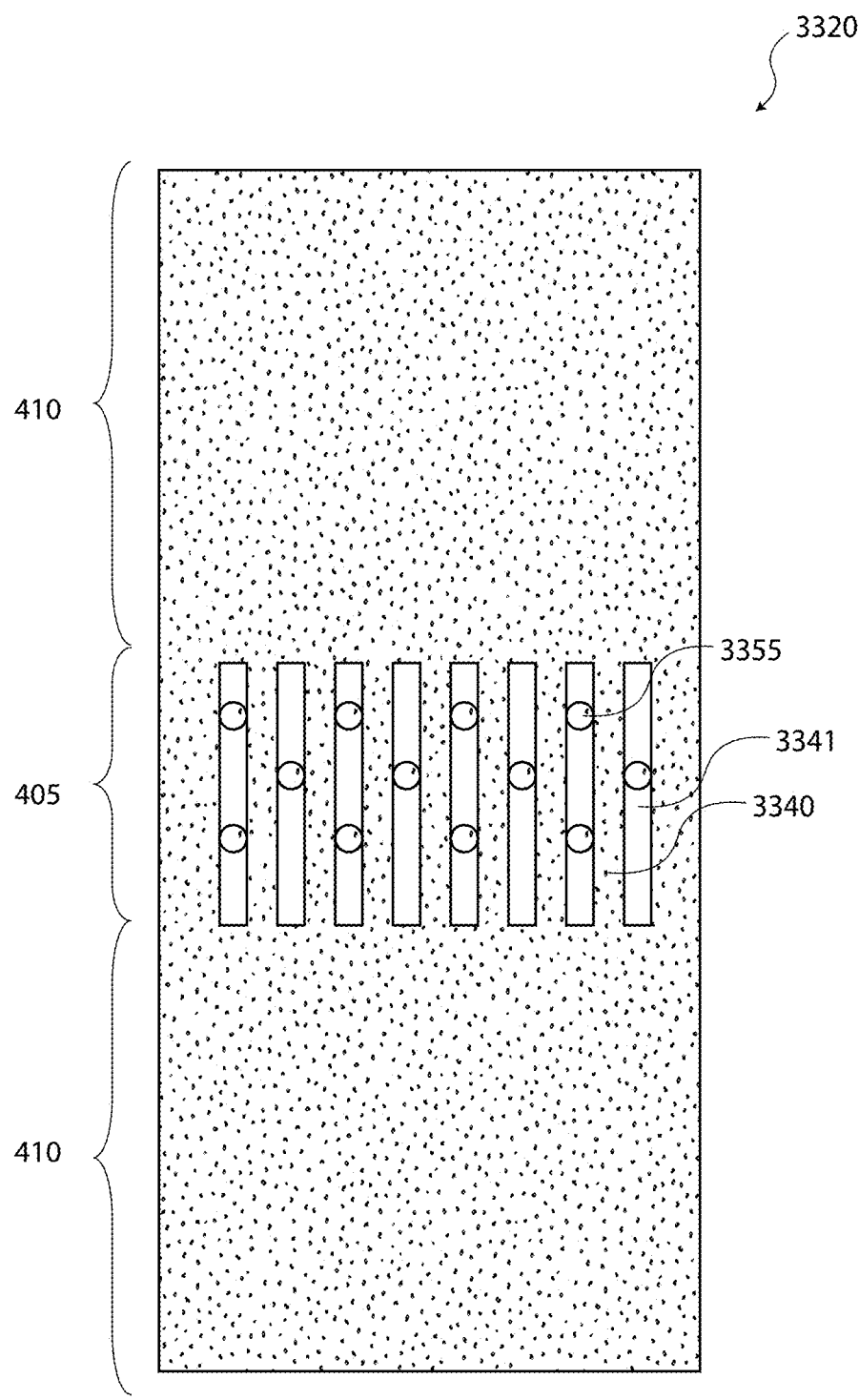

The arteries 3341, for example, may include mesh obstructions 3355 that restrict vapor flow through the arteries as shown in FIG. 33F. These mesh obstructions 3355 may be offset in relative to one another in adjacent arteries 3341. The mesh obstructions 3355, for example, may keep the arteries 3341 from moving within the TGP 3300 and/or may encourage a zig zag flow of vapor through the plurality of arteries. The mesh obstructions 3355, for example, may be part of the mesh 3320. The mesh obstructions 3355, for example, may be left in the mesh 3320 after the arteries are cut from the mesh 3320.

The mesh 3320, for example, may have an in-plane wavy structure and/or may have a zig-zag shape.

The mesh 3320, for example, may comprise two or more layers of woven mesh sealed together such as, for example, with diffusion bonding.

The mesh 3320, for example, may be bonded to some portions of the second casing 3310 (e.g., the evaporator region or near a hot region) but not bonded to other portions of the second casing 3310 (e.g., the condenser region). The mesh 3320, for example, may not be bonded with the second casing 3310 or the first casing 3305 within the folding region 405. The mesh 3320, for example, may comprise a copper or a stainless steel mesh. The mesh 3320, for example, may comprise a copper alloy with phosphorus.

The second casing 3310 and/or the first casing 3305, for example, may comprise copper and/or polyimide such as, for example, layers of copper, polyimide and copper. In the folding region, for example, the outer copper layer on either or both the second casing 3310 and/or the first casing 3305 may be removed.

In some embodiments, the wick in the region of evaporation may include high thermal conductivity pillars including those of ceramic or metal, which may be bonded to a mesh. In some embodiments, the mesh may be a high thermal conductivity ceramic such as alumina; in other embodiments, the mesh may be a thin layer of polymer, with a low thickness that does not provide a substantial thermal resistance.

The drawings are not drawn to proportion or scale.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Embodiments of the methods disclosed may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A thermal ground plane comprising:
    a first casing comprising:
        a first bonding region extending around a periphery of the first casing;
        a first non-folding region overlapping portions of the first bonding region;
        a first folding region overlapping portions of the first bonding region and portions of the first non-folding region; and
    a second casing comprising:
        a second bonding region extending around a periphery of the second casing;
        a second non-folding overlapping portions of the second bonding region;
        a second folding region overlapping portions of the second bonding region and portions of the second non-folding region; and
        wherein the first casing and the second casing are sealed together at the first bonding region and the second bonding region, and the first folding region and the second folding region are substantially aligned; and
    a vapor structure disposed on at least a portion of the interior surface of the first casing within the first non-folding region; and a liquid structure comprising a mesh and a plurality of arteries, the plurality of arteries are formed within the mesh extending substantially parallel with a length of the thermal ground plane and extending substantially through the second folding region;

wherein at least a subset of the plurality of arteries has a length that is longer than the length of the first folding region measured parallel with the length of the thermal ground plane.

2. The thermal ground plane according to claim 1, wherein the mesh layer is not bonded with the second casing within the second folding region; and the mesh is bonded within the second casing within the second non-folding region.

3. The thermal ground plane according to claim 1, wherein the vapor structure comprises a plurality of pillars.

4. The thermal ground plane according to claim 1, wherein the first folding region comprises a first out-of-plane wavy structure; and the second folding region comprises a second out-of-plane wavy structure.

5. The thermal ground plane according to claim 1, wherein either or both the second non-folding region and the first non-folding region has a substantially planar shape.

6. The thermal ground plane according to claim 1, wherein the vapor structure is disposed on an interior surface of the first casing in the first non-folding region, and the vapor structure is not disposed within the first folding region.

7. The thermal ground plane according to claim 1, wherein each of the plurality of arteries extends substantially perpendicular relative to a folding line within the second folding region.

8. The thermal ground plane according to claim 1, wherein the mesh comprises at least one of the following selected from the group consisting of woven copper, woven stainless steel, non-woven copper, non-woven stainless steel, ceramic-coated polymer, and metal-coated polymer.

9. The thermal ground plane according to claim 1, wherein either or both the first casing and the second casing comprise a laminate of copper and polymer.

10. The thermal ground plane according to claim 1, wherein the mesh comprises two layers of woven material bonded together.

11. The thermal ground plane according to claim 1, wherein the mesh comprises a copper mesh or a stainless steel mesh.

12. A thermal ground plane comprising:
a first casing comprising:
a first bonding region extending around a periphery of the first casing;
a first non-folding region overlapping portions of the first bonding region;
a first folding region overlapping portions of the first bonding region and portions of the first non-folding region; and
a second casing comprising:
a second bonding region extending around a periphery of the second casing;
a second non-folding overlapping portions of the second bonding region;
a second folding region overlapping portions of the second bonding region and portions of the second non-folding region; and
wherein the first casing and the second casing are sealed together at the first bonding region and the second bonding region, and the first folding region and the second folding region are substantially aligned; and
a vapor structure disposed on an interior surface of the first casing in the first non-folding region and the vapor structure is not disposed on an interior surface of the first casing within the first folding region; and
a liquid structure comprising a mesh and a plurality of arteries, the plurality of arteries are formed within the mesh extending substantially parallel with a length of the thermal ground plane and extending substantially through the second folding region;
wherein at least a subset of the plurality of arteries has a length that is longer than the length of the first folding region measured parallel with the length of the thermal ground plane.

13. The thermal ground plane according to claim 12, wherein the first folding region comprises a first out-of-plane wavy structure; and the second folding region comprises a second out-of-plane wavy structure.

14. A thermal ground plane comprising:
a first casing comprising:
a first bonding region extending around a periphery of the first casing;
a first non-folding region overlapping portions of the first bonding region;
a first folding region overlapping portions of the first bonding region and portions of the first non-folding region; and
a second casing comprising:
a second bonding region extending around a periphery of the second casing;
a second non-folding overlapping portions of the second bonding region;
a second folding region overlapping portions of the second bonding region and portions of the second non-folding folding region; and
wherein the first casing and the second casing are sealed together at the first bonding region and the second bonding region, and the first folding region and the second folding region are substantially aligned; and
a vapor structure disposed on at least a portion of the interior surface within the first non-folding region of the first casing; and
a liquid structure comprising a mesh and a plurality of arteries, the plurality of arteries are formed within the mesh extending substantially parallel with a length of the thermal ground plane and perpendicular relative to a folding line within the folding region, and extending substantially through the second folding region;
wherein at least a subset of the plurality of arteries has a length that is longer than the length of the first folding region measured parallel with the length of the thermal ground plane.

15. The thermal ground plane according to claim 14, wherein the vapor structure comprises a plurality of pillars.

16. A thermal ground plane comprising:
a first casing comprising:
a first bonding region extending around a periphery of the first casing;
a first non-folding region overlapping portions of the first bonding region;
a first folding region overlapping portions of the first bonding region and portions of the first non-folding; and a second casing comprising:
  a second bonding region extending around a periphery of the second casing;
  a second non-folding overlapping portions of the second bonding region;
  a second folding region overlapping portions of the second bonding region and portions of the second non-folding region; and
  wherein the first casing and the second casing are sealed together at the first bonding region and the second bonding region, and the first folding region and the second folding region are substantially aligned; and
a vapor structure comprising a plurality of pillars disposed on at least a portion of the interior surface of the first non-folding region of the first casing; and
a liquid structure comprising a mesh and a plurality of arteries formed within the mesh;
wherein at least a subset of the plurality of arteries has a length that is longer than the length of the first folding region measured parallel with the length of the thermal ground plane.

17. The thermal ground plane according to claim 14, wherein the plurality of arteries extend substantially parallel with a length of the thermal ground plane and/or extend substantially through the second folding region, and/or extend perpendicular relative to a folding line within the folding region.

18. A thermal ground plane comprising:
a first casing comprising:
  a first bonding region extending around a periphery of the first casing;
  a first non-folding region overlapping portions of the first bonding region;
  a first folding region overlapping portions of the first bonding region and portions of the first non-folding region; and
a second casing comprising:
  a second bonding region extending around a periphery of the second casing;
  a second non-folding overlapping portions of the second bonding region;
  a second folding region overlapping portions of the second bonding region and portions of the second non-folding region; and
  wherein the first casing and the second casing are sealed together at the first bonding region and the second bonding region, and the first folding region and the second folding region are substantially aligned; and
a vapor structure disposed on at least a portion of the interior surface of the first casing; and
a liquid structure comprising a mesh and a plurality of arteries, the mesh comprises two layers of woven material sealed together;
wherein at least a subset of the plurality of arteries has a length that is longer than the length of the first folding region measured parallel with the length of the thermal ground plane.

19. The thermal ground plane according to claim 14, wherein the plurality of arteries extend substantially parallel with a length of the thermal ground plane and/or extend substantially through the second folding region.

\* \* \* \* \*